US010068948B2

(12) United States Patent
Yun et al.

(10) Patent No.: US 10,068,948 B2
(45) **Date of Patent: *Sep. 4, 2018**

(54) ORGANIC LIGHT EMITTING DISPLAY DEVICE

(71) Applicant: LG Display Co., Ltd., Seoul (KR)

(72) Inventors: Min Yun, Gyeonggi-do (KR); Sunghoon Joo, Gyeonggi-do (KR); Hyoseok Kim, Daejeon (KR); Hyeseung Kang, Seoul (KR); Seonkeun Yoo, Gyeonggi-do (KR); Seunghee Yoon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 82 days.

This patent is subject to a terminal disclaimer.

(21) Appl. No.: 15/147,075

(22) Filed: May 5, 2016

(65) Prior Publication Data

US 2016/0372524 A1 Dec. 22, 2016

(30) Foreign Application Priority Data

Jun. 18, 2015 (KR) ........................ 10-2015-0086917

(51) Int. Cl.
*H01L 51/00* (2006.01)
*H01L 27/32* (2006.01)
*C09K 11/06* (2006.01)
*H01L 51/50* (2006.01)
*H01L 51/52* (2006.01)

(52) U.S. Cl.
CPC .......... *H01L 27/3206* (2013.01); *C09K 11/06* (2013.01); *H01L 51/0067* (2013.01); *H01L 51/5044* (2013.01); *H01L 51/5056* (2013.01); *H01L 51/5072* (2013.01); *H01L 51/5088* (2013.01); *H01L 51/5092* (2013.01); *H01L 51/5218* (2013.01); *H01L 51/5278* (2013.01); *H01L 51/0054* (2013.01)

(58) Field of Classification Search
CPC ............. H01L 51/0072; H01L 51/0052; H01L 51/0067; H01L 51/0068; H01L 51/0073; H01L 51/5072; H01L 51/5088; H01L 51/504; H01L 51/0058; H01L 51/0054; H01L 51/0074; H01L 51/5092; H01L 51/5278
USPC .................. 428/690, 411.1; 252/301.16, 582
See application file for complete search history.

(56) References Cited

U.S. PATENT DOCUMENTS

| | | | | |
|---|---|---|---|---|
| 9,590,182 | B2 * | 3/2017 | Kageyama | C07C 211/61 |
| 9,624,193 | B2 * | 4/2017 | Aihara | C07D 239/26 |
| 9,882,135 | B2 * | 1/2018 | Anemian | C07F 7/0812 |
| 2012/0214993 | A1 | 8/2012 | Aihara et al. | |
| 2013/0134405 | A1 * | 5/2013 | Wang | C07C 13/66 257/40 |
| 2015/0097162 | A1 * | 4/2015 | Ono | H01L 51/0071 257/40 |
| 2015/0155511 | A1 | 6/2015 | Ohsawa et al. | |
| 2015/0236274 | A1 * | 8/2015 | Hatakeyama | H01L 51/0072 257/40 |
| 2015/0303380 | A1 * | 10/2015 | Kambe | C07D 487/14 257/40 |
| 2016/0043327 | A1 * | 2/2016 | Yoo | H01L 51/504 257/40 |
| 2017/0054084 | A1 * | 2/2017 | Kim | H01L 51/0058 |
| 2017/0092870 | A1 * | 3/2017 | Kim | H01L 51/0052 |
| 2018/0090686 | A1 * | 3/2018 | Yoon | H01L 27/00 |
| 2018/0134686 | A1 * | 5/2018 | Bergmann | C07D 403/10 |

FOREIGN PATENT DOCUMENTS

| | | | | |
|---|---|---|---|---|
| JP | 2007223928 A | | 9/2007 | |
| WO | WO-2013145666 A1 | * | 10/2013 | C07D 487/14 |

OTHER PUBLICATIONS

CAS reg. No. 2010128-39-7, Oct. 11, 2016. (Year: 2016).*
Extended European Search Report issued in corresponding International Application No. 16168039.2 dated Oct. 14, 2016.

* cited by examiner

*Primary Examiner* — Douglas J McGinty
(74) *Attorney, Agent, or Firm* — Morgan, Lewis & Bockius LLP

(57) ABSTRACT

An organic light emitting display device is provided. The organic light emitting display device includes at least one light emitting part between an anode and a cathode and having at least one light emitting part between an anode and a cathode and having at least one organic layer and a light emitting layer. The at least one organic layer includes a compound having a core with one or more nitrogen atoms and at least one other core with relatively high electronegativity.

12 Claims, 5 Drawing Sheets

ORGANIC LIGHT EMITTING DISPLAY DEVICE

This application claims the priority benefit of Korean Patent Application No. 10-2015-0086917 filed on Jun. 18, 2015, which is hereby incorporated herein by reference for all purposes as if fully set forth herein.

BACKGROUND

Field

The present disclosure relates to an organic light emitting display device, and more particularly, to an organic light emitting display device with reduced operating voltage and improved light emission efficiency and lifetime.

Discussion of the Related Art

Image displays used for displaying a variety of information on the screen are one of the core technologies of the information and communication era. Such image displays have been developed to be thinner, lighter, and more portable, and furthermore to have high performance. With the development of the information society, various demands for display devices are on the rise. To meet these demands, research on panel displays such as liquid crystal displays (LCD), plasma display panels (PDP), electroluminescent displays (ELD), field emission displays (FED), organic light emitting diodes (OLED), etc is actively under way.

Among these types of panel displays, the OLED devices are a type of devices that emit light as electrons and holes are paired and then extinguished, when a charge is injected into an organic light emitting layer between an anode and a cathode. The OLED devices are advantageous in that they can be formed on a flexible transparent substrate such as plastic, can be driven at relatively low voltage, less power consumption, and excellent color sensitivity, as compared to plasma display panels or inorganic EL displays. Especially, white OLED devices are used for various purposes in lighting, thin light sources, backlights for liquid crystal displays, or full-color displays employing color filters.

In the development of white OLED devices, high efficiency, long lifetime, color purity, color stability against current and voltage variations, ease of manufacture, etc are important, so research and development are being done depending on which of these features should be taken into account. White OLED device structures may be roughly classified into a single-layer emitting structure and a multilayer emitting structure. Of these structures, the multilayer emitting structure having a blue fluorescent emitting layer and a yellow phosphorescent emitting layer stacked in tandem is mainly employed to realize white OLED devices with long lifetime.

Specifically, a phosphorescent light emitting structure, which is a stack of first and second light emitting structures, is used, with the first light emitting part using a blue fluorescent diode as a light emitting layer, and the second light emitting part using a yellow phosphorescent diode as a light emitting layer. Such a white OLED device produces white light by mixing blue light emitted from the blue fluorescent diode and yellow light emitted from the yellow phosphorescent diode. A charge generation layer is between the first light emitting part and the second light emitting part to double the current efficiency generated in the light emitting layers and facilitate charge distribution.

However, the overall operating voltage of a device having the aforementioned multilayer emitting structure may be higher than the sum of the operating voltages of individual light emitting parts, or the multilayer emitting display device may decrease in efficiency compared to a single-layer emitting structure. Especially, if an N-type charge generation layer is doped with an alkali metal or alkali earth metal, the alkali metal or alkali earth metal with which the N-type charge generation layer is doped, when the device is driven, moves together with electrons and migrates to an electron transport layer. This increases the amount of alkali metal or alkali earth metal present at the interface between the N-type charge generation layer and the electron transport layer, and decreases the amount of alkali metal or alkali earth metal with which the interface between a P-type charge generation layer and the N-type charge generation layer is doped. Thus, the amount of electrons injected into the electron transport layer decreases, resulting in a gradual rise in operating voltage and adverse effects on lifetime.

SUMMARY

Accordingly, the present disclosure is directed to an organic light emitting display device that substantially obviates one or more of the problems due to limitations and disadvantages of the related art.

An object of the present disclosure is to provide an organic light emitting display device that can reduce operating voltage and improve light emission efficiency and lifetime.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, an organic light emitting display device comprises at least one light emitting part between an anode and a cathode and comprising at least one organic layer and a light emitting layer, wherein the at least one organic layer includes a compound having a core with one or more nitrogen atoms and at least one other core with relatively high electronegativity.

The at least one organic layer includes one among an electron transport layer and a charge generation layer.

The core with one or more nitrogen atoms includes at least three or more nitrogen atoms, and electrons are transferred from the organic layer to the light emitting layer by the at least three or more nitrogen atoms or the at least one core with relatively high electronegativity.

The core with one or more nitrogen atoms is a triazine core, and the at least one other core with relatively high electronegativity is a terpyridine core.

The compound further comprises an aromatic ring link that connects the core with one or more nitrogen atoms and the at least one other core with relatively high electronegativity.

The aromatic ring link maintains an electronic balance between the core with one or more nitrogen atoms and the core with relatively high electronegativity.

The at least one light emitting part comprises at least two or more light emitting parts, and any one of the at least two or more light emitting parts is a blue light emitting part, and the another one of the at least two or more light emitting parts is a yellow-green light emitting part.

The at least one organic layer includes an electron transport layer that is included in the yellow-green light emitting part.

The compound is represented by the following Chemical Formula 1:

[Chemical Formula 1]

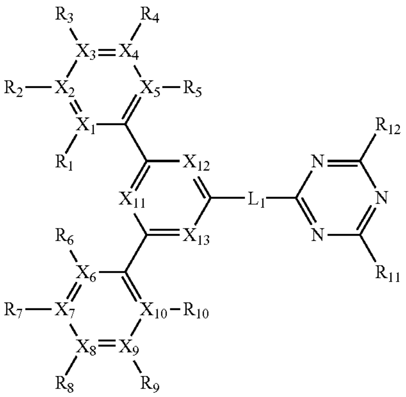

wherein $X_1$ to $X_5$ comprise at least one N atom, and $X_6$ to $X_{10}$ comprise at least one N atom, $X_{11}$ to $X_{13}$ comprise 1 to 3 N atoms, at least one among $X_1$ to $X_{13}$ with no corresponding N atoms includes one among C, and Si, $L_1$ is an aromatic ring compound with 5 to 50 carbon atoms or a heterocyclic compound with one or more atoms of N, S, O, or Si with 3 to 50 carbon atoms, and $R_1$ to $R_{12}$ is independently one among hydrogen, a substituted or unsubstituted aryl group with 6 to 60 carbon atoms, a substituted or unsubstituted heteroaryl group with 3 to 60 carbon atoms, an alkyl group with 1 to 20 carbon atoms, an alkoxy group with 1 to 20 carbon atoms, and an amino group with 1 to 20 carbon atoms, with provision that $R_1$ to $R_{10}$ is absent when the corresponding $X_1$ to $X_{10}$ is N.

The compound includes one among the following compounds:

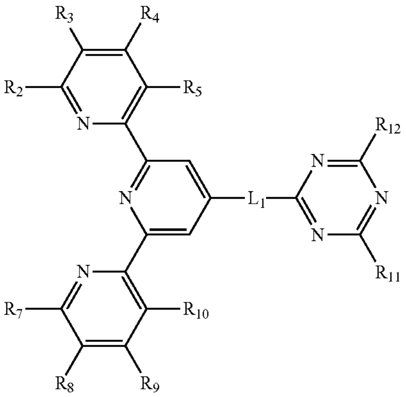

-continued

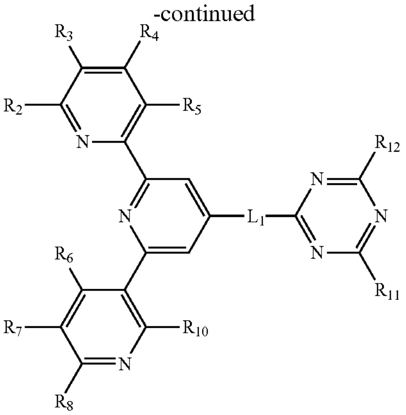

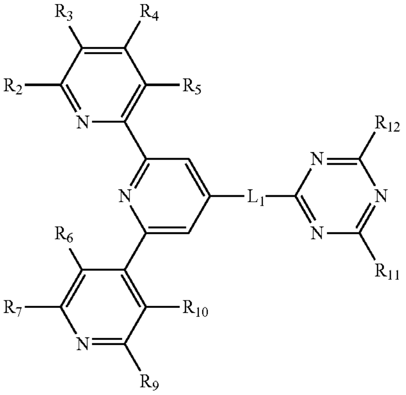

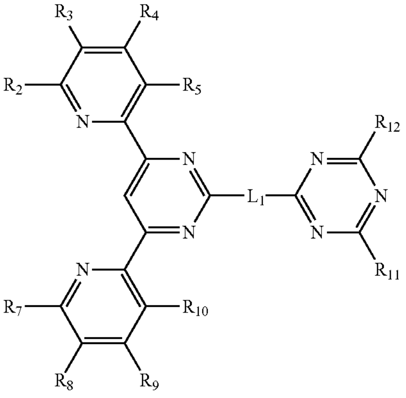

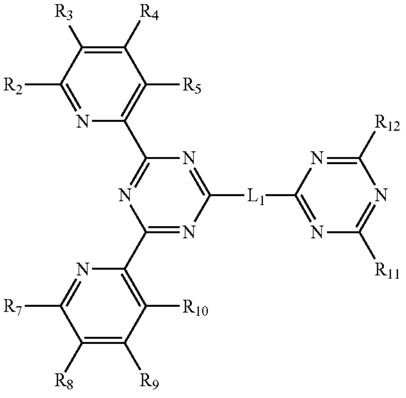

-continued
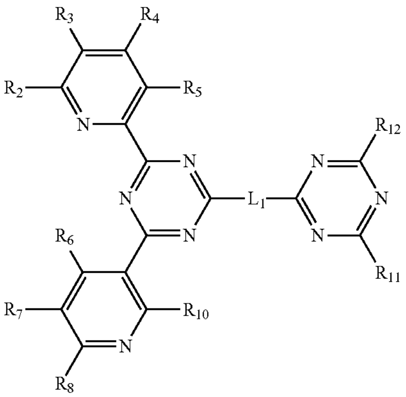
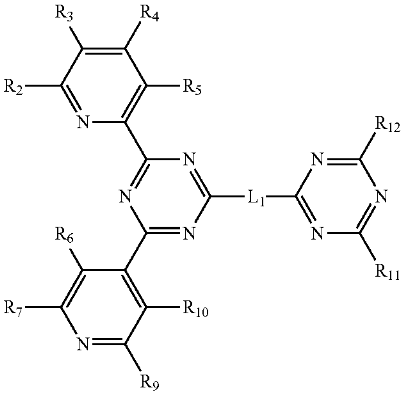
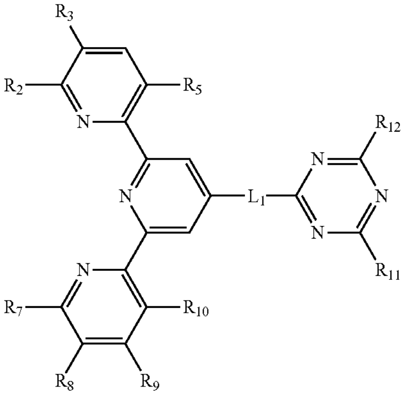
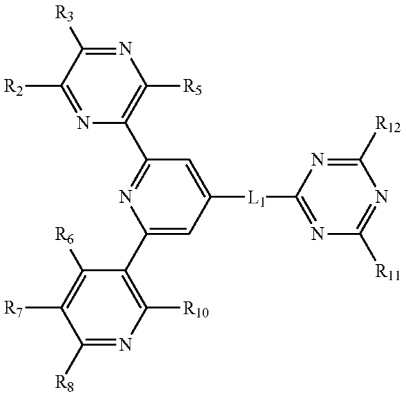
-continued
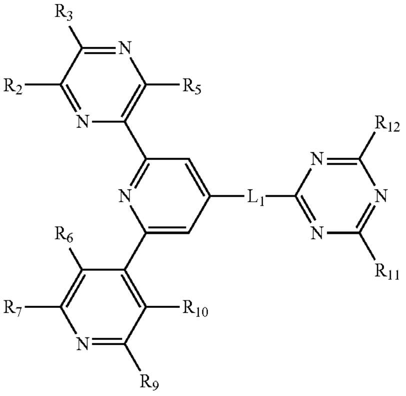
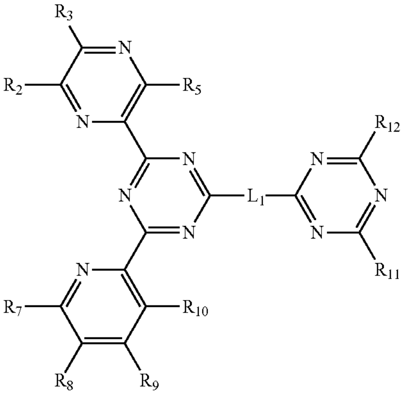
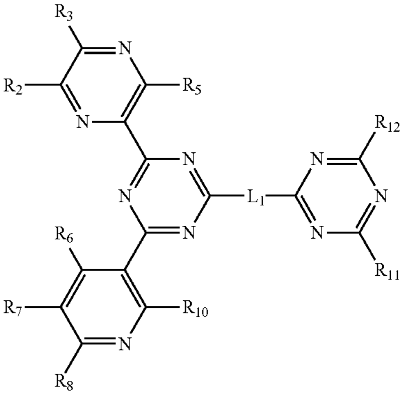
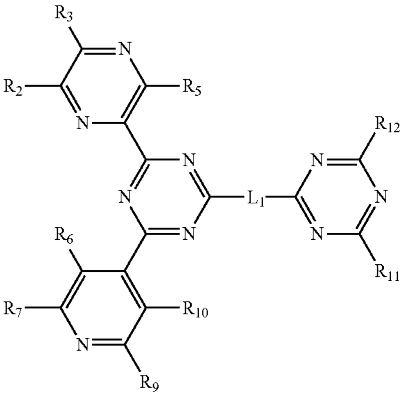

-continued
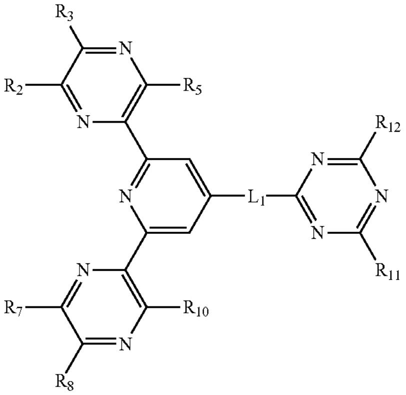
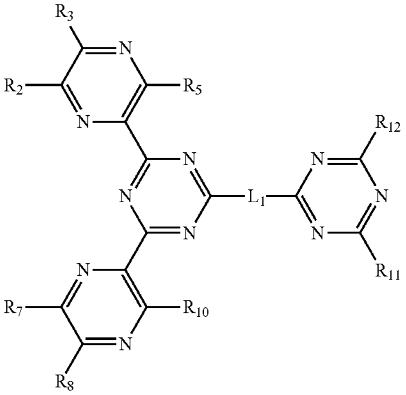
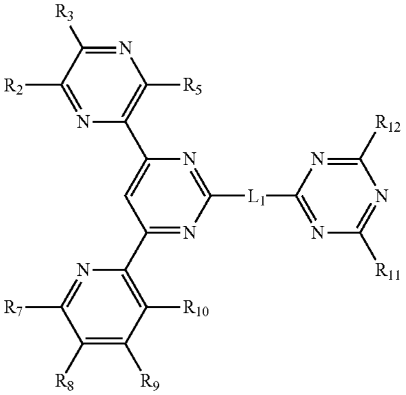
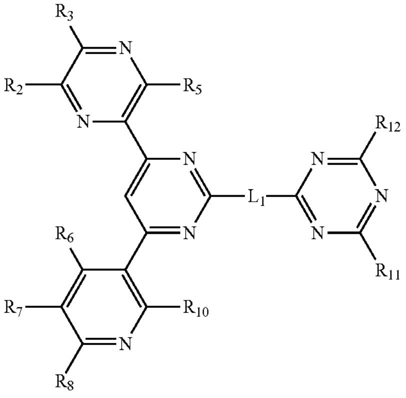
-continued
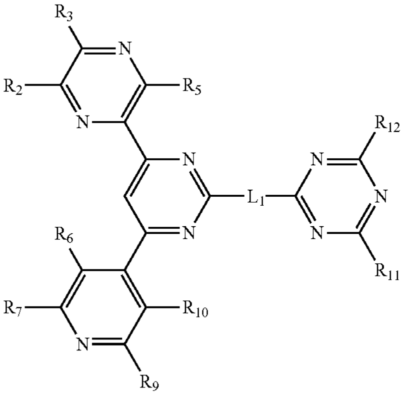
$L_1$ includes one among the following compounds:
L01
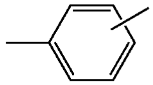
L02
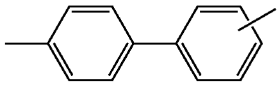
L03
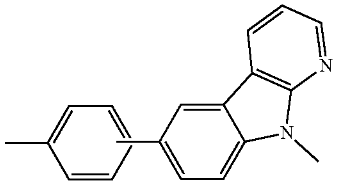
L04
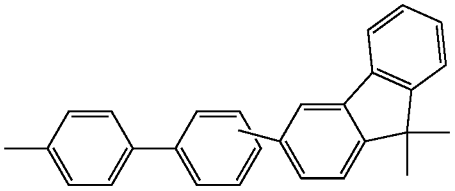
L05
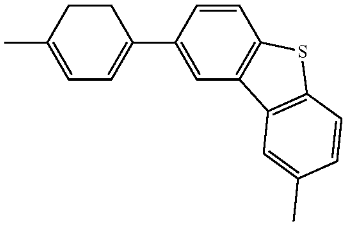
L06
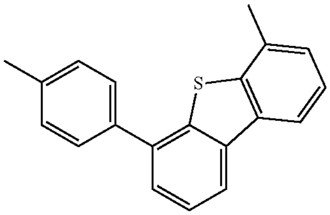

-continued
L07
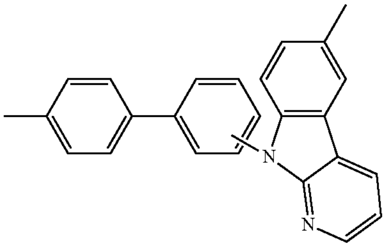
L08
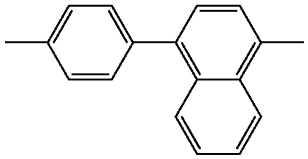
L09
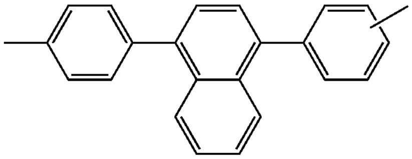
L10
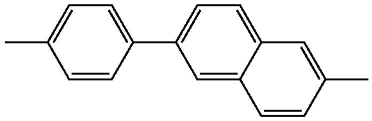
L11
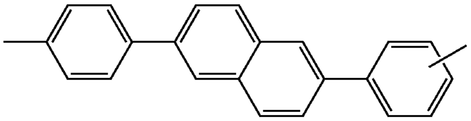
L12
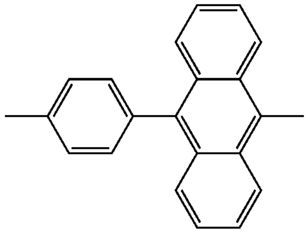
L13
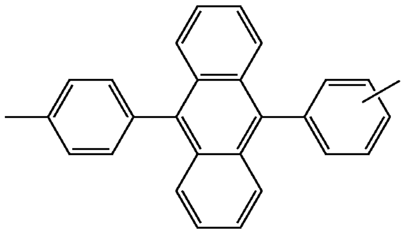
L14
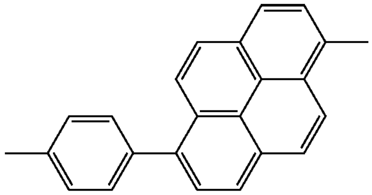
-continued
L15
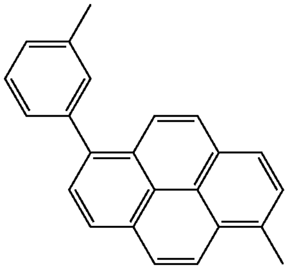
L16
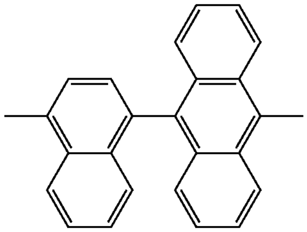
L17
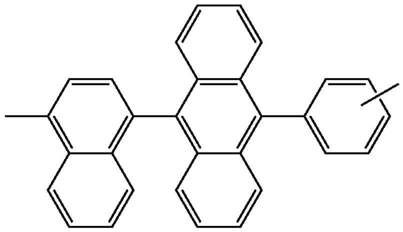
L18
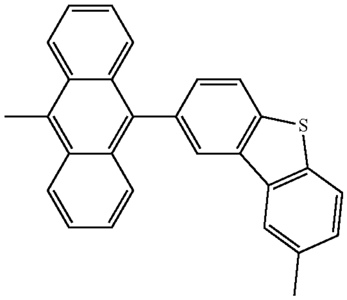
L19
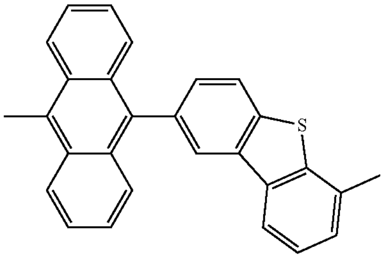
L20
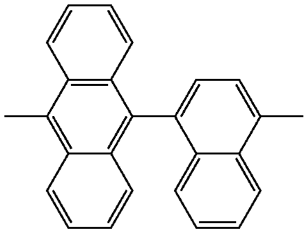

-continued
L21
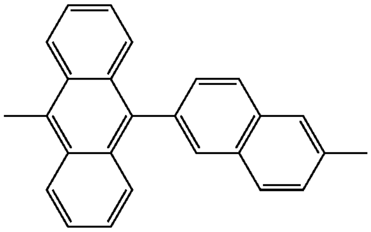
L22
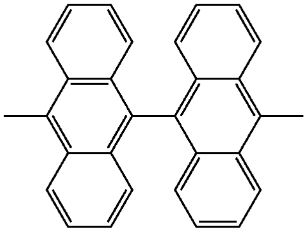
-continued
L23
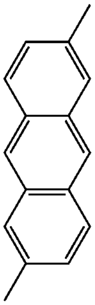
The compound includes one among the following compounds:
ET01
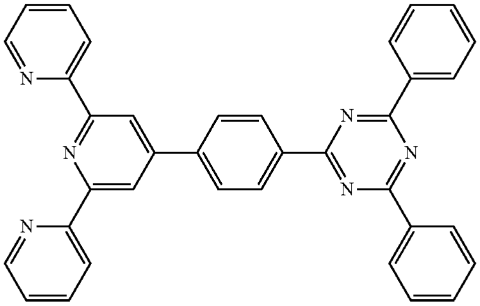
ET02
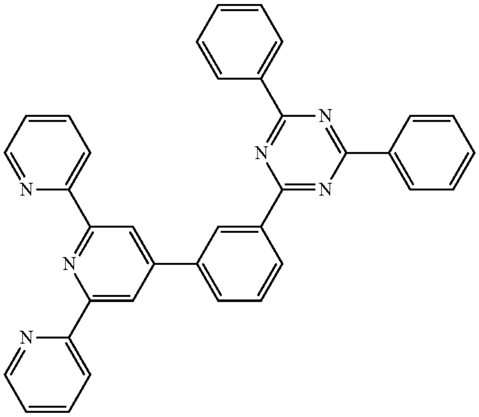
ET03
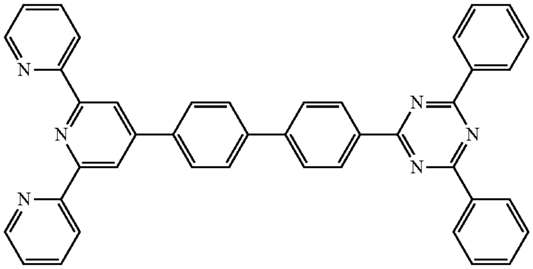
ET04
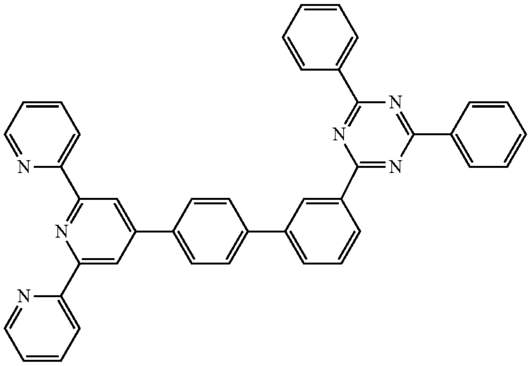

-continued
ET05
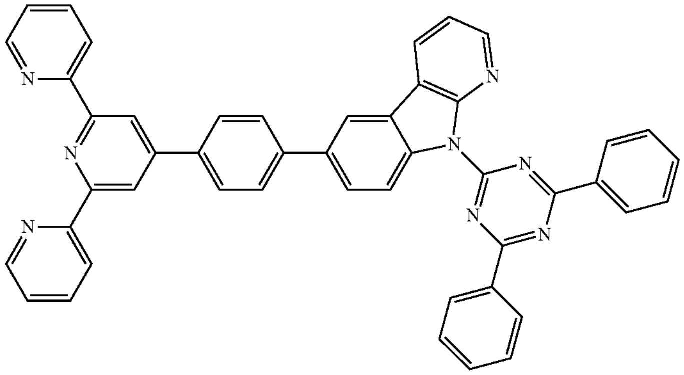
ET06
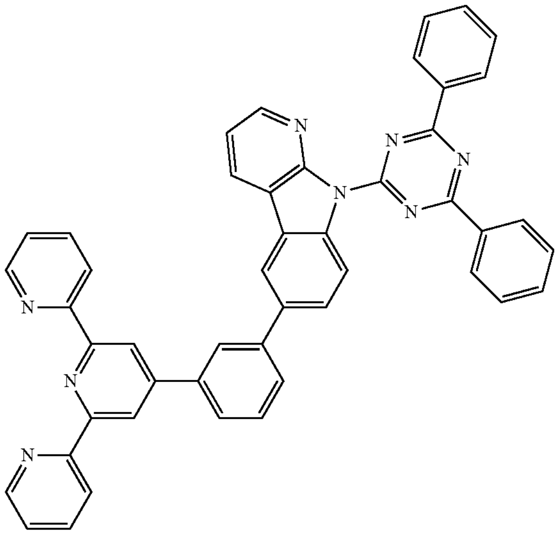
ET07
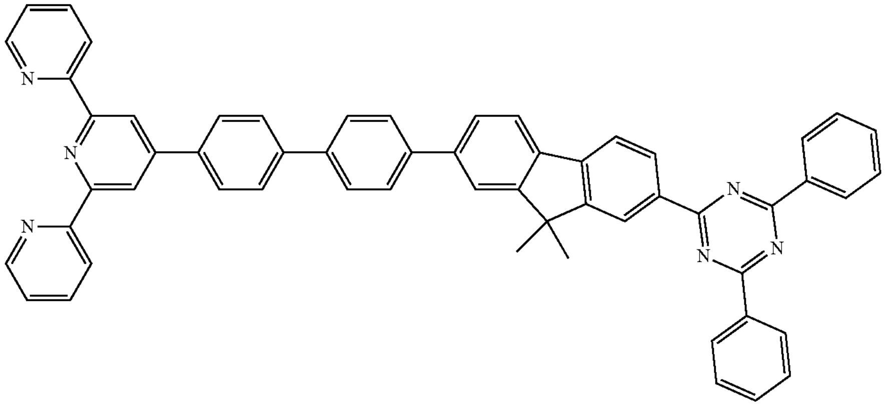

-continued
ET08
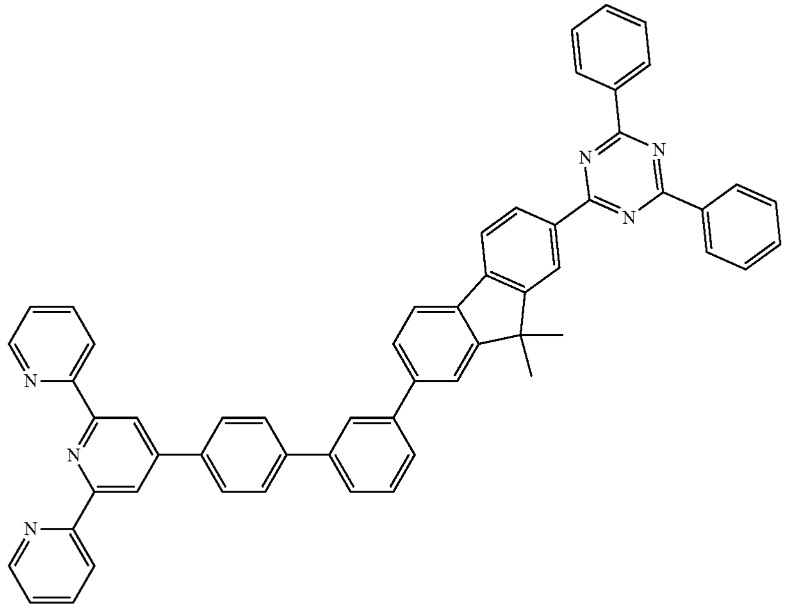
ET09
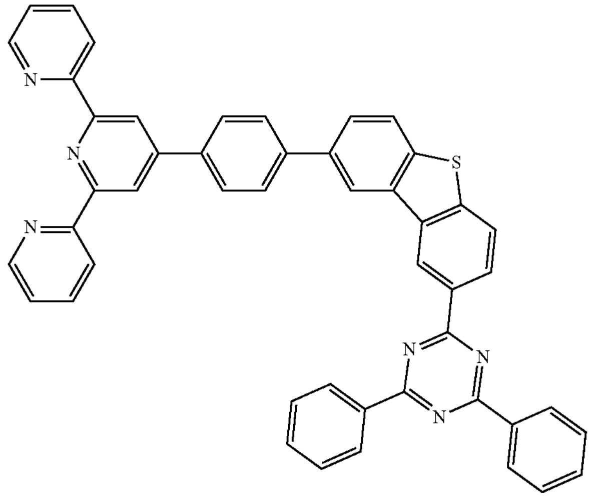
ET10
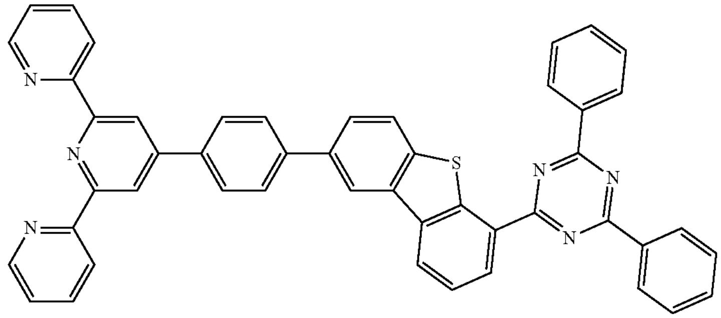

-continued
ET11
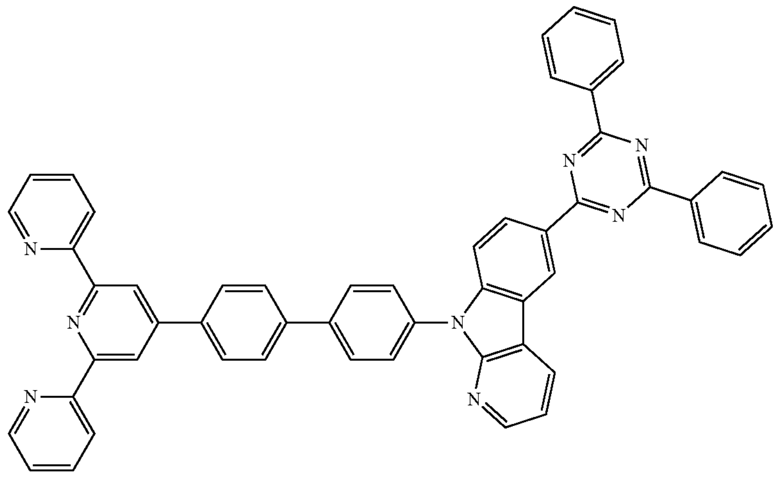
ET12
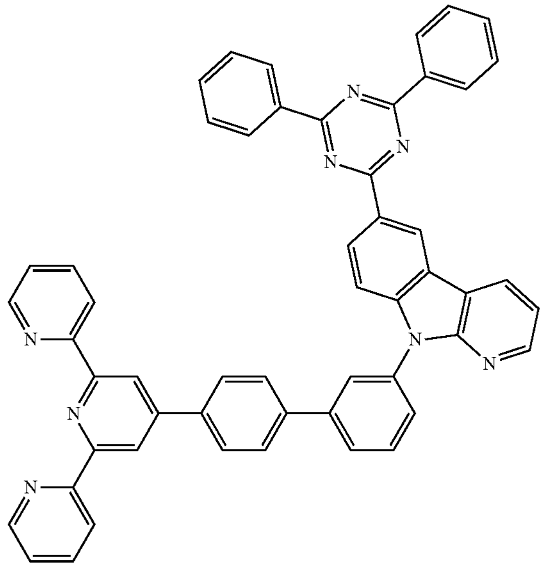
ET13
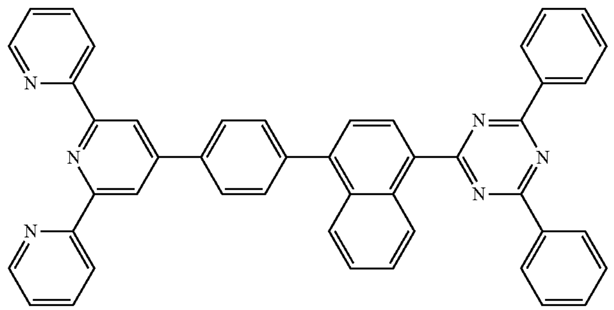

-continued
ET14
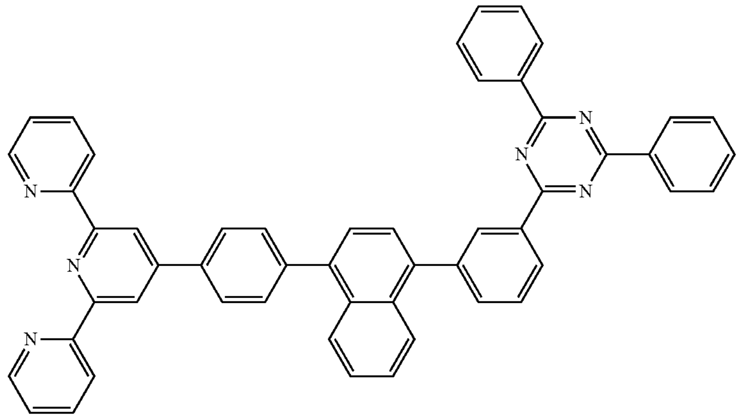
ET15
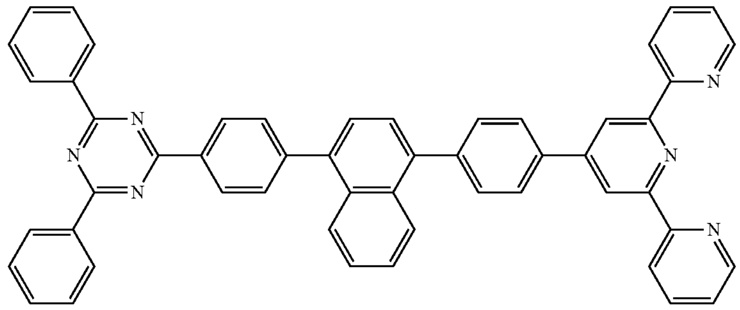
ET16
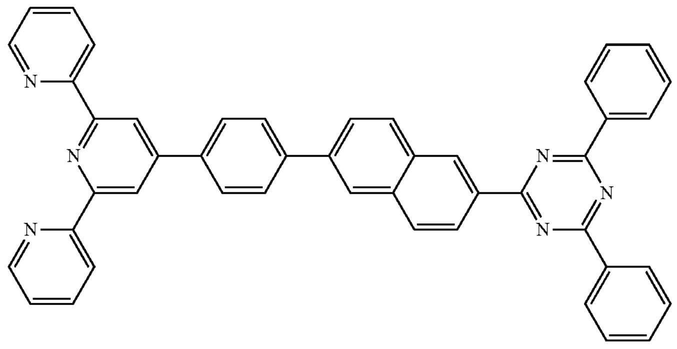
ET17
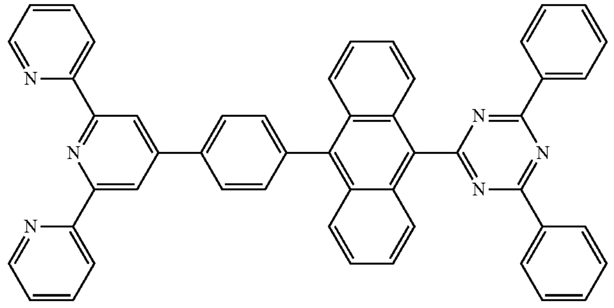

-continued
ET18
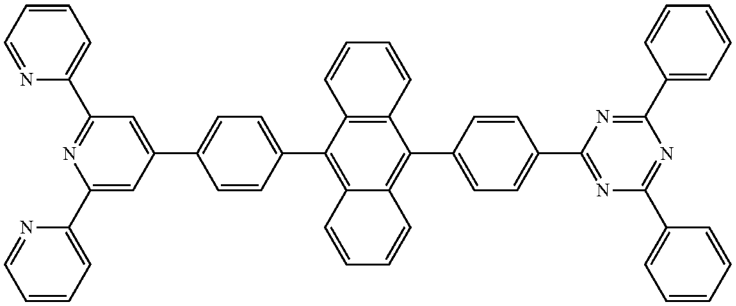
ET19
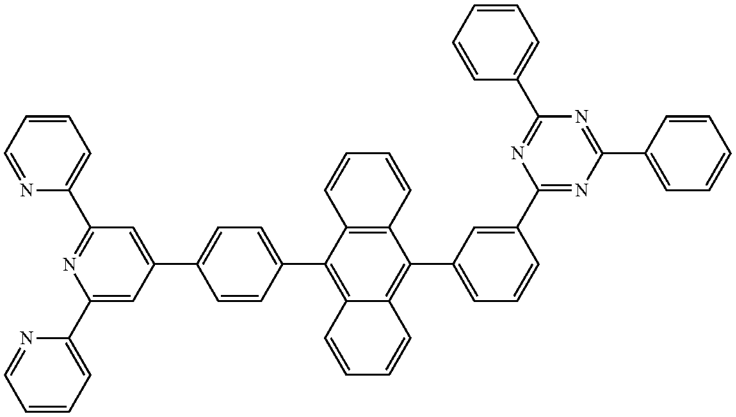
ET20
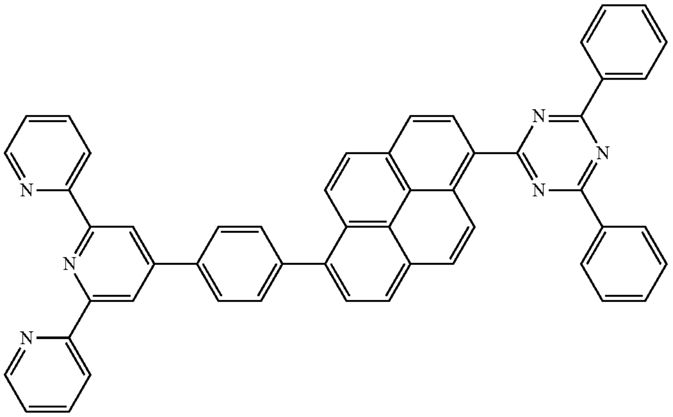
ET21
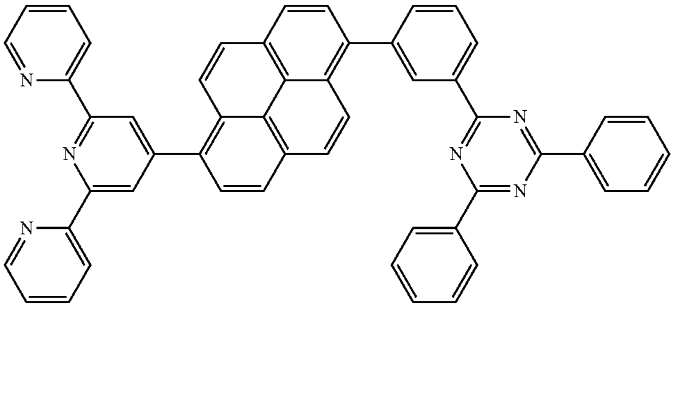

-continued
ET22
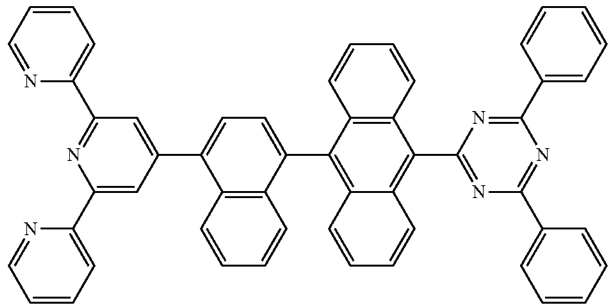
ET23
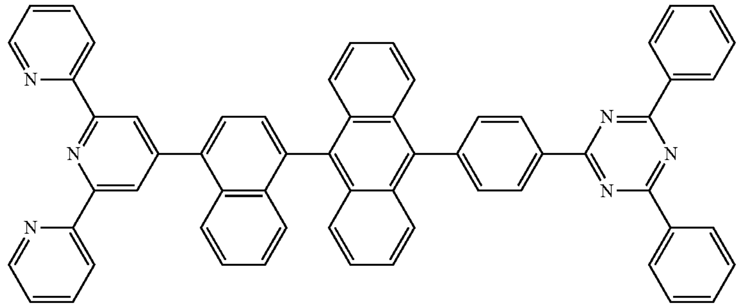
ET24
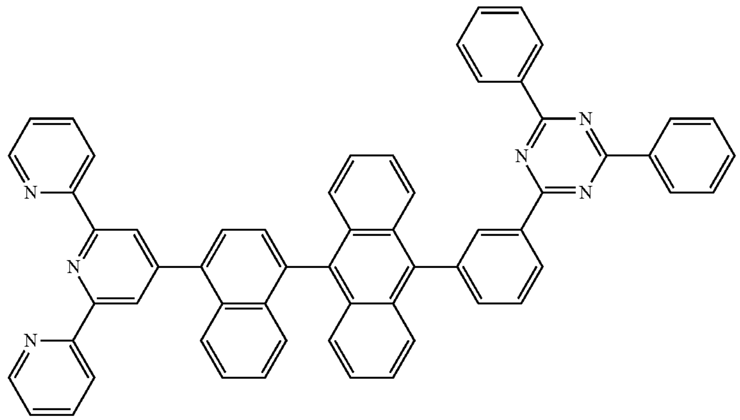
ET25
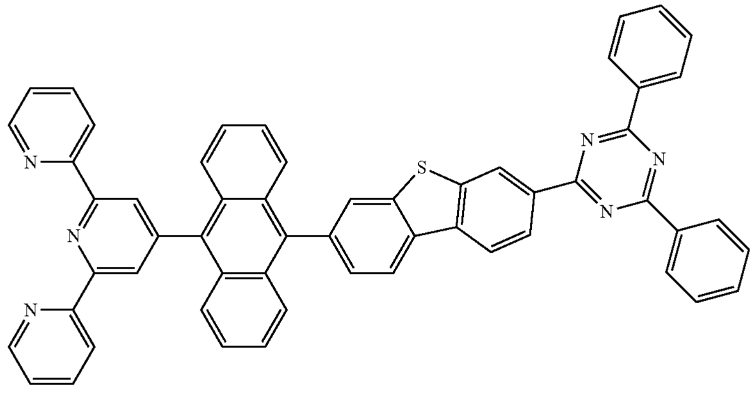

-continued
ET26
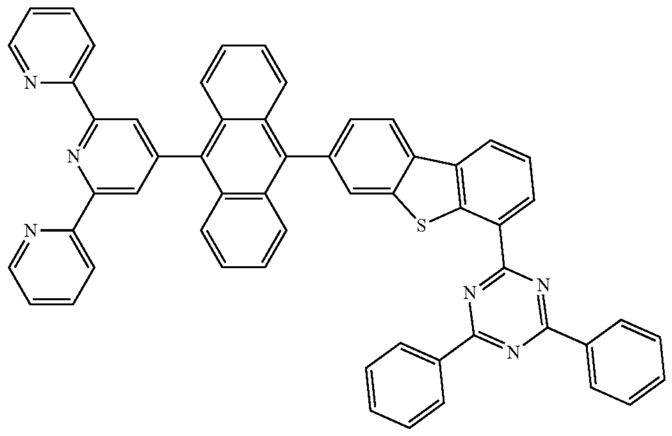
ET27
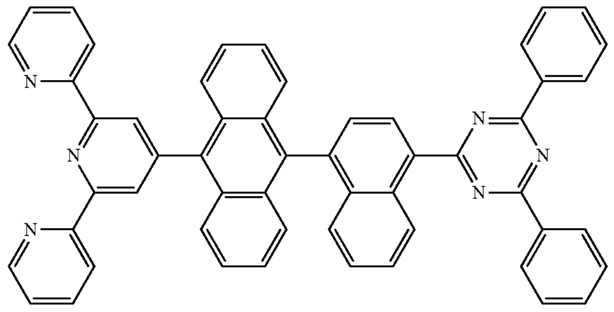
ET28
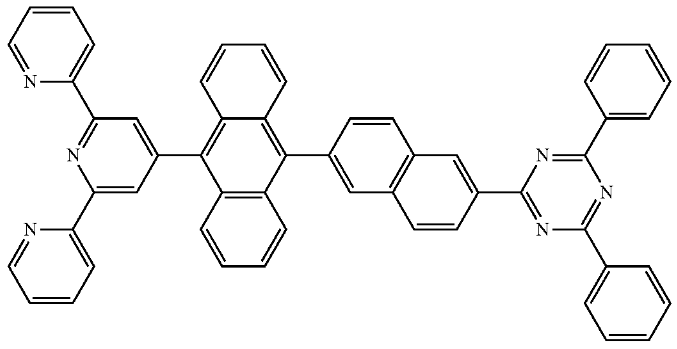
ET29
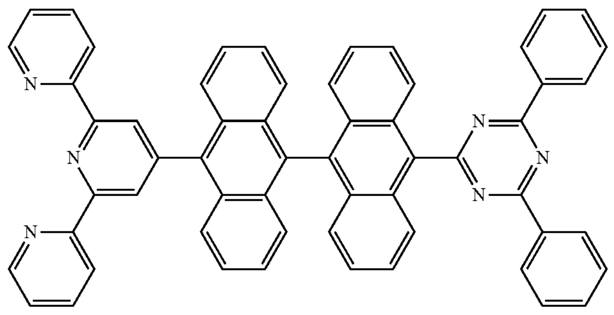

-continued

ET30

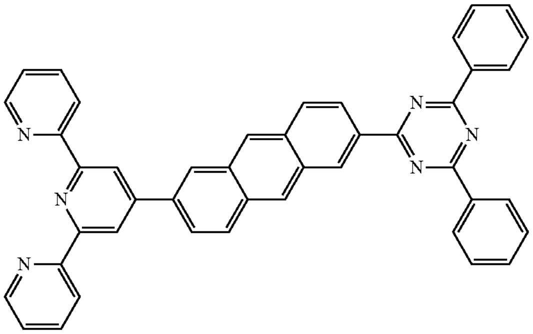

ET31

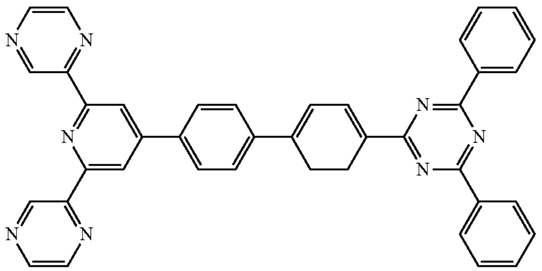

ET32

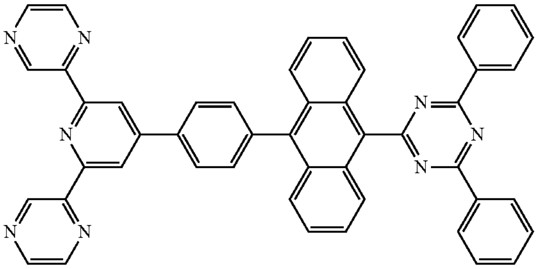

ET33

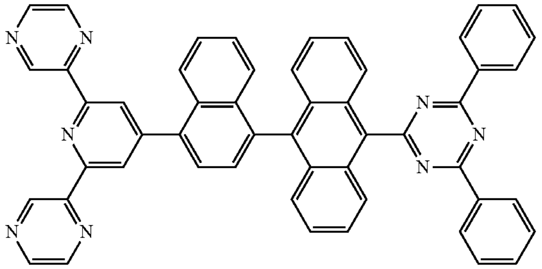

In another aspect, an organic light emitting display device comprises first and second electrodes facing each other on a substrate, and at least two or more light emitting parts between the first and second electrodes and each comprising a light emitting layer, the organic light emitting display device further comprising a charge generation layer between the at least two or more light emitting parts, the at least two or more light emitting parts each comprising an electron transport layer, and wherein the electron transport layer includes a compound comprising a triazine core and a terpyridine core.

The organic light emitting display device having the electron transport layer comprising the compound improves electron injections toward the first electrode and hole injections toward the second electrode, compared to those of an organic light emitting display device without the compound, thereby leading to a relative reduction in operating voltage and a relative increase in lifetime.

The compound is represented by the following Chemical Formula 1:

[Chemical Formula 1]

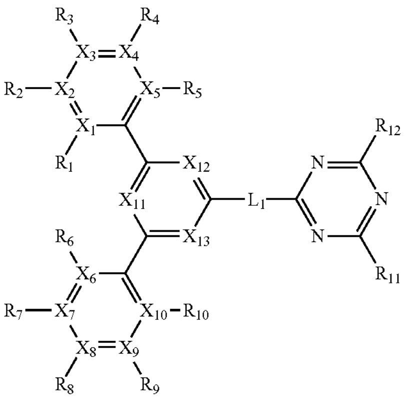

wherein $X_1$ to $X_5$ comprise at least one N atom, and $X_6$ to $X_{10}$ comprise at least one N atom, $X_{11}$ to $X_{13}$ comprise 1 to 3 N atoms, at least one among $X_1$ to $X_{13}$ with no corresponding N atoms is one among C, and Si, $L_1$ is an aromatic ring compound with 5 to 50 carbon atoms or a heterocyclic compound with one or more atoms of N, S, O, or Si with 3 to 50 carbon atoms, and $R_1$ to $R_{12}$ may be independently one among hydrogen, a substituted or unsubstituted aryl group with 6 to 60 carbon atoms, a substituted or unsubstituted heteroaryl group with 3 to 60 carbon atoms, an alkyl group with 1 to 20 carbon atoms, an alkoxy group with 1 to 20 carbon atoms, and an amino group with 1 to 20 carbon atoms, with provision that $R_1$ to $R_{10}$ is absent when the corresponding $X_1$ to $X_{10}$ is N.

The triazine core is a core with one or more nitrogen atoms, and the terpyridine core is a core with relatively high electronegativity.

The triazine core includes at least three or more nitrogen atoms, and the terpyridine core has relatively high electronegativity.

The compound further comprises an aromatic ring link that connects the core with one or more nitrogen atoms and the core with relatively high electronegativity.

The aromatic ring link maintains an electronic balance between the core with one or more nitrogen atoms and the core with relatively high electronegativity.

The charge generation layer comprises the same compound as the electron transport layer.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
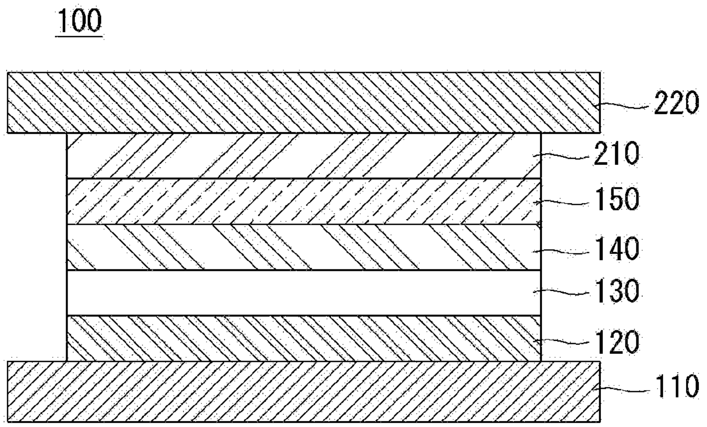
FIG. 1 is a cross-sectional view showing an organic light emitting display device according to a first exemplary embodiment of the present disclosure.

The advantages and features of the present disclosure and methods for accomplishing the same may be understood more readily by reference to the following detailed descriptions of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure is defined by the appended claims The shapes, sizes, percentages, angles, numbers, etc. shown in the figures to describe the exemplary embodiments of the present disclosure are merely examples and not limited to those shown in the figures. Like reference numerals denote like elements throughout the specification. In describing the present disclosure, detailed descriptions of related well-known technologies will be omitted to avoid unnecessary obscuring the present disclosure. When the terms 'comprise', 'have', 'consist of' and the like are used, other parts may be added as long as the term 'only' is not used. The singular forms may be interpreted as the plural forms unless explicitly stated.

The elements may be interpreted to include a margin of error even if not explicitly stated.

When the position relation between two parts is described using the terms 'on', 'over', 'under', 'next to' and the like, one or more parts may be positioned between the two parts as long as the term 'immediately' or 'directly' is not used.

When the temporal relationship between two events is described using the terms 'after', 'following', 'next', 'before' and the like, the two events may not occur in succession as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present disclosure.

The features of various exemplary embodiments of the present disclosure may be linked or combined with one another partly or wholly, and may technically interact or work together in various ways. The exemplary embodiments may be carried out independently or in combination with one another.

Hereinafter, various exemplary embodiments of the present disclosure will be described in detail with reference to the accompanying drawings.

FIG. 1 is a cross-sectional view showing an organic light emitting display device according to a first exemplary embodiment of the present disclosure.

Referring to FIG. 1, an organic light emitting display device 100 according to the first exemplary embodiment of the present disclosure comprises an anode 110, a hole injection layer 120, a hole transport layer 130, a light emitting layer 140, an electron transport layer 150, an electron injection layer 210, and a cathode 220.

The anode 110 is a hole injection electrode, and may be formed of one among ITO (indium tin oxide), IZO (indium zinc oxide), or ZnO (zinc oxide) having a high work function. Also, if the anode 110 is a reflective electrode, the anode 110 may further comprise a reflective layer formed of one among aluminum (Al), silver (Ag), or nickel (Ni) under a layer formed of one among ITO, IZO, or ZnO.

The hole injection layer 120 may function to facilitate hole injection from the anode 110 to the light emitting layer 140, and may be formed of, but is not limited to, one among CuPc (copper phthalocyanine), PEDOT (poly(3, 4)-ethylenedioxythiophene), PANI (polyaniline), and NPD(N,N'-bis (naphthalene-1-yl)-N,N'-bis(phenyl)-2,2'-dimethylbenzidine). The hole injection layer 120 may be 1 to 150 nm thickness. If the hole injection layer 120 is 1 nm thickness or greater, the hole injection properties may be improved, or if the hole injection layer 120 is 150 nm thickness or less, an increase in the thickness of the hole injection layer 120 may be prevented and a rise in operating voltage may be therefore prevented. The hole injection layer 120 may not be included in the elements of the organic light emitting display device, depending on the structure or characteristics of the organic light emitting display device.

The hole transport layer 130 may function to facilitate hole transport, and may be formed of, but is not limited to, one or more among of NPD(N,N'-bis(naphthalene-1-yl)-N, N'-bis(phenyl)-2,2'-dimethylbenzidine), TPD(N,N'-bis-(3-methylphenyl)-N,N'-bis(phenyl)-benzidine), spiro-TAD(2, 2'7,7'-tetrakis(N,N-diphenylamino)-9,9'-spirofluorene), and MTDATA(4,4',4"-Tris(N-3-methylphenyl-N-phenylamino)-triphenylamine). The hole transport layer 130 may be 1 to 150 nm thickness. If the hole transport layer 130 is 1 nm thickness or greater, the hole transport properties may be improved, or if the hole transport layer 130 is 150 nm thickness or less, an increase in the thickness of the hole transport layer 130 may be prevented, and a rise in operating voltage may be therefore prevented.

The light emitting layer 140 may emit light of red (R), green (G), blue (B), or yellow (Y), and may be formed of a phosphorescent or fluorescent material.

If the light emitting layer 140 is a red light emitting layer, it may be formed of a phosphorescent material comprising a host material such as CBP(4,4'-bis(carbazol-9-yl)biphenyl) and a dopant having one or more among of $Ir(PIQ)_2$(acac) (bis(1-phenylisoquinoline)acetylacetonate iridium (III)), $Ir(PIQ)_3$(acac) (tris(1-phenylquinoline)acetylacetonate iridiumI(III)) and PtOEP(octaethylporphine platinum). Alternatively, the light emitting layer 140 may be made of, but not limited to, a fluorescent material including PBD:Eu$(DBM)_3$(Phen) or perylene.

If the light emitting layer 140 is a green light emitting layer, it may be formed of a phosphorescent material including a host material such as CBP(4,4'-bis(carbazol-9-yl) biphenyl) and a dopant material including an iridium-based material. Alternatively, the light emitting layer 140 may be formed of, but not limited to, a fluorescent material including $Alq_3$(tris(8-hydroxyquinolinato)aluminum).

If the light emitting layer 140 is a blue light emitting layer, it may be formed of a phosphorescent material comprising a host material such as CBP(4,4'-bis(carbazol-9-yl)biphenyl) and a dopant material including an iridium-based material. Alternatively, the light emitting layer 140 may be formed of, but not limited to, a fluorescent material including one among Spiro-BDAVBi(2,7-bis)4-diphenylamino) styryl)-9,9-spirofluorenespiro-CBP(2,2',7,7'-tetrakis(carbazol-9-yl)-9,9-spirofluorene), distyrylbenzene (DSB), distyrylarylene (DSA), a PFO polymer, and a PPV polymer.

If the light emitting layer 140 includes a yellow light emitting layer, it may have a single layer structure of a yellow-green light emitting layer or green light emitting layer, or a multilayer structure formed of a yellow-green light emitting layer and a green light emitting layer. Herein, the yellow light emitting layer includes a yellow-green light emitting layer, a green light emitting layer, or a multilayer structure formed of a yellow-green light emitting layer and a green light emitting layer. This exemplary embodiment will be described by taking as an example a single layer structure of a yellow light emitting layer that emits yellow-green light. The yellow light emitting layer may include at least one host of CBP 4,4'-bis(carbazol-9-yl)biphenyl) and BAlq(Bis(2-methyl-8-quinolinolate)-4-(phenylphenolato) aluminum) and a phosphorescent yellow-green dopant that emits yellow-green light.

The electron transport layer 150 functions to facilitate electron transport. If the electron transport is not smooth, electrons are not injected into the light emitting layer 140. This lowers the chance of generating an exciton by the recombination of an electron and hole in the light emitting layer 140. Due to this, the light emitting layer 140 does not contribute to light emission, thus affecting the lifetime or efficiency of the organic light emitting display device. Thus, the present inventors conducted several tests or experiments to improve the electron injection properties of the electron transport layer. Through a number of tests or experiments which were performed on materials that do not affect the lifetime or efficiency of the organic light emitting display device and that cause no rise in operating voltage, a compound that is rich in electrons by having at least three or more nitrogen atoms was chosen as an electron transport compound for the electron transport layer. A compound of this disclosure is rich in electrons by having at least three or more nitrogen atoms, which results in high electron mobility, making electron transport easy. Although the compound of this disclosure is rich in electrons due to at least three or more nitrogen atoms symmetrical to a triazine core, it is non-polar. To make up for this non-polarity, a terpyridine core, which is polar and has relatively high electronegativity, binds to the triazine core, thereby improving electron transport ability. Moreover, the compound of this disclosure allows for smooth electron injection from the electron transport layer to the light emitting layer by inserting an aromatic ring link L1 between the triazine core, which include aromatic ring having one or more nitrogen atom, and the terpyridine core to separate the triazine and terpyridine cores with high electronic properties so as to keep electrons from being confined to one side. That is, the electronic balance between the triazine core and the terpyridine core can be maintained by the aromatic ring link L1, thereby allowing for smooth electron injection from the electron transport layer to the light emitting layer.

Accordingly, the electron transport layer 150 is formed of an electron transport compound represented by the following Chemical Formula 1:

[Chemical Formula 1]

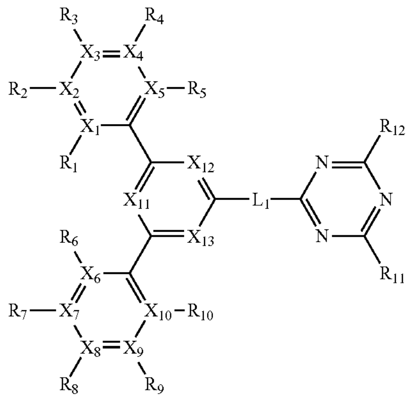

wherein $X_1$ to $X_5$ comprise at least one N atom, and $X_6$ to $X_{10}$ comprise at least one N atom, $X_{11}$ to $X_{13}$ comprise 1 to 3 N atoms, at least one among $X_1$ to $X_{13}$ with no corresponding N atoms include one among C, and Si, $L_1$ is an aromatic ring compound with 5 to 50 carbon atoms or a heterocyclic compound with one or more atoms among N, S, O, or Si with 3 to 50 carbon atoms, and $R_1$ to $R_{12}$ may be independently one among hydrogen, a substituted or unsubstituted aryl group with 6 to 60 carbon atoms, a substituted or unsubstituted heteroaryl group with 3 to 60 carbon atoms, an alkyl group with 1 to 20 carbon atoms, an alkoxy group with 1 to 20 carbon atoms, and an amino group with 1 to 20 carbon atoms, with provision that $R_1$ to $R_{10}$ is absent when the corresponding $X_1$ to $X_{10}$ is N. Substituents may preferably be one among phenyl, quinoline, pyridine, pyrimidine, triazine, naphthyl, terpyridine, biphenyl, phenanthrene, phenanthroline, pyrazine, carboline, fluorene, dibenzofluorene, thiophene, benzothiophene, dibenzothiophene, benzimidazole, methyl, ethyl, tert-butyl, trimethylsilyl, diphenylamine, triphenylamine, and cyanophenyl.

In Chemical Formula 1, $X_1$ to $X_5$ comprise at least one N atom, and $X_6$ to $X_{10}$ comprise at least one N atom, and $X_{11}$ to $X_{13}$ comprise 1 to 3 N atoms, in order to make the electron density of the terpyridine core uniform to improve electron mobility and to prevent change in the HOMO or LUMO energy level of the compound due to the concentration of nitrogen (N) on one side. If the HOMO or LUMO energy level changes, the difference in energy level between the electron transport layer and the charge generation layer causes a rise in operating voltage when the electrons injected into the charge generation layer move to the electron transport layer. Accordingly, the balance of nitrogen (N) in the compound of this disclosure can be maintained, thereby reducing operating voltage.

The compound represented by Chemical Formula 1 may be one among the following compounds:

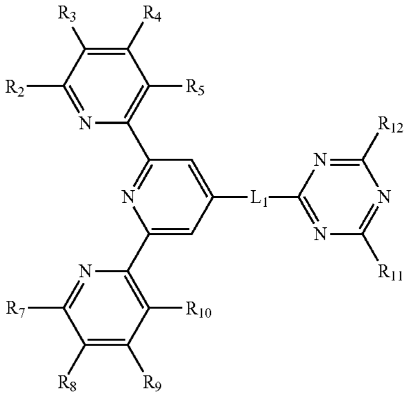

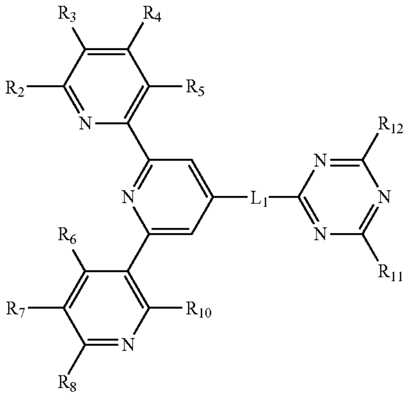

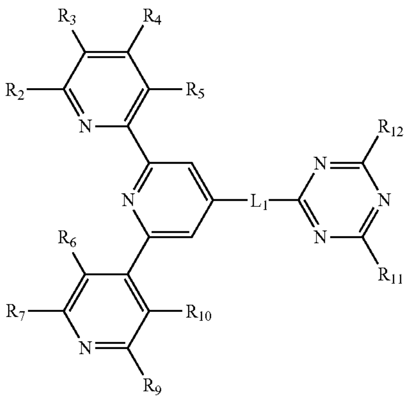

-continued

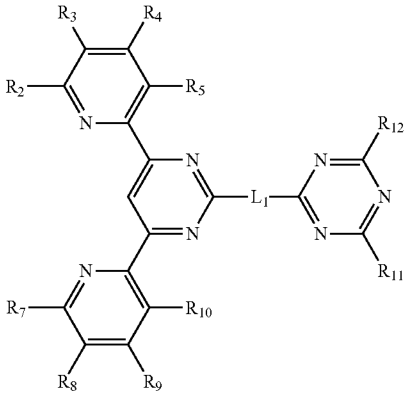

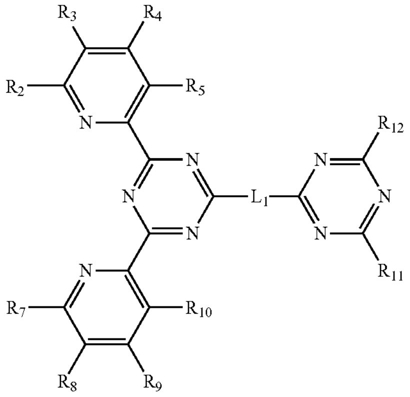

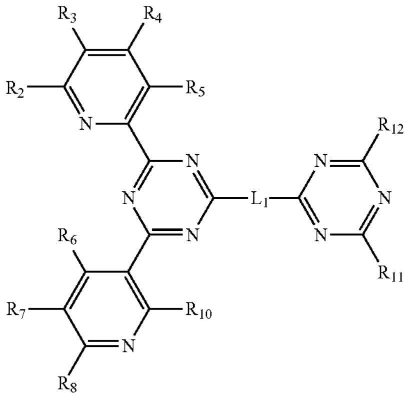

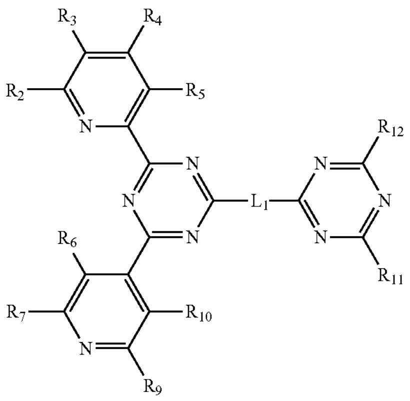

-continued
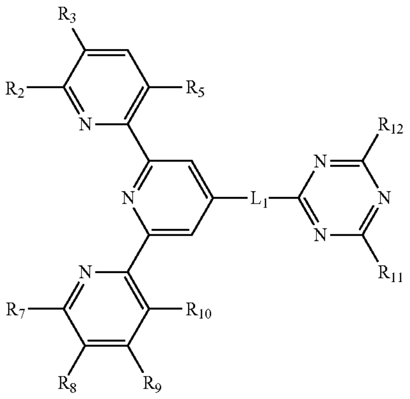
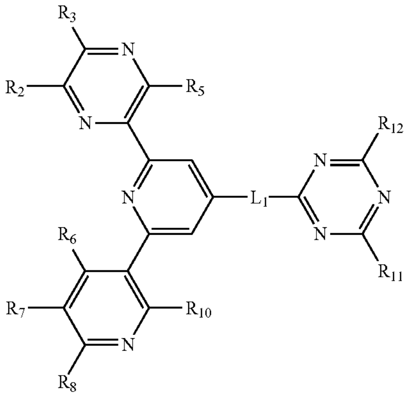
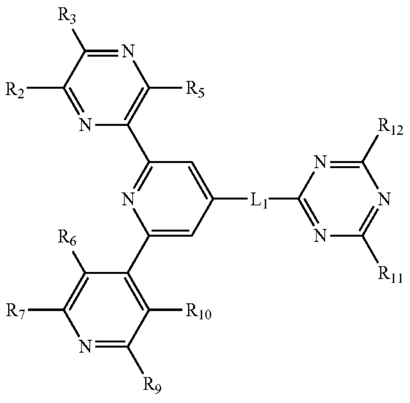
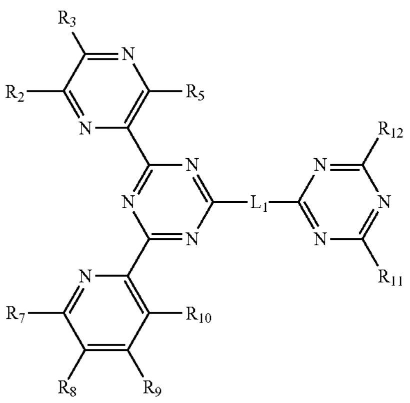
-continued
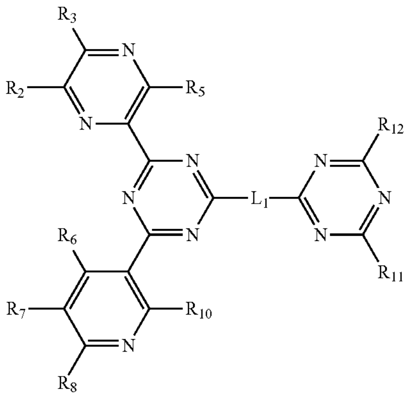
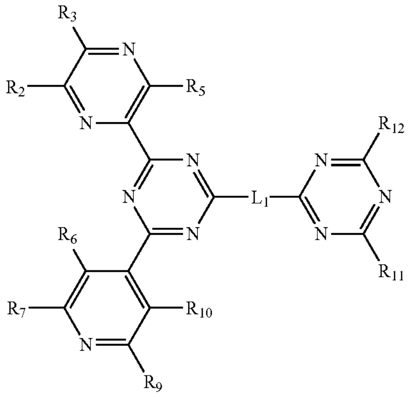
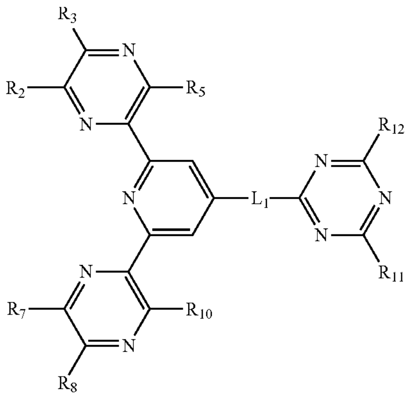
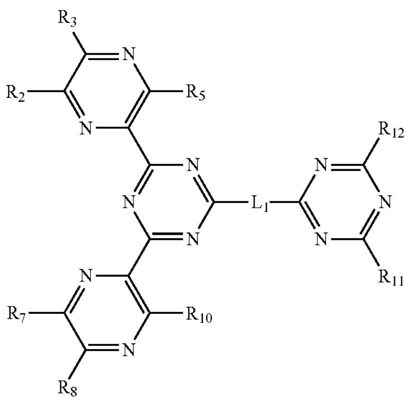

-continued
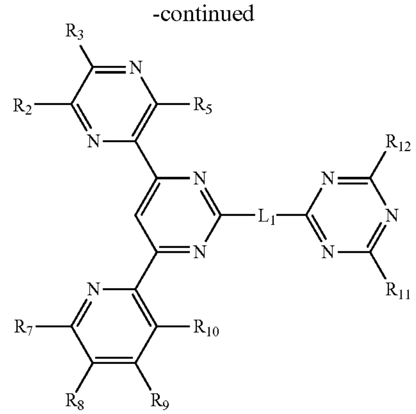
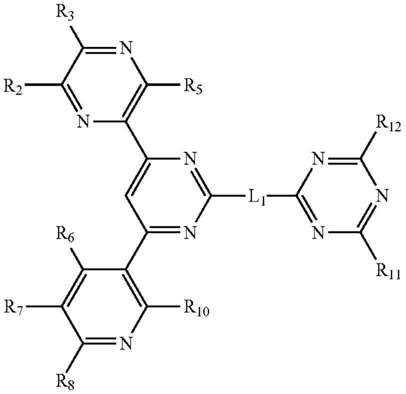
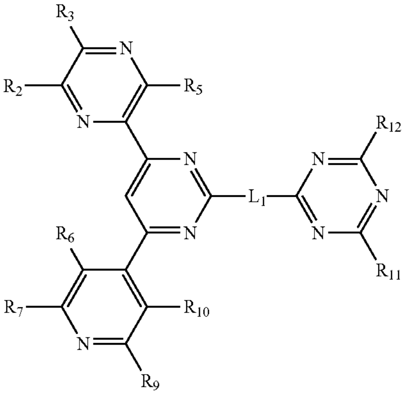
$L_1$ may be one among the following compounds:
L01
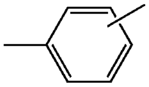
L02
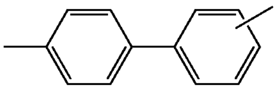
L03
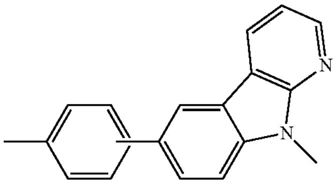
-continued
L04
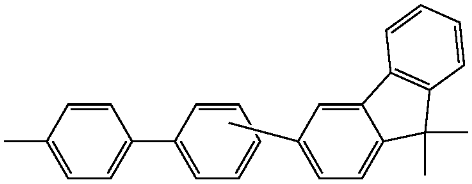
L05
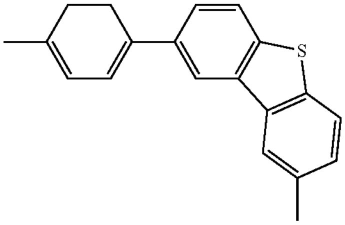
L06
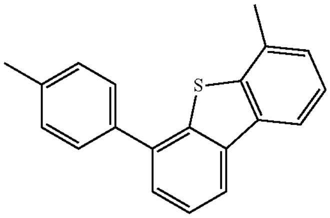
L07
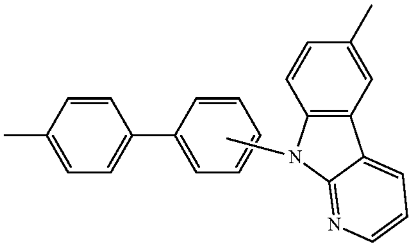
L08
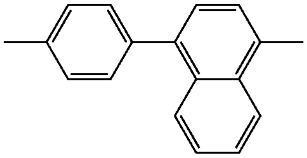
L09
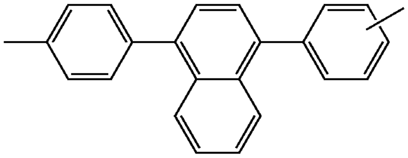
L10
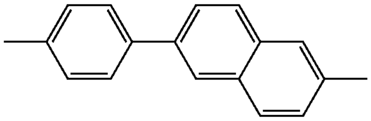
L11
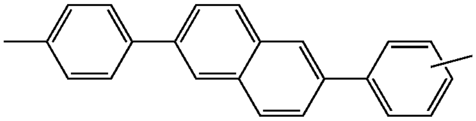

-continued
L12
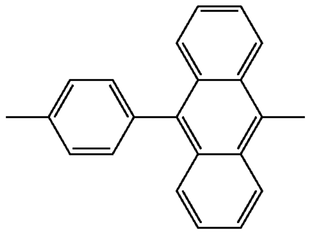
L13
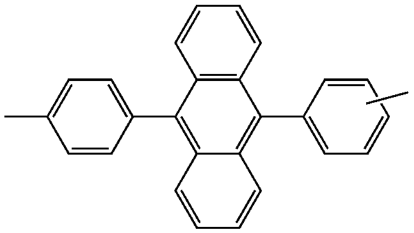
L14
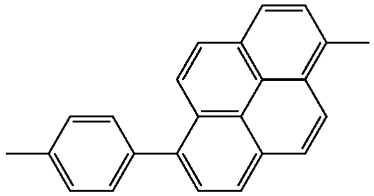
L15
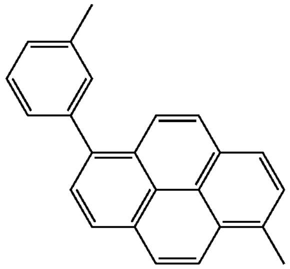
L16
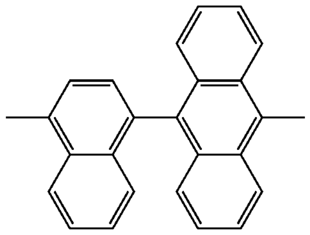
L17
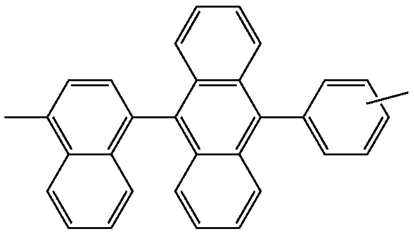
-continued
L18
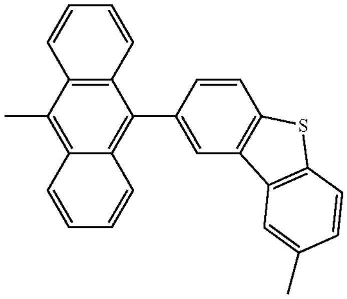
L19
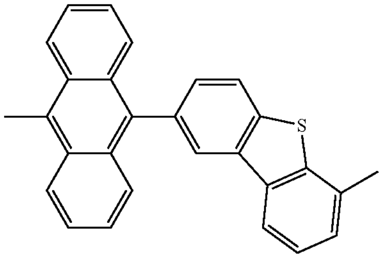
L20
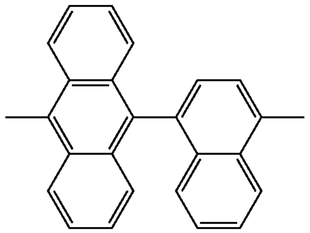
L21
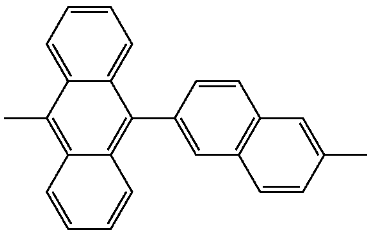
L22
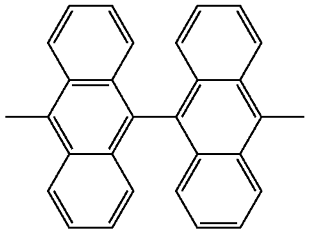
L23
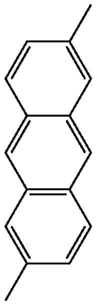

The compound represented by Chemical Formula 1 may be one among the following compounds:
ET01
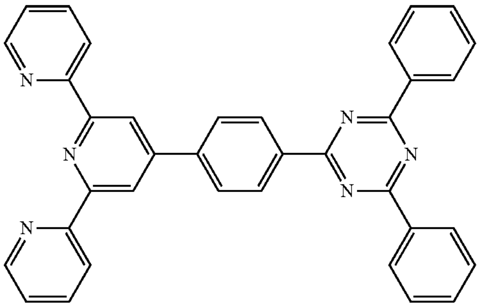
ET02
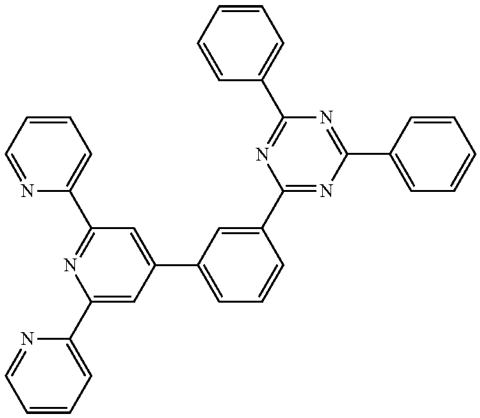
ET03
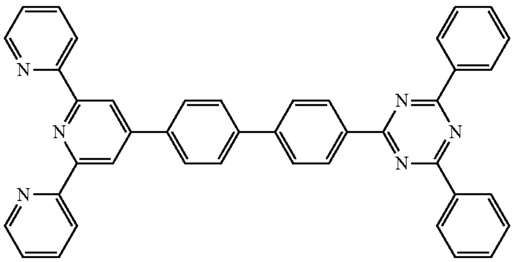
ET04
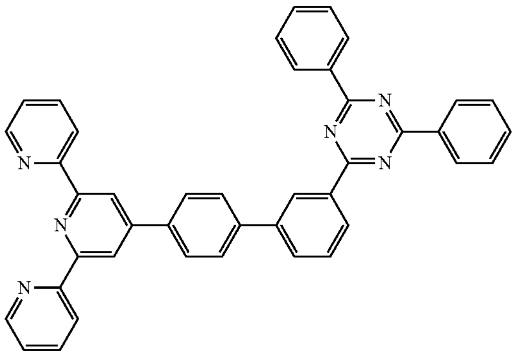
ET05
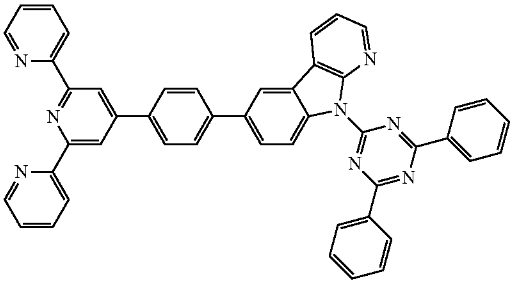
ET06
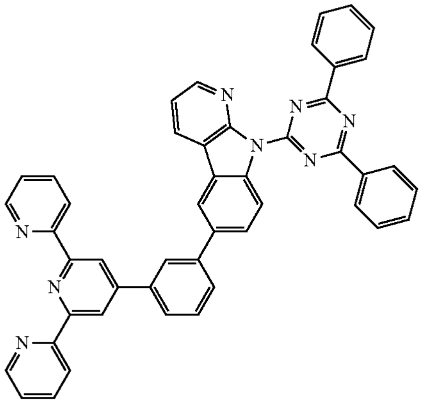
ET07
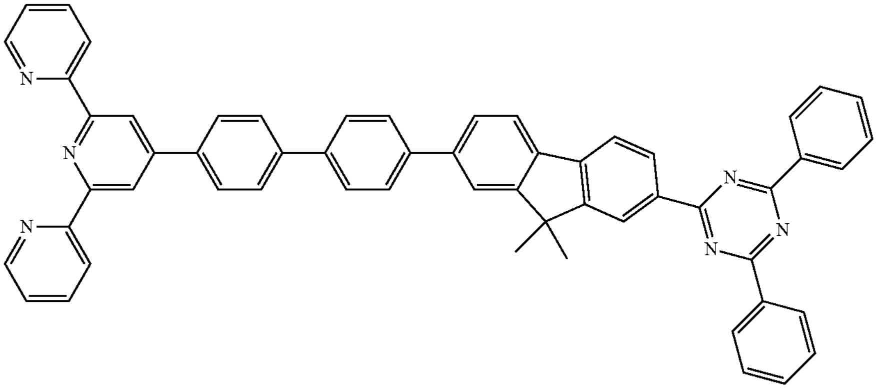

-continued
ET08
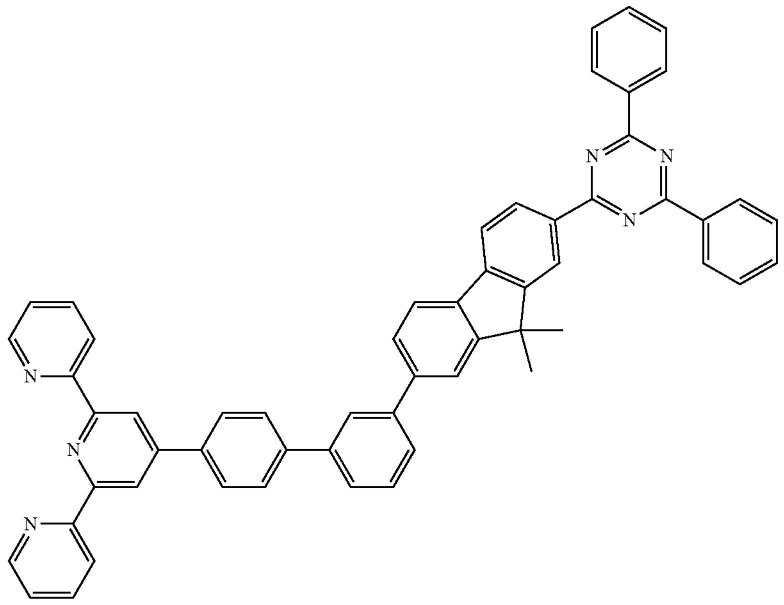
ET09
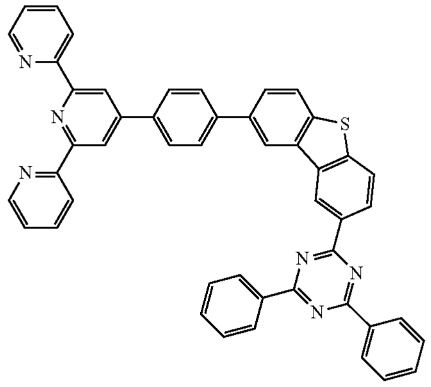
ET10
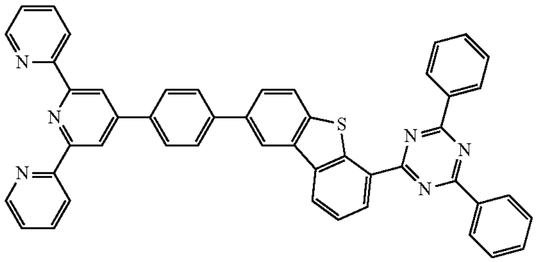
ET11
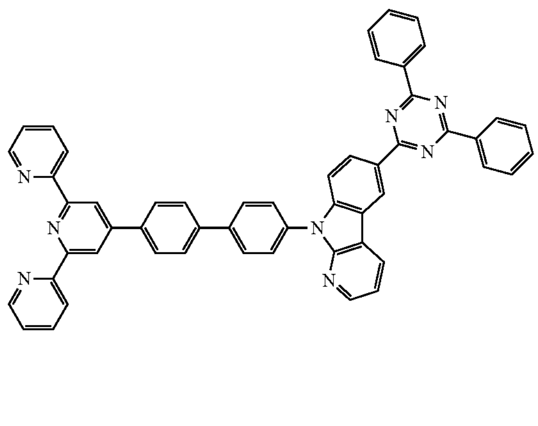
ET12
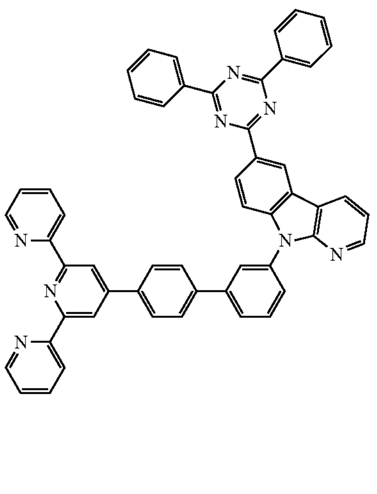

-continued
ET13
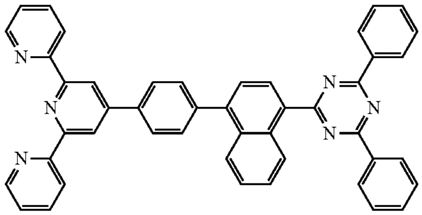
ET14
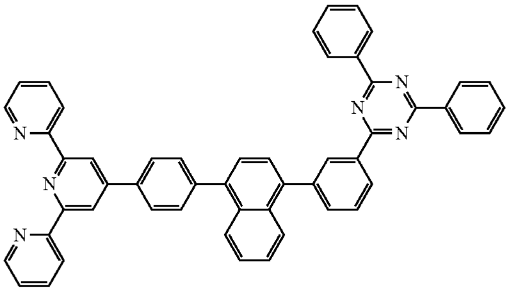
ET15
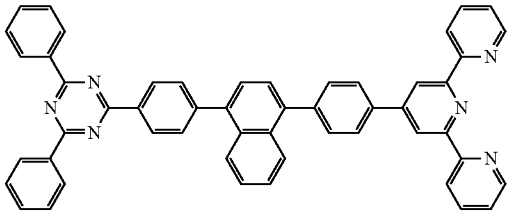
ET16
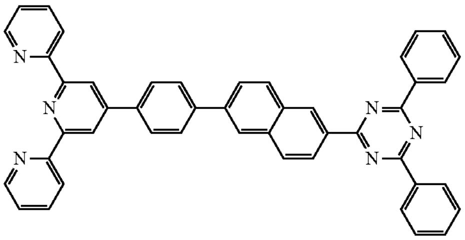
ET17
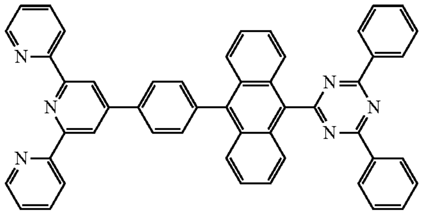
ET18
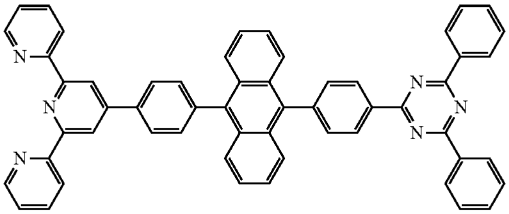
ET19
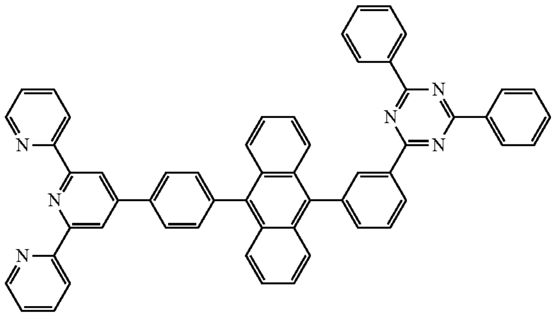
ET20
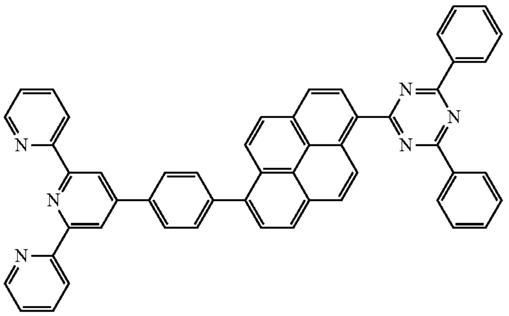
ET21
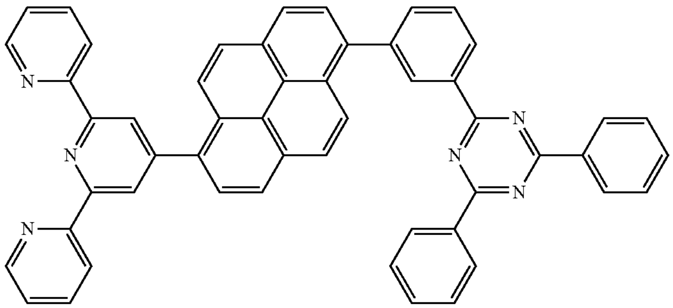
ET22
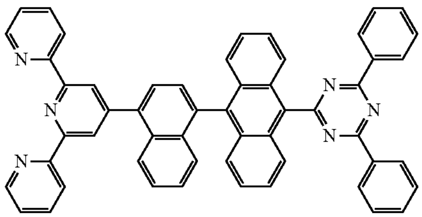
ET23
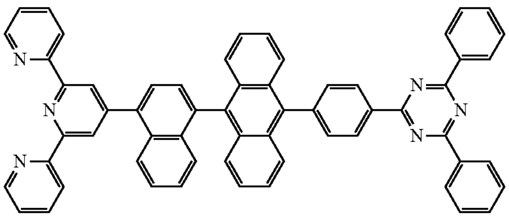

-continued

ET24

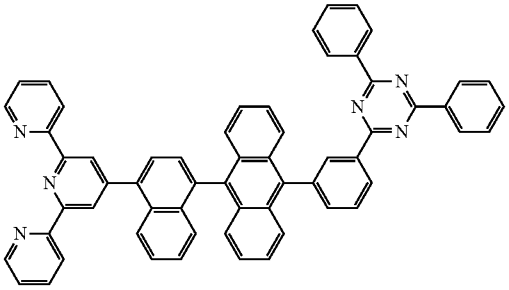

ET25

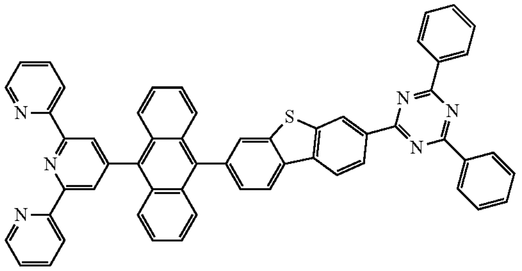

ET26

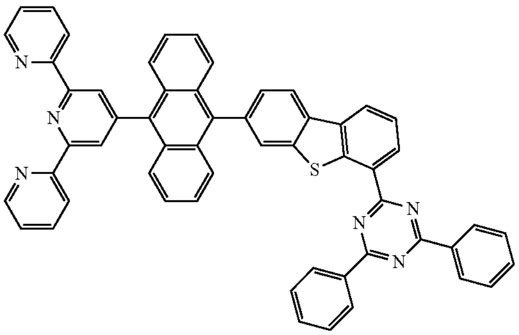

ET27

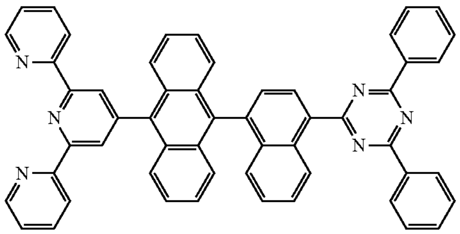

ET28

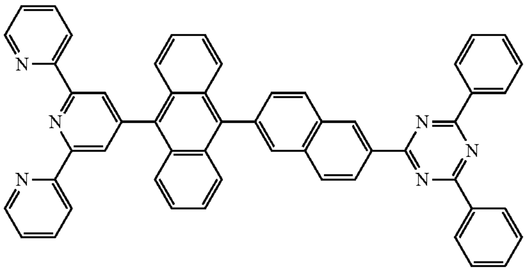

ET29

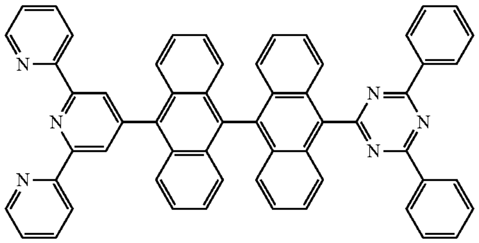

ET30

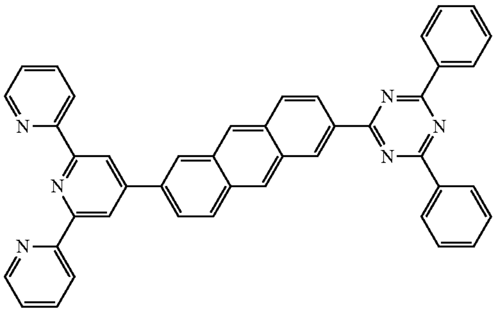

ET31

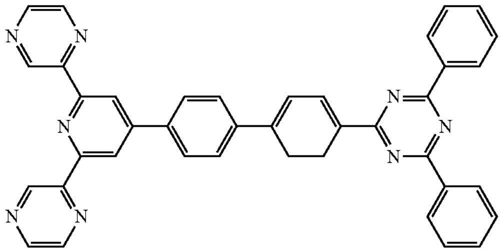

ET32

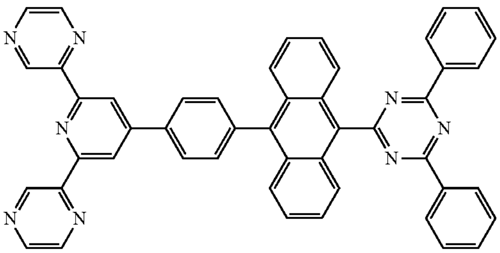

ET33

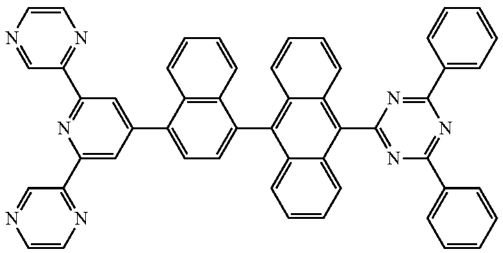

The electron transport layer 150 may be 1 to 150 nm thickness. If the electron transport layer 150 is 1 nm thickness or greater, a degradation of the electron transport properties may be prevented, or if the electron transport layer 150 is 150 nm thickness or less, an increase in the thickness of the electron transport layer 150 may be prevented, and a rise in operating voltage may be therefore prevented.

The electron injection layer 210 functions to facilitate electron injection, and may be formed of, but is not limited to, $Alq_a$ (tris(8-hydroxyquinolinato)aluminum), PBD(2-4-biphenyl)-5-(4-tert-butylphenyl)-1,3,4-oxadiazole), TAZ(3-(4-biphenyl)-4-pheynyl-5-tert-butylphenyl-1,2,4-triazole), or BAlq(Bis(2-methyl-8-quinolinolato)-4-(phenylphenolato)aluminum). On the other hand, the electron injection layer 210 may be formed of a metal compound, and the metal compound may be, for example, but is not limited to, one or more among LiQ, LiF, NaF, KF, RbF, CsF, FrF, $BeF_2$, $MgF_2$, $CaF_2$, $SrF_2$, $BaF_2$, and $RaF_2$. The electron injection layer 210 may be 1 to 50 nm thickness. If the electron injection layer 210 is 1 nm thickness or greater, a degradation of the electron injection properties may be prevented, or if the electron injection layer 210 is nm thickness, an increase in the thickness of the electron injection layer 210 may be prevented, and a rise in operating voltage may be therefore prevented.

The cathode 220 is an electron injection electrode, and may be formed of magnesium (Mg), calcium (Ca), aluminum (Al), silver (Ag), or an alloy thereof, having a low work function. If the organic light emitting display device is a top-emission type or a dual-emission type, the cathode 220 may be formed thin enough to pass light therethrough. If the organic light emitting display device is a bottom-emission type, the cathode 220 may be formed thick enough to reflect light.

As stated above, a compound of this disclosure is rich in electrons by including a core having at least three or more nitrogen atoms, which results in high electron mobility, making electron transport from the electron transport layer to the light emitting layer easy. Moreover, the compound of this disclosure may improve electron transport ability by having at least one other core with relatively high electronegativity. In addition, the compound of this disclosure may improve electron transport ability since a polar terpyridine core binds to a non-polar triazine core. Furthermore, the compound of this disclosure allows for smooth electron injection from the electron transport layer to the light emitting layer by inserting an aromatic ring link between the triazine core, which include aromatic ring with one or more nitrogen atoms, and the terpyridine core to separate the triazine and terpyridine cores with high electronic properties so as to keep electrons from being confined to one side. That is, the electronic balance between the triazine core and the terpyridine core can be maintained by the aromatic ring link, thereby allowing for smooth electron injection from the electron transport layer to the light emitting layer.

Accordingly, the present disclosure allows for efficient transfer of electrons from the electron transport layer to the light emitting layer by using a compound comprising a core with one or more nitrogen atoms and at least one other core with relatively high electronegativity as the electron transport layer, thereby improving the efficiency, lifetime, and performance of the device.

Figure 2:
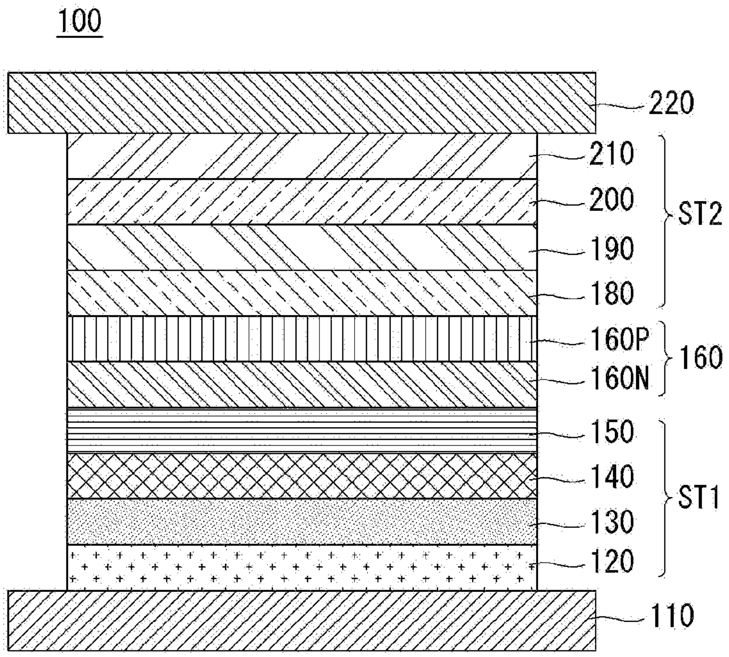
FIG. 2 is a cross-sectional view showing an organic light emitting display device according to a second exemplary embodiment of the present disclosure.

FIG. 2 is a view showing an organic light emitting display device according to a second exemplary embodiment of the present disclosure. The same elements as the first exemplary embodiment are denoted by the same reference numerals, so descriptions of these elements will be omitted below.

Referring to FIG. 2, an organic light emitting display device 100 of this disclosure comprises a light emitting parts ST1 and ST2 and a charge generation layer 160 between the light emitting parts ST1 and ST2.

The first light emitting part ST1 is a single light emitting diode unit, and comprises a first light emitting layer 140. The first light emitting layer 140 may emit light of one among red, green, or blue: for example, it may be a blue light emitting layer in this exemplary embodiment. The blue light emitting layer comprises one among a blue light emitting layer, a dark blue light emitting layer, and a sky blue light emitting layer. Alternatively, the first light emitting layer 140 may be formed of a blue light emitting layer and a red light emitting layer, a blue light emitting layer and a yellow-green light emitting layer, or a blue light emitting layer and a green light emitting layer.

The first light emitting part ST1 comprises a hole injection layer 120 and a first hole transport layer 130 that are between the anode 110 and the first light emitting layer 140, and a first electron transport layer 150 on the first light emitting layer 140. Accordingly, the first light emitting part ST1 comprising the hole injection layer 120, the first hole transport layer 130, the first light emitting layer 140, and the first electron transport layer 150 is formed on the anode 110. The hole injection layer 120 may not be included in the elements of the first light emitting part ST1, depending on the structure or characteristics of the device.

Like the above-described first exemplary embodiment, the first electron transport layer 150 may be formed of a compound including a core with a nitrogen atom, which is rich in electrons by having at least three or more nitrogen atoms, which results in high electron mobility, making electron transport from the first electron transport layer 150 to the first light emitting layer 140 easy. Moreover, the compound of this disclosure may improve electron transport ability by having a core with high electronegativity. In addition, the compound of this disclosure may improve electron transport ability since a polar terpyridine core binds to a non-polar triazine core. Accordingly, the first electron transport layer 150 of this disclosure may efficiently transfer charge from the N-type charge generation layer to the first light emitting layer 140.

A charge generation layer (CGL) 160 is on the first light emitting part ST1. The first light emitting part ST1 and the second light emitting part ST2 are connected by the charge generation layer 160. The charge generation layer 160 may be a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layer. That is, the N-type charge generation layer 160N transfers electrons to the electron transport layer 150 and the electron transport layer 150 supplies the electrons to the first light emitting layer 140 adjacent to the anode, and the P-type charge generation layer 160P transfers holes to the second hole transport layer 180 and the hole transport layer 180 supplies the holes to a second light emitting layer of the second light emitting part ST2. As such, the organic light emitting display device with a plurality of light emitting layers can further increase its light emission efficiency and lower its operating voltage. Accordingly, the charge generation layer 160 has a major effect on the organic light emitting display device's light emission efficiency, operating voltage, or lifetime.

Thus, the present inventors conducted several tests or experiments to improve the electron injection properties of the N-type charge generation layer. When the device is driven, the alkali metal or alkali earth metal with which the N-type charge generation layer is doped moves together with electrons and migrates to the electron transport layer. Thus, the amount of electrons injected into the electron transport layer decreases, resulting in a gradual rise in operating voltage and adverse effects on lifetime. Accordingly, the above-described compounds were used as the N-type charge generation layer through several tests or experiments, in order to select materials for the N-type charge generation layer that can reduce operating voltage and improve efficiency.

Accordingly, a compound of this disclosure is rich in electrons by including a core having at least three or more nitrogen atoms, which results in high electron mobility, making electron transport easy. Moreover, the compound of this disclosure may improve electron transport ability by having a core with relatively high electronegativity. In addition, the compound of this disclosure may improve electron transport ability since a polar terpyridine core binds to a non-polar triazine core. Furthermore, the compound of this disclosure allows for smooth electron injection from the N-type charge generation layer to the electron transport layer by inserting an aromatic ring link between the triazine core, which include aromatic ring with one or more nitrogen atoms, and the terpyridine core to separate the triazine and terpyridine cores with high electronic properties so as to keep electrons from being confined to one side. That is, the electronic balance between the triazine core and the terpyridine core can be maintained by the aromatic ring link, thereby allowing for smooth electron injection from the N-type charge generation layer to the electron transport layer.

Moreover, a compound of this disclosure comprises $sp^2$ hybrid orbitals of nitrogen (N) that are relatively rich in electrons, and the nitrogen binds to an alkali metal or alkali earth metal, i.e., a dopant for the N-type charge generation layer, thereby forming a gap state. This gap state may facilitate transfer of electrons from the N-type charge generation layer to the electron transport layer.

On the other hand, if the N-type charge generation layer 160N is not formed of the above-described compounds, it may be formed of a metal or an N-doped organic material. The metal may be one material among Li, Na, K, Rb, Cs, Mg, Ca, Sr, Ba, La, Ce, Sm, Eu, Tb, Dy, and Yb. For example, the N-type dopant may be an alkali metal, an alkali metal compound, an alkali earth metal, or an alkali earth metal compound. Specifically, the N-type dopant may be one among Li, Be, Cs, K, Rb, Mg, Na, Ca, Sr, Eu, Fr, Ba, Ra, and Yb. The percentage of the dopant to be mixed between 0.5 and 10% by volume relative to 100% for the host. The dopant may have a work function of 2.5 eV or greater. The host material may be an organic material that has a hetero ring with one or more nitrogen atoms, with 20 to 60 carbon atoms, for example, one among $Alq_3$(tris(8-hydroxyquinolinato)aluminum), a benzazole derivative, and a silole derivative.

The P-type charge generation layer 160P may be formed of a metal or a P-doped organic material. The metal may be one or more alloys among Al, Cu, Fe, Pb, Zn, Au, Pt, W, In, Mo, Ni, and Ti. A P-type dopant and host for the P-doped organic material may be commonly-used materials. For example, the P-type dopant may be one material among $F_4$-TCNQ(2,3,5,6-tetrafluoro-7,7,8,8,-tetracyanoquinodimethane), iodine, $FeCl_3$, $FeF_3$, and $SbCl_5$. The host may be one material among NPB (N,N'-bis(naphthalene-1-yl)-N,N'-bis(phenyl)-benzidine), TPD(N,N'-bis-(3-methylphenyl)-N,N'-bis(phenyl)-benzidine), and TNB(N,N,N'N'-tetranaphthalenyl-benzidine).

The second light emitting part ST2 comprising a second hole transport layer 180, a second light emitting layer 190, a second electron transport layer 200, and an electron injection layer 210 is on the charge generation layer 160. The second hole transport layer 180 and the second electron transport layer 200 may have the same composition as the hole injection layer 120, first hole transport layer 130, and first electron transport layer 150 of the above-described first light emitting part ST1, respectively, or have different compositions from their compositions.

The second light emitting layer 190 may emit light of red, green, or blue: for example, it may be a yellow light emitting layer in this exemplary embodiment. The yellow light emitting layer may have a single layer structure of a yellow-green light emitting layer or green light emitting layer, or a multilayer structure formed of a yellow-green light emitting layer and a green light emitting layer. Here, the second light emitting layer 190 comprises a yellow-green light emitting layer, a green light emitting layer, or a multilayer structure formed of a yellow-green light emitting layer and a green light emitting layer, a yellow light emitting layer and a red light emitting layer, a green light emitting layer and a red light emitting layer, or a yellow-green light emitting layer and a red light emitting layer. This exemplary embodiment will be described by taking as an example a single layer structure of a second light emitting layer that emits yellow-green light. The second light emitting layer 190 may include, but is not limited to, at least one host of CBP 4,4'-bis(carbazol-9-yl)biphenyl) and BAlq(Bis(2-methyl-8-quinolinolato)-4-(phenylphenolato)aluminum) and a phosphorescent yellow-green dopant that emits yellow-green light. But it is not limited thereto.

The second light emitting part ST2 comprises the second hole transport layer 180 between the charge generation layer 160 and the second light emitting layer 190, and the second electron transport layer 200 and electron injection layer 210 that are on the second light emitting layer 190. Accordingly, the second light emitting part ST2 comprising the second hole transport layer 180, the second light emitting layer 190, the second electron transport layer 200, and the electron injection layer 210 is formed on the first charge generation layer 160. The cathode 220 is formed on the second light emitting part ST2 to constitute the organic light emitting display device according to the second exemplary embodiment of the present disclosure.

Although the second exemplary embodiment of the present disclosure has been described with an example in which the first electron transport layer 150 and the N-type charge generation layer 160N each comprises a compound of this disclosure, the present disclosure is not limited thereto, and at least one among the first electron transport layer 150, the second electron transport layer 200, and the N-type charge generation layer 160N may comprise a compound of this disclosure.

Preferably, the compound of this disclosure may be included in the second light emitting part ST2 comprising the second light emitting layer 190 which is a yellow-green light emitting layer. For the yellow-green light emitting layer, an organic layer with high electron mobility to a phosphorescent light emitting layer is required. The compound of this disclosure matches the condition of electron mobility to the phosphorescent light emitting layer since it has high electron mobility and low triplet energy. Accordingly, if the compound of this disclosure is included in the second light emitting part ST2, the electron mobility of the second light emitting part ST2 becomes higher. Therefore, it is preferable that the compound of this disclosure is in the second light emitting part ST2 which emits yellow-green phosphorescent light. On the other hand, for a fluorescent light emitting layer, an organic layer with high triplet energy, rather than high electron mobility, is required. In a case where the compound of this disclosure is included in a light emitting part comprising a fluorescent light emitting layer, it does not match the triplet energy condition for the fluorescent light emitting layer. Thus, it is preferable that the compound of this disclosure is in a light emitting part comprising a phosphorescent light emitting layer.

As stated above, a compound of this disclosure is rich in electrons by including a core having at least three or more nitrogen atoms, which results in high electron mobility, making electron transport easy. Moreover, the compound of this disclosure may improve electron transport ability by having a core with relatively high electronegativity. In addition, the compound of this disclosure may improve electron transport ability since a polar terpyridine core binds to a non-polar triazine core. Furthermore, the compound of this disclosure allows for smooth electron injection from the N-type charge generation layer to the electron transport layer by inserting an aromatic ring link between the triazine core, which include an aromatic ring with one or more nitrogen atoms, and the terpyridine core to separate the triazine and terpyridine cores with high electronic properties so as to keep electrons from being confined to one side. That is, the electronic balance between the triazine core and the terpyridine core can be maintained by the aromatic ring link, thereby allowing for smooth electron injection from the N-type charge generation layer to the electron transport layer. Accordingly, the present disclosure allows for efficient transfer of electrons from the N-type charge generation layer to the light emitting layer.

Moreover, a compound of this disclosure comprises $sp^2$ hybrid orbitals of nitrogen (N) that are relatively rich in electrons, and the nitrogen binds to an alkali metal or alkali earth metal, i.e., a dopant for the N-type charge generation layer, thereby forming a gap state. This gap state may facilitate transfer of electrons from the N-type charge generation layer to the electron transport layer. Accordingly, the organic light emitting display device of this disclosure may facilitate transfer of electrons from the N-type charge generation layer to the electron transport layer by using the compound of this disclosure as the N-type charge generation layer.

Accordingly, the organic light emitting display device of this disclosure may facilitate transfer of electrons from the N-type charge generation layer to the light emitting layer by using a compound of this disclosure as at least one among the electron transport layers included in the light emitting parts and the N-type charge generation layer.

Figure 3:
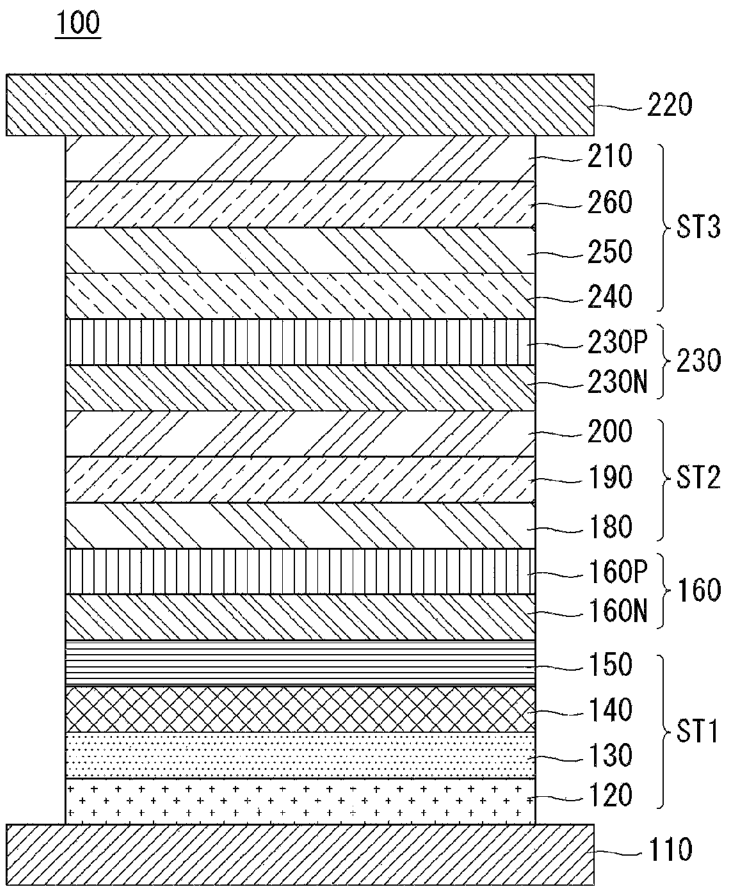
FIG. 3 is a cross-sectional view showing an organic light emitting display device according to a third exemplary embodiment of the present disclosure.

FIG. 3 is a view showing an organic light emitting display device according to a third exemplary embodiment of the present disclosure. The same elements as the first and second exemplary embodiments are denoted by the same reference numerals, so descriptions of these elements will be omitted below.

Referring to FIG. 3, an organic light emitting display device 100 of the present disclosure comprises a plurality of light emitting parts ST1, ST2, and ST3 between an anode 110 and a cathode 220, and a first charge generation layer 160 and a second charge generation layer 230 that are between the light emitting parts ST1, ST2, and ST3. Although this exemplary embodiment has been illustrated and described with an example where three light emitting parts are between the anode 110 and the cathode 220, the present disclosure is not limited to this example and four or more light emitting parts may be between the anode 110 and the cathode 220.

More specifically, the first light emitting part ST1 is a single light emitting diode unit, and comprises a first light emitting layer 140. The first light emitting layer 140 may emit light of red, green, or blue: for example, it may be a blue light emitting layer in this exemplary embodiment. The blue light emitting layer comprises one among a blue light emitting layer, a dark blue light emitting layer, and a sky blue light emitting layer. Alternatively, the first light emitting layer 140 may be formed of a blue light emitting layer and a red light emitting layer, a blue light emitting layer and a yellow-green light emitting layer, or a blue light emitting layer and a green light emitting layer.

The first light emitting part ST1 comprises a hole injection layer 120 and a first hole transport layer 130 that are between the anode 110 and the first light emitting layer 140, and a first electron transport layer 150 on the first light emitting layer 140. Accordingly, the first light emitting part ST1 comprising the hole injection layer 120, the first hole transport layer 130, the first light emitting layer 140, and the first electron transport layer 150 is formed on the anode 110. The hole injection layer 120 may not be included in the elements of the first light emitting part ST1, depending on the structure or characteristics of the device.

The first charge generation layer 160 is on the first light emitting part ST1. The first charge generation layer 160 is a PN-junction charge generation layer, formed by joining an N-type charge generation layer 160N and a P-type charge generation layer 160P, which generate a charge, or inject the charge, i.e., electrons and holes, separately into the light emitting layers, respectively.

The second light emitting part ST2 comprising a second light emitting layer 190 is on the first charge generation layer 160. The second light emitting layer 190 may emit light of red, green, or blue: for example, it may be a yellow light emitting layer in this exemplary embodiment. The yellow light emitting layer may comprise a yellow-green light emitting layer, a green light emitting layer, or a multilayer structure formed of a yellow-green light emitting layer and a green light emitting layer, a yellow light emitting layer and a red light emitting layer, a green light emitting layer and a red light emitting layer, or a yellow-green light emitting layer and a red light emitting layer. The second light emitting part ST2 further comprises a second hole transport layer 180 between the first charge generation layer 160 and the second light emitting layer 190, and a second electron transport layer 200 on the second light emitting layer 190. Accordingly, the second light emitting part ST2 comprising the second hole transport layer 180, second light emitting layer 190, and second electron transport layer 200 is formed on the first charge generation layer 160.

Like the above-described first exemplary embodiment, the second electron transport layer 200 of this disclosure may be formed of an electron transport compound. A compound of this disclosure is rich in electrons by including at least three or more nitrogen atoms, which results in high electron mobility, making electron transport easy. Although the compound of this disclosure is rich in electrons due to three or more nitrogen atoms symmetrical to a triazine core, it is non-polar. To make up for this non-polarity, a terpyridine core, which is polar and has relatively high electronegativity, binds to the triazine core, thereby improving electron transport ability. Moreover, the compound of this disclosure allows for smooth electron injection from the electron transport layer to the light emitting layer by inserting an aromatic ring link L1 between the triazine core, which include an aromatic ring with one or more nitrogen atoms, and the terpyridine core to separate the triazine and terpyridine cores with high electronic properties so as to keep electrons from being confined to one side. Accordingly, the present disclosure allows for efficient transfer of electrons from the N-type charge generation layer to the light emitting layer by using a compound comprising a core with one or more nitrogen atoms and at least one other core with relatively high electronegativity as the electron transport layer. That is, the electronic balance between the triazine core and the terpyridine core can be maintained by the aromatic ring link L1, thereby allowing for smooth electron injection from the electron transport layer to the light emitting layer.

The second charge generation layer 230 is on the second light emitting part ST2. The second charge generation layer 230 is a PN-junction charge generation layer, formed by joining an N-type charge generation layer 230N and a P-type charge generation layer 230P, which generate a charge, or inject the charge, i.e., electrons and holes, separately into the light emitting layers, respectively.

The N-type charge generation layer 230N of the second charge generation layer 230 according to the present disclosure may be formed of a compound comprising a core with one or more nitrogen atoms and at least one other core with relatively high electronegativity. This compound includes at least three or more nitrogen (N) atoms which are rich in electrons, which results in high electron mobility, making electron transport easy. Moreover, a compound of this disclosure includes $sp^2$ hybrid orbitals of nitrogen (N) that are relatively rich in electrons, and the nitrogen binds to an alkali metal or alkali earth metal, i.e., a dopant for the N-type charge generation layer, thereby forming a gap state. This gap state may facilitate transfer of electrons from the N-type charge generation layer to the electron transport layer.

The third light emitting part ST3 comprising a third light emitting layer 250 is on the second charge generation layer 230. The third light emitting layer 250 may emit light of red, green, or blue: for example, it may be a blue light emitting layer in this exemplary embodiment. The blue light emitting layer comprises one among a blue light emitting layer, a dark blue light emitting layer, and a sky blue light emitting layer. Alternatively, the third light emitting layer 250 may be formed of a blue light emitting layer and a red light emitting layer, a blue light emitting layer and a yellow-green light emitting layer, or a blue light emitting layer and a green light emitting layer.

The third light emitting part ST3 further comprises a third hole transport layer 240 between the second charge generation layer 230 and the third light emitting layer 250, and a third electron transport layer 260 and an electron injection layer 210 that are on the third light emitting layer 250. The third electron transport layer 260 has the same composition as the aforementioned first electron transport layer 150, so its description will be omitted. Accordingly, the third light emitting part ST3 comprising the third hole transport layer 240, the third light emitting layer 250, the third electron transport layer 260, and the electron injection layer 210 is formed on the second charge generation layer 230. The cathode 220 is formed on the third light emitting part ST3 to constitute the organic light emitting display device according to the third exemplary embodiment of the present disclosure.

Although the third exemplary embodiment of the present disclosure has been described with an example in which the second electron transport layer 200 and the N-type charge generation layer 230N of the second charge generation layer 230 each comprise a compound of this disclosure, the present disclosure is not limited thereto, and at least one among the first electron transport layer 150, the second electron transport layer 200, the third electron transport layer 260, the N-type charge generation layer 160N of the first charge generation layer 160, and the N-type charge generation layer 230N of the second charge generation layer 230 may comprise a compound of this disclosure.

Preferably, the compound of this disclosure may be included in the second light emitting part ST2 comprising the second light emitting layer 190 which is a yellow-green light emitting layer. For the yellow-green light emitting layer, an organic layer with high electron mobility to a phosphorescent light emitting layer is required. The compound of this disclosure matches the condition of electron mobility to the phosphorescent light emitting layer since it has high electron mobility and low triplet energy. Accordingly, if the compound of this disclosure is included in the second light emitting part ST2, the electron mobility of the second light emitting part ST2 becomes higher. Therefore, it is preferable that the compound of this disclosure is in the second light emitting part ST2 which emits yellow-green phosphorescent light. Also, if the phosphorescent light emitting layer is in the first light emitting part ST1 or in the third light emitting part ST3, the compound of this disclosure may be in the first light emitting part ST1 or the third light emitting part ST3. On the other hand, for a fluorescent light emitting layer, an organic layer with high triplet energy, rather than high electron mobility, is required. In a case where the compound of this disclosure is included in a light emitting part comprising a fluorescent light emitting layer, it does not match the triplet energy condition for the fluorescent light emitting layer. Thus, it is preferable that the compound of this disclosure is in a light emitting part comprising a phosphorescent light emitting layer.

As stated above, a compound of this disclosure is rich in electrons by including a core having at least three or more nitrogen atoms, which results in high electron mobility, making electron transport easy. Moreover, the compound of this disclosure may improve electron transport ability by having a core with relatively high electronegativity. In addition, the compound of this disclosure may improve electron transport ability since a polar terpyridine core binds to a non-polar triazine core. Furthermore, the compound of this disclosure allows for smooth electron injection from the N-type charge generation layer to the light emitting layer by inserting an aromatic ring link between the triazine core, which include an aromatic ring with one or more nitrogen atoms, and the terpyridine core to separate the triazine and terpyridine cores with high electronic properties so as to keep electrons from being confined to one side. That is, the electronic balance between the triazine core and the terpyridine core can be maintained by the aromatic ring link, thereby allowing for smooth electron injection from the N-type charge generation layer to the light emitting layer. Accordingly, the present disclosure allows for efficient transfer of electrons from the N-type charge generation layer to the light emitting layer by using a compound comprising a core with one or more nitrogen atoms and at least one other core with relatively high electronegativity as the electron transport layer or N-type charge generation layer, thereby improving the lifetime, efficiency, and performance of the device.

Moreover, a compound comprising a core with one or more nitrogen atoms and at least one other core with relatively high electronegativity according to the present disclosure includes at least three or more nitrogen (N) atoms which are rich in electrons, which results in high electron mobility, making electron transport easy. Moreover, a compound of this disclosure includes $sp^2$ hybrid orbitals of nitrogen (N) that are relatively rich in electrons, and the nitrogen binds to an alkali metal or alkali earth metal, i.e., a dopant for the N-type charge generation layer, thereby forming a gap state. This gap state may facilitate transfer of electrons from the N-type charge generation layer to the electron transport layer. Accordingly, the present disclosure may facilitate transfer of electrons from the N-type charge generation layer to the electron transport layer by using the compound of this disclosure as the N-type charge generation layer.

Accordingly, the organic light emitting display device of this disclosure allows for efficient transfer of electrons from the N-type charge generation layer to the light emitting layer by using a compound of this disclosure as at least one among the electron transport layers included in the light emitting parts and the N-type charge generation layers. The present disclosure may solve the problem of low lifetime due to inefficient electron injection since electron transfer from the N-type charge generation layer to the electron transport layer is facilitated. Furthermore, the present disclosure may solve the problem of the rise in operating voltage caused when electrons injected into the N-type charge generation layer move to the electron transport layer due to the difference in LUMO energy level between the electron transport layer and the N-type charge generation layer.

Hereinafter, synthesis examples of electron transport compounds of the present disclosure will be described in detail. However, the following examples are only for illustration, and the present disclosure is not limited thereto.

Synthesis of Compound TPTr-Pyr-TPry

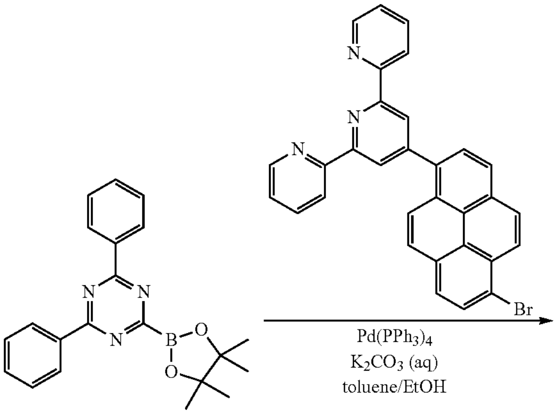

-continued

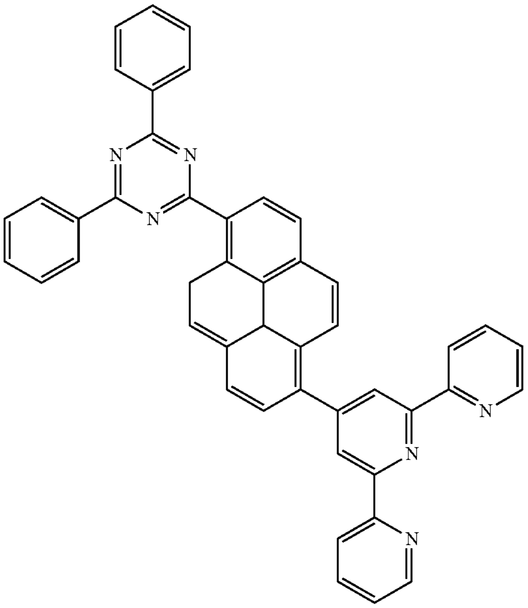

TPTr-Pyr-TPry 2-(3-(4,4,5,5-tetramethyl-1,3,2-dioxaborolan-2-yl)phenyl)-4,6-diphenyl-1,3,5-triazine (5 g, 13.92 mmol), 2-(4-(4-bromophenyl)-6-(pyridin-2-yl)pyridin-2-yl)pyridine (5.94 g, 11.6 mmol), tetrakistriphenylphosphine palladium (0) (Pd(PPh3)4) (0.53 g 0.46 mmol), a potassium carbonate solution (4M, 10 ml), 30 ml of toluene, and 10 ml of ethanol were put under a nitrogen atmosphere, and then refluxed and stirred for 12 hours. After the reaction, 50 ml of water ($H_2O$) was added, and the mixture was stirred for 3 hours, then vacuum-filtered, and then subjected to column chromatography using methylene chloride/hexane as the eluent, followed by MC recrystallization, to obtain Compound TPTr-Pyr-TPry (5.6 g, yield: 84.6%)

Synthesis of Compound TPTr-Phn-TPry

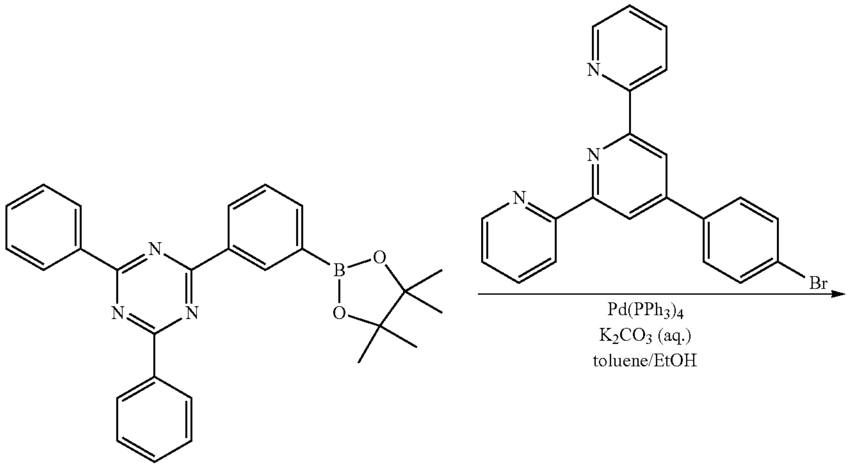

-continued

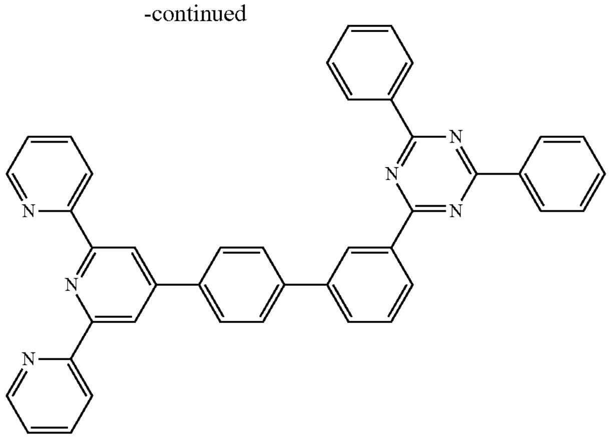

2-(3-(4,4,5,5-tetramethyl-1,3,2-dioxaborolan-2-yl)phenyl)-4,6-diphenyl-1,3,5-triazine (5 g, 11.49 mmol), 2-(4-(4-bromophenyl)-6-(pyridin-2-yl)pyridin-2-yl)pyridine (3.71 g, 9.57 mmol), tetrakistriphenylphosphine palladium (0) (Pd(PPh3)4) (0.55 g 0.48 mmol), a potassium carbonate solution (4M, 10 ml), 30 ml of toluene, and 10 ml of ethanol were put under a nitrogen atmosphere, and then refluxed and stirred for 12 hours. After the reaction, 50 ml of water ($H_2O$) was added, and the mixture was stirred for 3 hours, then vacuum-filtered, and then subjected to column chromatography using methylene chloride/hexane as the eluent, followed by MC recrystallization, to obtain Compound TPTr-Phn-TPry (5.01 g, yield: 84.6%).

Hereinafter, embodiments for the manufacture of an organic light emitting display device according to the present disclosure will be disclosed. However, the following materials for the electron transport layer do not limit the scope of the present disclosure.

COMPARATIVE EXAMPLE

An organic light emitting display device was manufactured by forming, on a substrate, a first light emitting part comprising a blue light emitting layer and a first electron transport layer, a charge generation layer, a second light emitting part comprising a yellow light emitting layer and a second electron transport layer, and a cathode. Here, the first and second electron transport layers were formed of an anthracene compound.

Embodiment 1

It has the same elements as the above-described Comparative Example, and the first electron transport layer was formed of Compound TPTr-Pyr-TPry.

Embodiment 2

It has the same elements as the above-described Comparative Example, and the second electron transport layer was formed of Compound TPTr-Phn-TPry.

The materials for the electron transport layers in the above Comparative Example and Embodiments do not limit the scope of the present disclosure.

The operating voltage, efficiency, and lifetime of the devices manufactured according to the above-described Comparative Example and Embodiments were measured and shown in the following Table 1. (The measurements taken in Embodiments were expressed as a percentage relative to those taken in Comparative Example corresponding to 100%, and the devices manufactured according to Comparative Example and Embodiments were driven at an operating current density of 10 mA/cm$^2$).

Figure 4:
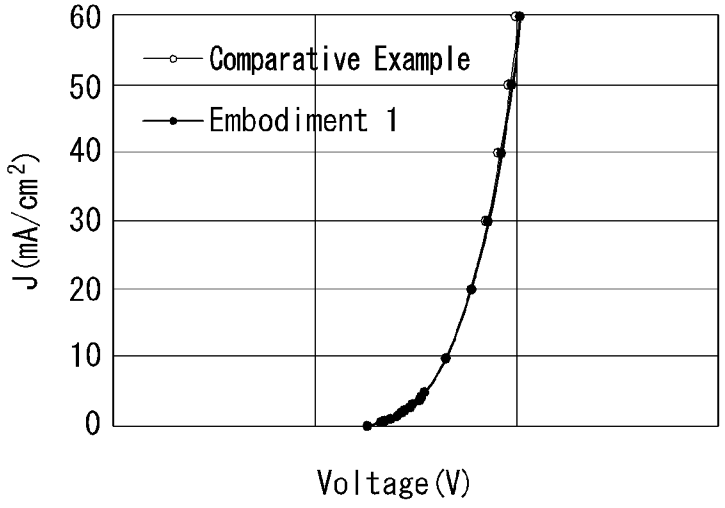
FIG. 4 is a graph of the current density vs. voltage of organic light emitting display devices according to Comparative Example and Embodiment 1 of the present disclosure.
Figure 5:
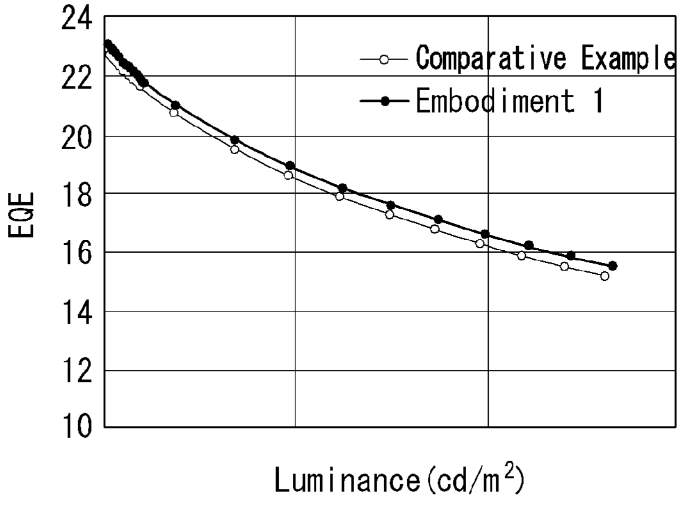
FIG. 5 is a graph of the quantum efficiency vs. luminance of organic light emitting display devices according to Comparative Example and Embodiment 1 of the present disclosure.
Figure 6:
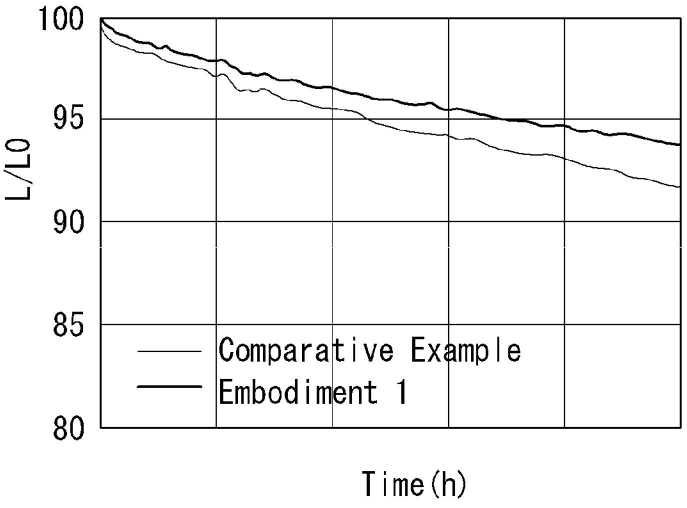
FIG. 6 is a graph of the rate of decrease in luminance over time of organic light emitting display devices according to Comparative Example and Embodiment 1 of the present disclosure.

The current density vs. voltage of the organic light emitting display devices manufactured according to Comparative Example and Embodiment 1 was measured and shown in FIG. 4, and the quantum efficiency vs. luminance was measured and shown in FIG. 5, and the luminance vs. time was measured and shown in FIG. 6. Also, the current density vs. voltage of the organic light emitting display devices manufactured according to Comparative Example and Embodiment 2 was measured and shown in FIG. 7, and the quantum efficiency vs. luminance was measured and shown in FIG. 8, and the luminance vs. time was measured and shown in FIG. 9.

While Comparative Example and Embodiments use a yellow-green light emitting layer as an example of the light emitting layer, the light emitting layer or electron transport layer included in a light emitting part that emits light of other colors also may be used.

TABLE 1

| | Operating Voltage (V) | Efficiency (Cd/A) | Lifetime (T95) |
|---|---|---|---|
| Comparative Example 1 | 100% | 100% | 100% |
| Embodiment 1 | 100% | 105% | 153% |
| Embodiment 2 | 93% | 97% | 143% |

Referring to Table 1 and FIGS. 4 to 6, Embodiment using Compound TPTr-Pyr-TPry as the first electron transport layer showed the same operating voltage, a 5% increase in efficiency, and a 53% increase in lifetime, compared to Comparative Example using an anthracene compound as the first and second electron transport layers.

FIG. 4 shows the current density vs. voltage, from which it can be seen that Comparative Example and Embodiment 1 had the same operating voltage. FIG. 5 shows the quantum efficiency vs. luminance, from which it can be seen that Embodiment 1 had an improvement in efficiency compared to Comparative Example. FIG. 6 shows the luminance vs. time, from which it can be seen that Embodiment 1 had an improvement in lifetime compared to Comparative Example. The lifetime is a measurement of the light emission luminance over time relative to 100% initial light emission luminance.

Figure 7:
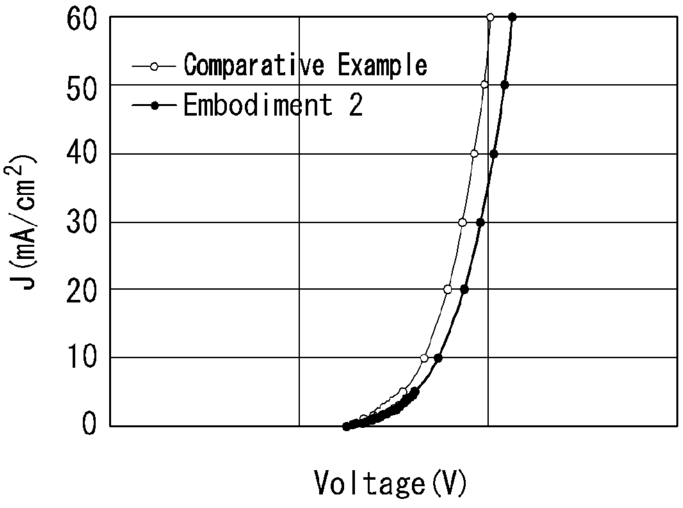
FIG. 7 is a graph of the current density vs. voltage of organic light emitting display devices according to Comparative Example and Embodiment 2 of the present disclosure.
Figure 8:
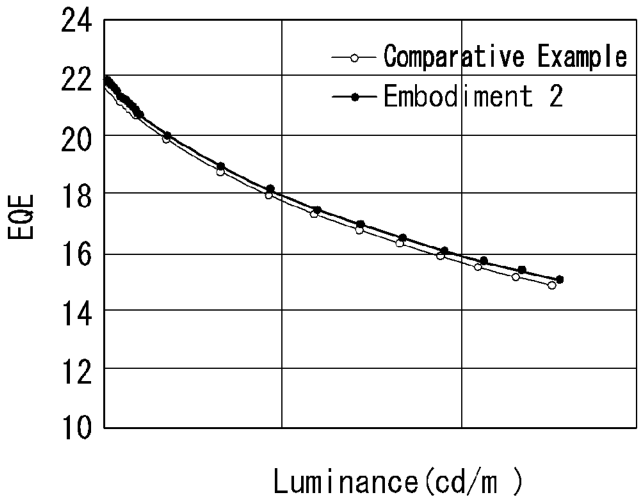
FIG. 8 is a graph of the quantum efficiency vs. luminance of organic light emitting display devices according to Comparative Example and Embodiment 2 of the present disclosure.
Figure 9:
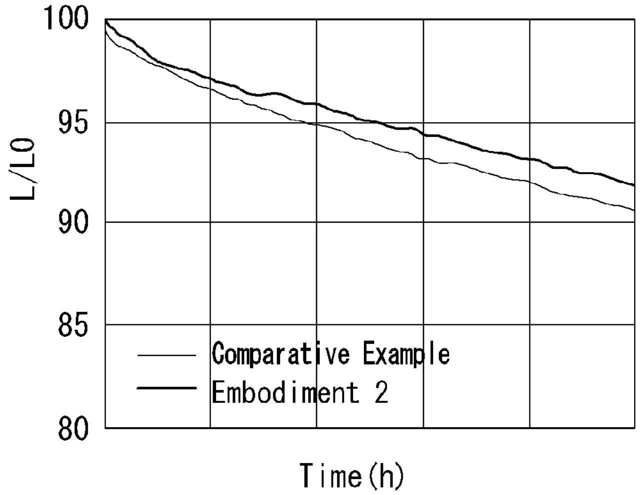
FIG. 9 is a graph of the rate of decrease in luminance over time of organic light emitting display devices according to Comparative Example and Embodiment 2 of the present disclosure.

Referring to Table 1 and FIGS. 7 to 9, Embodiment using Compound TPTr-Phn-TPry as the second electron transport layer showed a 7% decrease in operating voltage, a 3% decrease in efficiency, and a 43% increase in lifetime, compared to Comparative Example 2 using an anthracene compound as the first and second electron transport layers.

FIG. 7 shows the current density vs. voltage, from which it can be seen that Embodiment 2 had a reduction in operating voltage compared to Comparative Example. FIG. 8 shows the quantum efficiency vs. luminance, from which it can be seen that Embodiment 2 had a reduction in efficiency compared to Comparative Example. FIG. 9 shows the luminance vs. time, from which it can be seen that Embodiment 2 had an improvement in lifetime compared to Comparative Example. The lifetime is a measurement of the light emission luminance over time relative to 100% initial light emission luminance.

From these results, it can be found out that the use of a compound of this disclosure as the electron transport layers reduced the operating voltage of the device and increased the efficiency or lifetime of the device. Accordingly, it can be concluded that the organic light emitting display device using the electron transport layer comprising the compound of this disclosure improves electron injection toward a first electrode and hole injection toward a second electrode, compared to the organic light emitting display device using the electron transport layer not comprising this compound, thereby leading to a relative reduction in operating voltage and a relative increase in lifetime.

As stated above, a compound of this disclosure is rich in electrons by including a core having at least three or more nitrogen atoms, which results in high electron mobility, making electron transport easy. Moreover, the compound of this disclosure may improve electron transport ability by having a core with relatively high electronegativity. In addition, the compound of this disclosure may improve electron transport ability since a polar terpyridine core binds to a non-polar triazine core. Furthermore, the compound of this disclosure allows for smooth electron injection by inserting an aromatic ring link between the triazine core, which include an aromatic ring with one or more nitrogen atoms, and the terpyridine core to separate the triazine and terpyridine cores with high electronic properties so as to keep electrons from being confined to one side. That is, the electronic balance between the triazine core and the terpyridine core can be maintained by the aromatic ring link, thereby allowing for smooth electron injection from the electron transport layer to the light emitting layer. Accordingly, the present disclosure allows for efficient transfer of electrons from the N-type charge generation layer or electron transport layer to the light emitting layer by using a compound including a core having one or more nitrogen atoms and at least one other core with relatively high electronegativity as the electron transport layer or N-type charge generation layer, thereby improving the efficiency, lifetime, and performance of the device.

Moreover, a compound comprising a core with one or more nitrogen atoms and at least one other core with relatively high electronegativity according to the present disclosure comprises at least three or more nitrogen (N) atoms which are rich in electrons, which results in high electron mobility, making electron transport easy. Moreover, a compound of this disclosure comprises $sp^2$ hybrid orbitals of nitrogen (N) that are relatively rich in electrons, and the nitrogen binds to an alkali metal or alkali earth metal, i.e., a dopant for the N-type charge generation layer, thereby forming a gap state. This gap state may facilitate transfer of electrons from the N-type charge generation layer to the electron transport layer. Accordingly, the present disclosure may facilitate transfer of electrons from the N-type charge generation layer to the electron transport layer by using the compound of this disclosure as the N-type charge generation layer.

Accordingly, the organic light emitting display device of this disclosure allows for efficient transfer of electrons from the N-type charge generation layer to the light emitting layer by using a compound of this disclosure as at least one among the electron transport layers included in the light emitting parts and the N-type charge generation layer. The present disclosure may solve the problem of low lifetime due to inefficient electron injection since electron transfer from the N-type charge generation layer to the electron transport layer is facilitated. Furthermore, the present disclosure may solve the problem of the rise in operating voltage caused when electrons injected into the N-type charge generation layer move to the electron transport layer due to the difference in LUMO energy level between the electron transport layer and the N-type charge generation layer.

It will be apparent to those skilled in the art that various modification and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device comprising at least one light emitting part between an anode and a cathode and comprising at least one organic layer and a light emitting layer, wherein the at least one organic layer is formed of a compound represented by the following Formula 1:

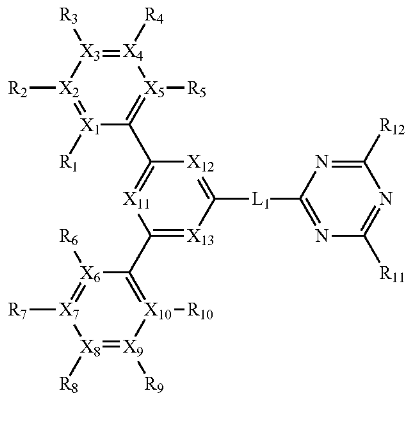

wherein:

$R_1$ to $R_{12}$ are independently one among hydrogen, a substituted or unsubstituted aryl group with 6 to 60 carbon atoms, a substituted or unsubstituted heteroaryl group with 3 to 60 carbon atoms, an alkyl group with 1 to 20 carbon atoms, an alkoxy group with 1 to 20 carbon atoms, and an amino group with 1 to 20 carbon atoms, with provision that $R_1$ to $R_{10}$ is absent when the corresponding $X_1$ to $X_{10}$ is N;

$X_1$ to $X_5$ comprise at least one N atom;

$X_6$ to $X_{10}$ comprise at least one N atom;

$X_{11}$ to $X_{13}$ comprise 1 to 3 N atoms, where at least one among $X_1$ to $X_{13}$ includes one C; and $L_1$ is one of the following L01 to L23:
L01
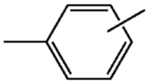
L02
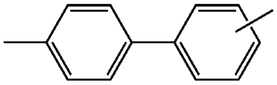
L03
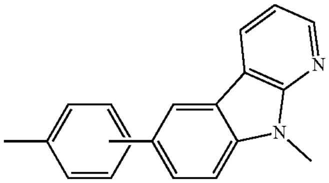
L04
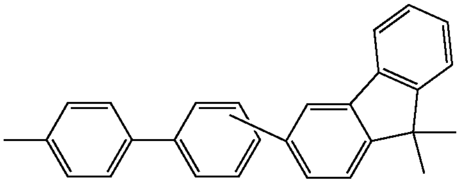
L05
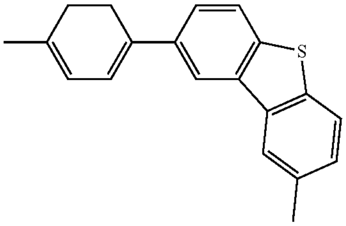
L06
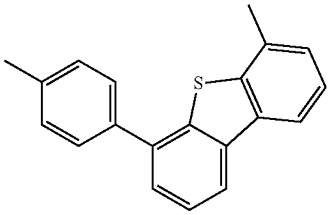
L07
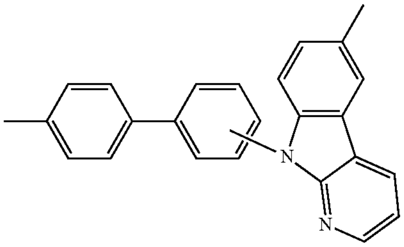
L08
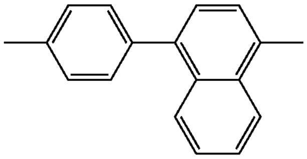
-continued
L09
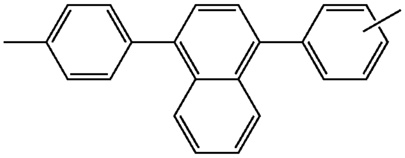
L10
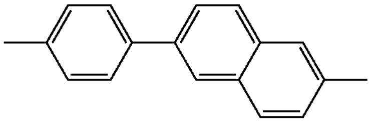
L11
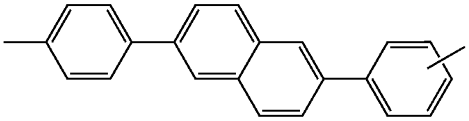
L12
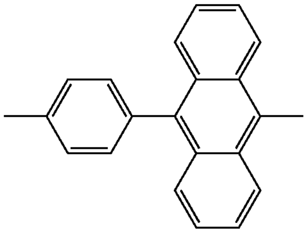
L13
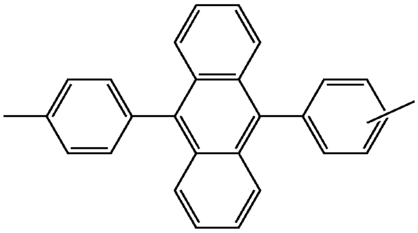
L14
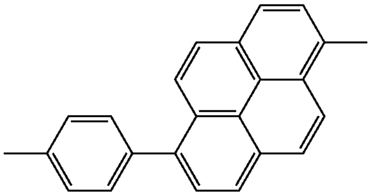
L15
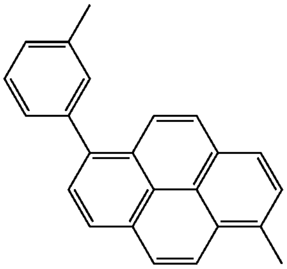
L16
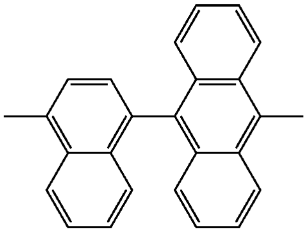

-continued

L17

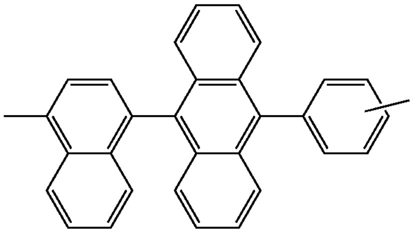

L18

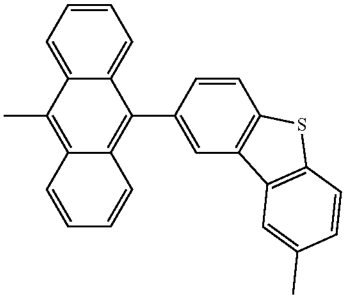

L19

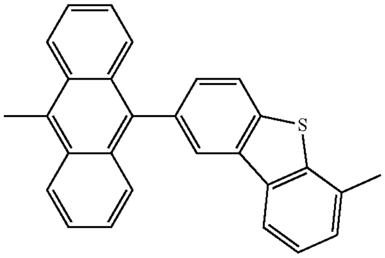

L20

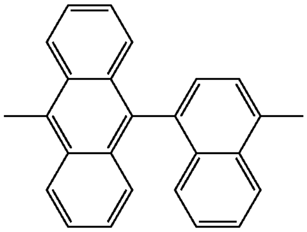

L21

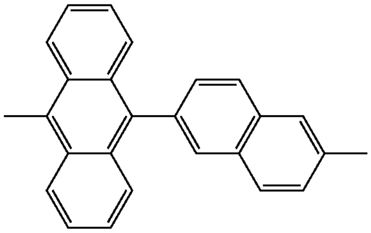

L22

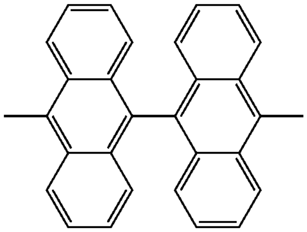

-continued

L23

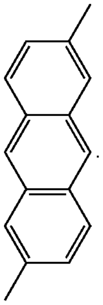

2. The organic light emitting display device of claim 1, wherein the at least one organic layer includes one among an electron transport layer and a charge generation layer.

3. The organic light emitting display device of claim 1, wherein the at least one light emitting part comprises at least two or more light emitting parts, and any one of the at least two or more light emitting parts is a blue light emitting part, and the another one of the at least two or more light emitting parts is a yellow-green light emitting part.

4. The organic light emitting display device of claim 3, wherein the at least one organic layer includes an electron transport layer that is included in the yellow-green light emitting part.

5. The organic light emitting display device of claim 1, wherein the compound includes one among the following compounds:

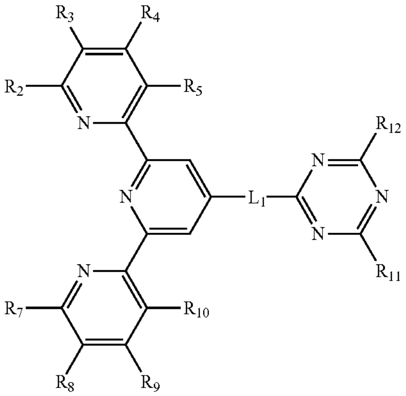

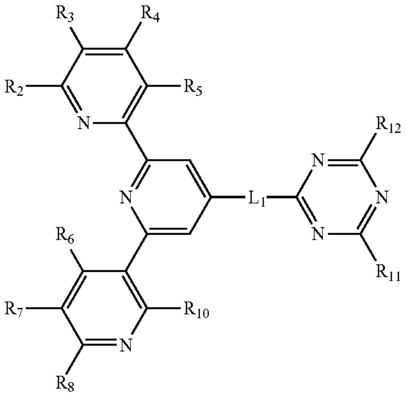

-continued
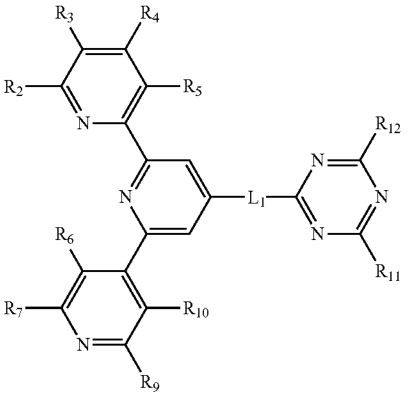
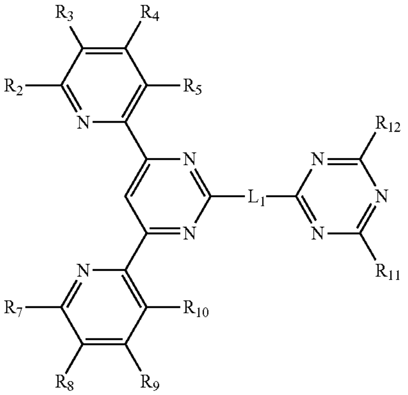
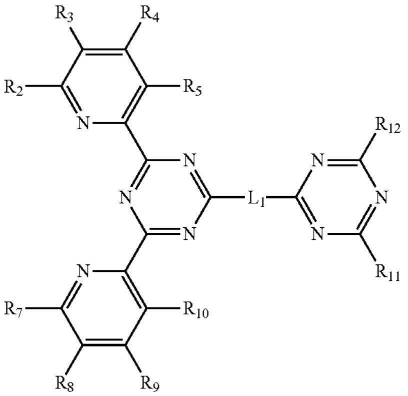
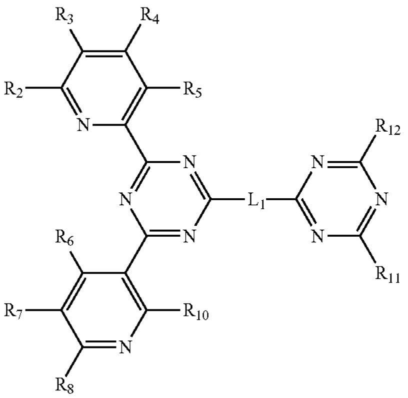
-continued
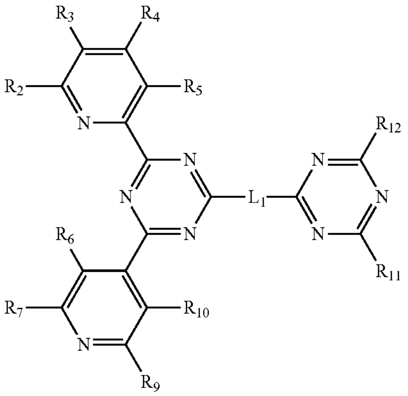
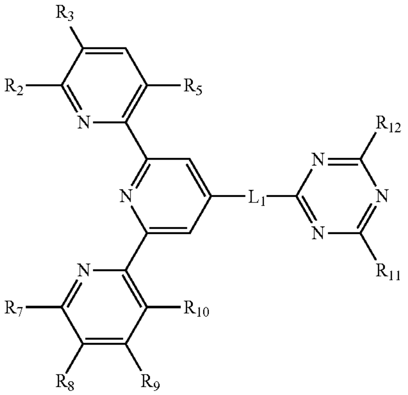
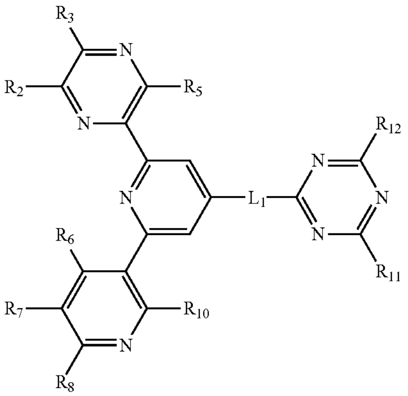
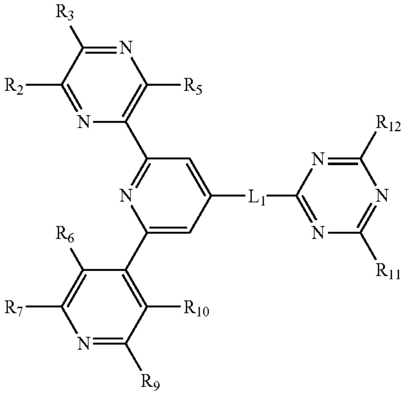

-continued
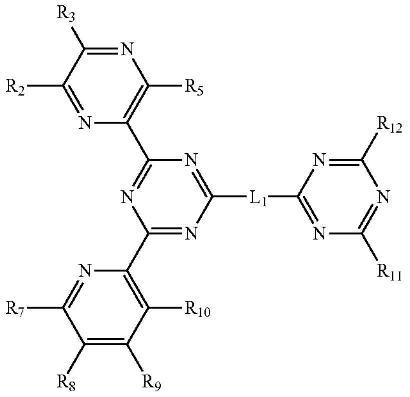
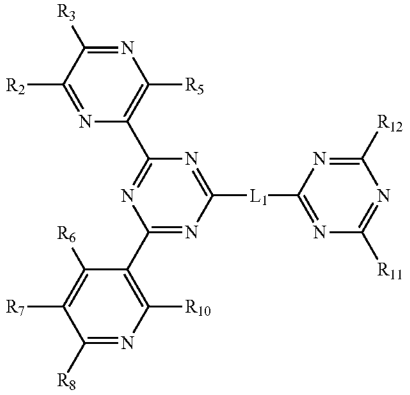
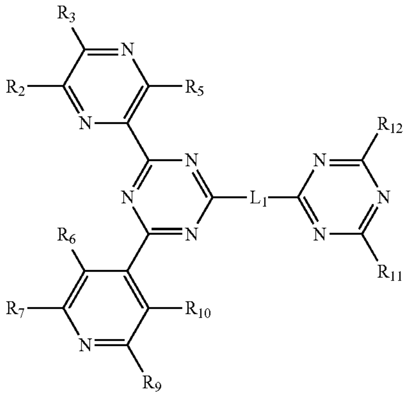
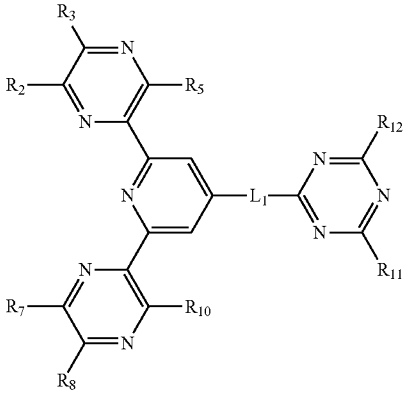
-continued
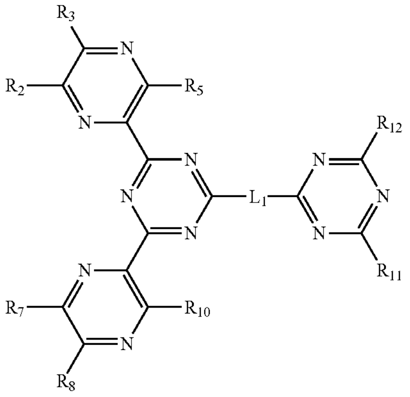
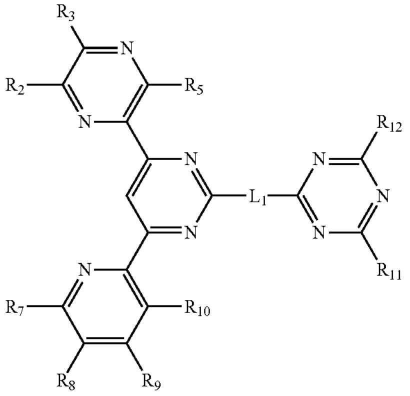
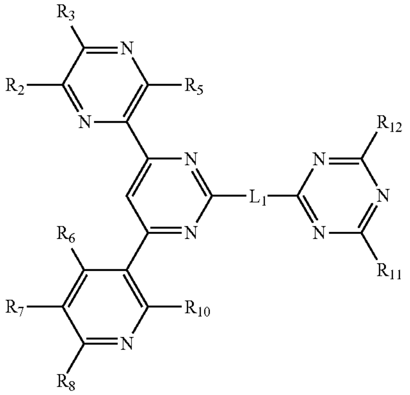
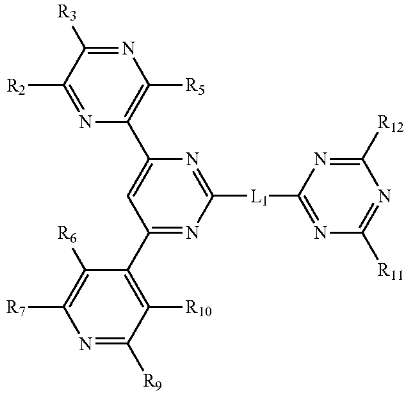
.
6. The organic light emitting display device of claim 1, wherein the compound includes one among the following compounds ET01 to ET01
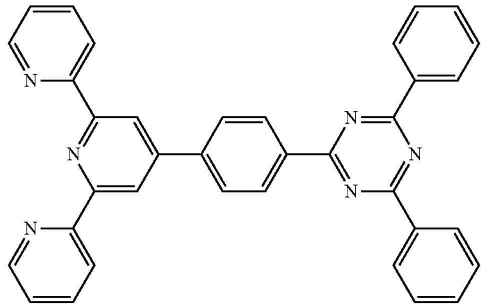
ET02
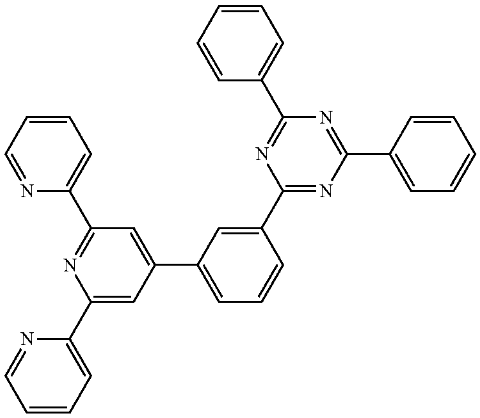
ET03
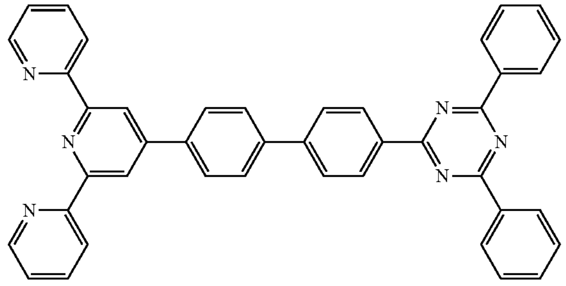
ET04
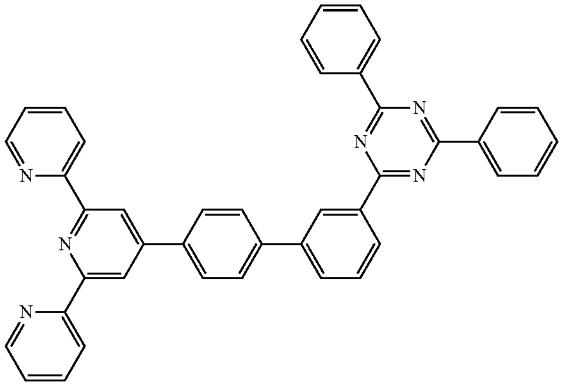
ET05
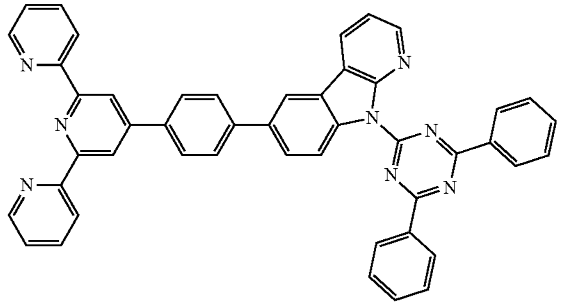
ET06
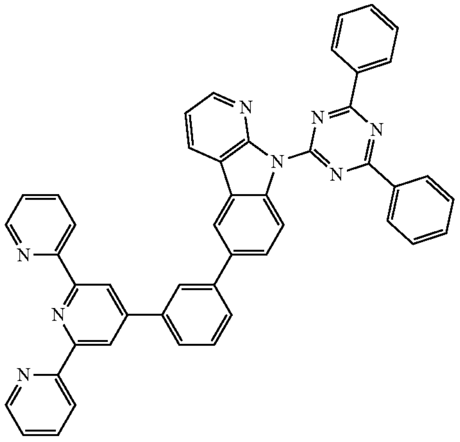

-continued
ET07
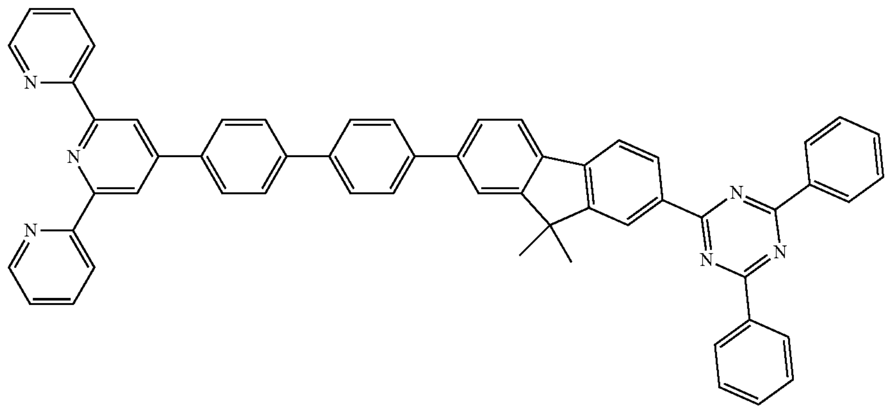
ET08
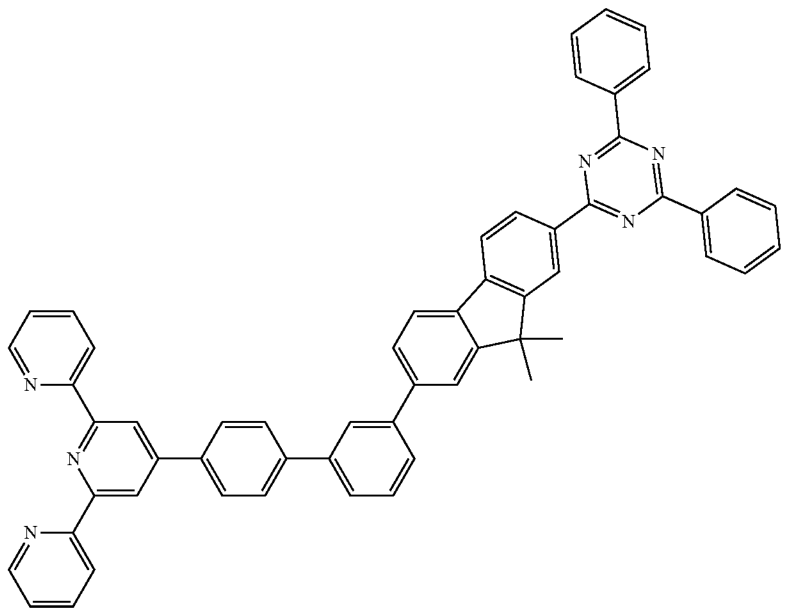
ET09
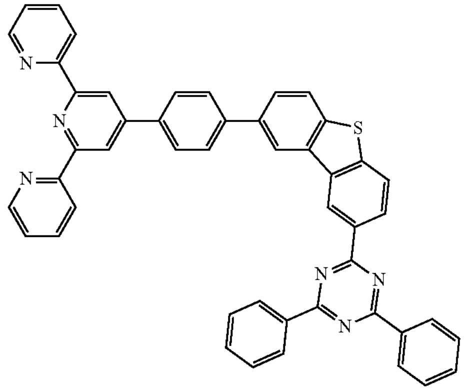
ET10
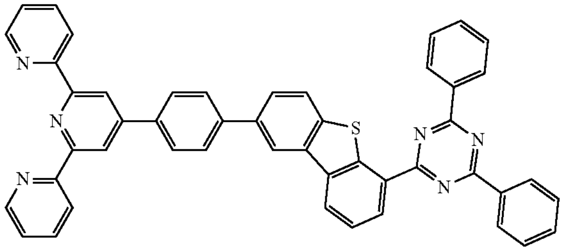

-continued
ET11
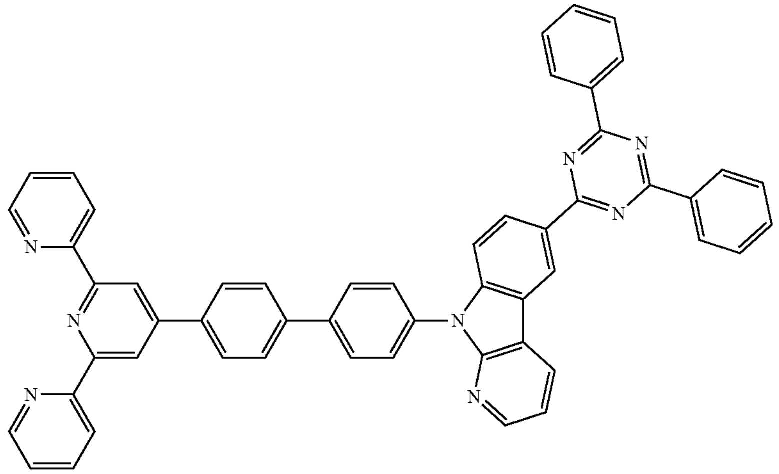
ET12
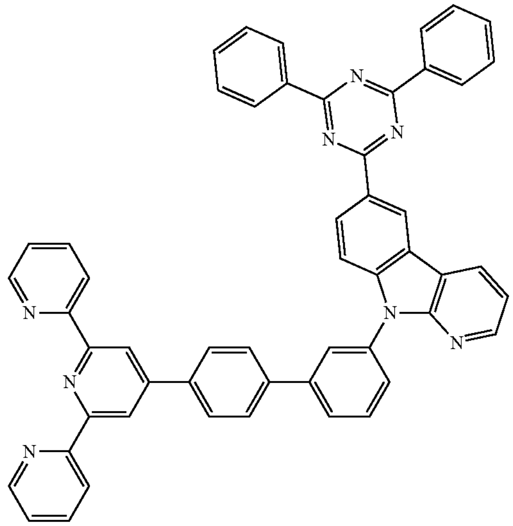
ET13
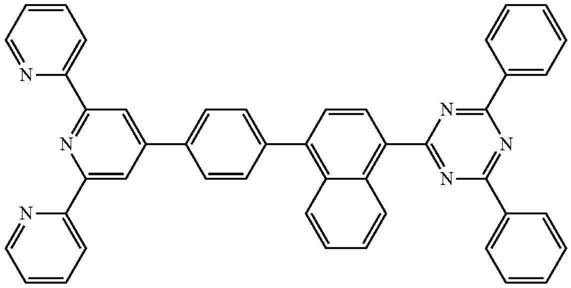
ET14
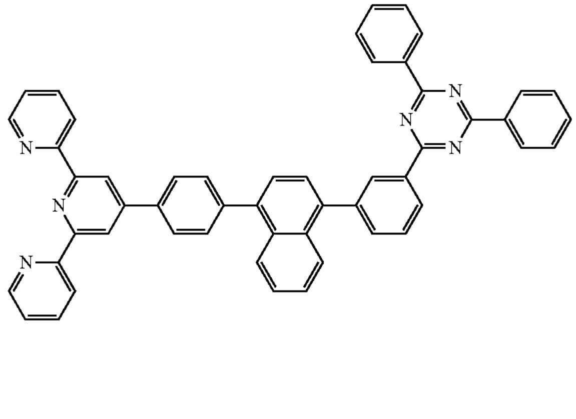
ET15
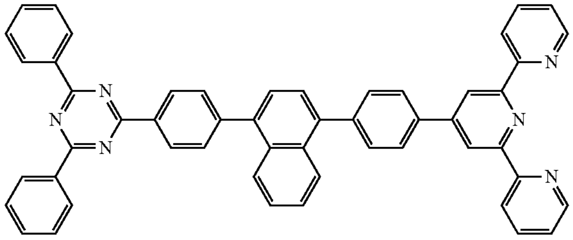

-continued
E16
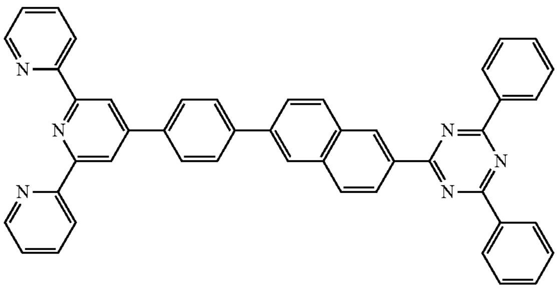
E17
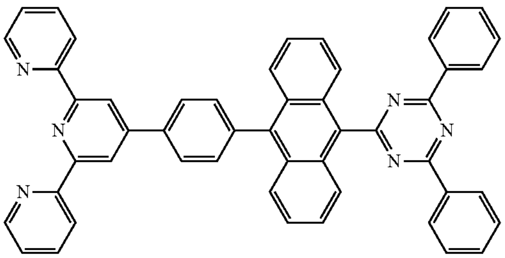
E18
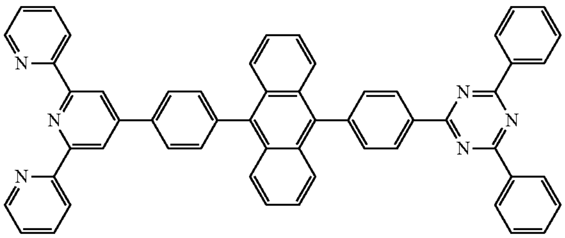
ET19
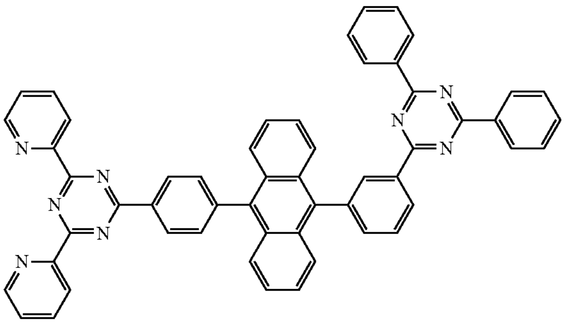
ET20
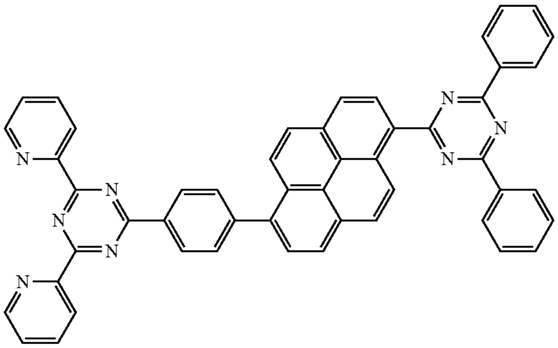
ET21
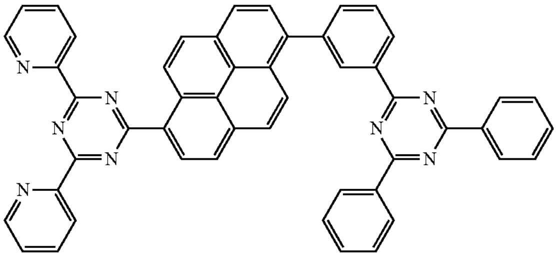
ET22
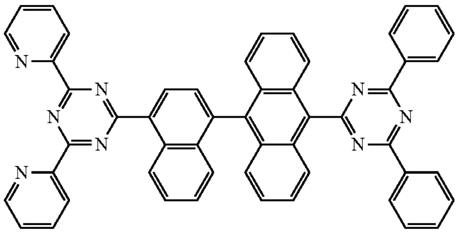
ET23
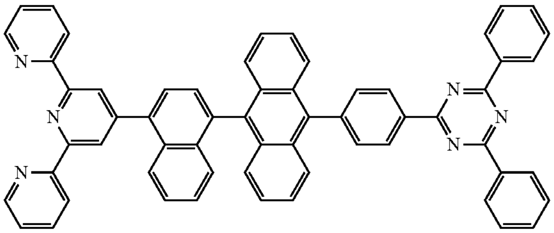
ET24
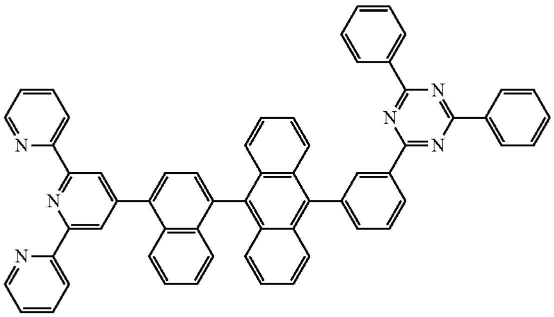
ET25
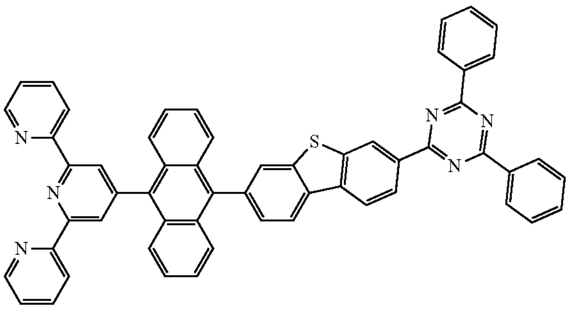

-continued
ET26
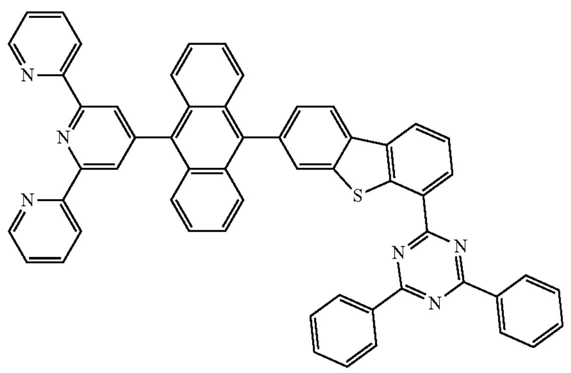
ET27
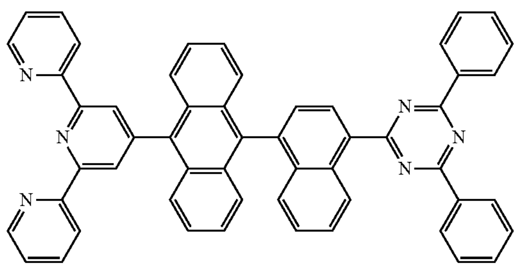
ET28
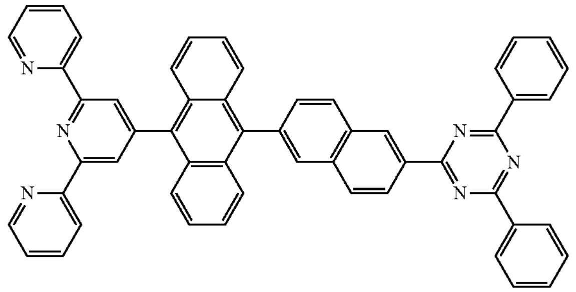
ET29
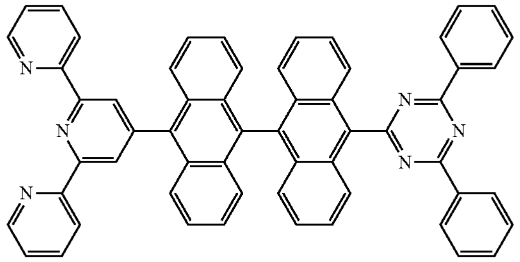
ET30
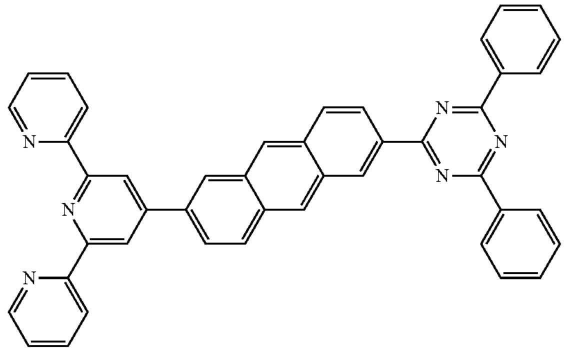
ET31
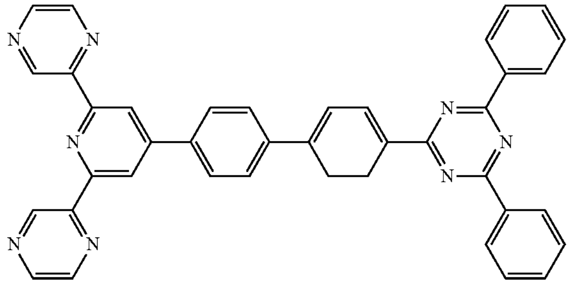
ET32
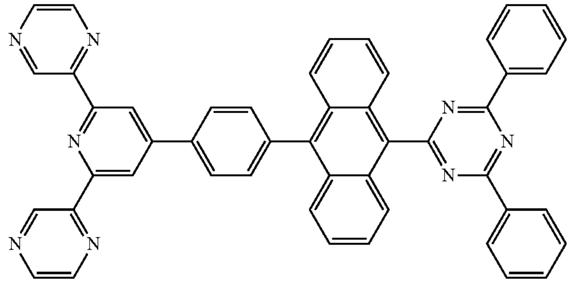
ET33
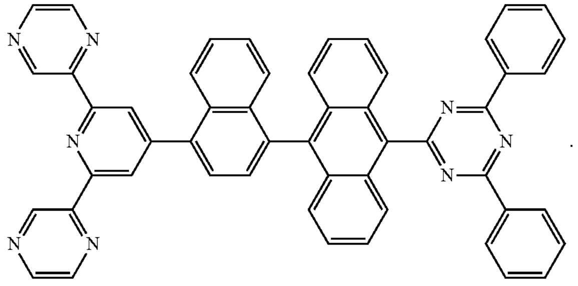

7. An organic light emitting display device which comprises:

first and second electrodes facing each other on a substrate, and at least two or more light emitting parts between the first and second electrodes and each comprising a light emitting layer, wherein:

the organic light emitting display device further comprises a charge generation layer between the at least two or more light emitting parts, the at least two or more light emitting parts each comprises an electron transport layer, and the electron transport layer includes a compound represented by the following Formula 1:

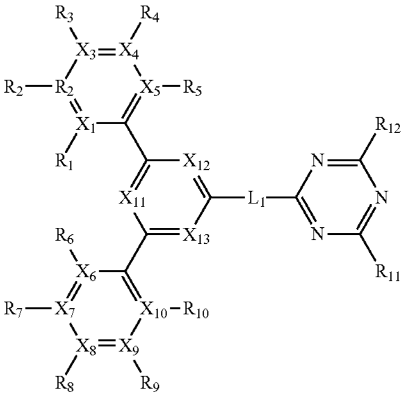

wherein:

$R_1$ to $R_{12}$ are independently one among hydrogen, a substituted or unsubstituted aryl group with 6 to 60 carbon atoms, a substituted or unsubstituted heteroaryl group with 3 to 60 carbon atoms, an alkyl group with 1 to 20 carbon atoms, an alkoxy group with 1 to 20 carbon atoms, and an amino group with 1 to 20 carbon atoms, with provision that $R_1$ to $R_{10}$ is absent when the corresponding $X_1$ to $X_{10}$ is N;

$X_1$ to $X_5$ comprise at least one N atom;

$X_6$ to $X_{10}$ comprise at least one N atom;

$X_{11}$ to $X_{13}$ comprise 1 to 3 N atoms, where at least one among $X_1$ to $X_{13}$ includes one C; and $L_1$ is one of the following L01 to L23:

L01

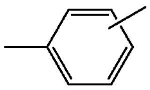

L02

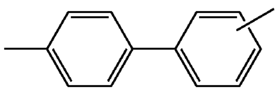

L03

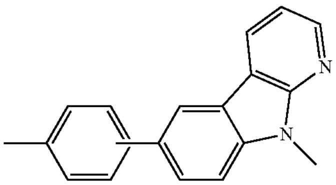

-continued

L04

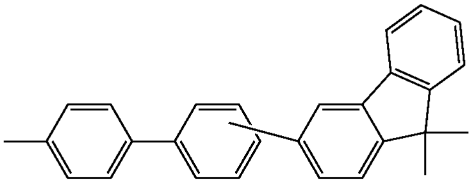

L05

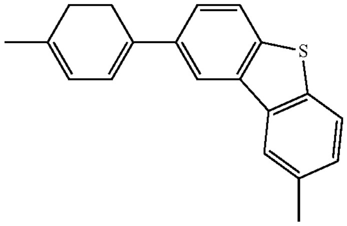

L06

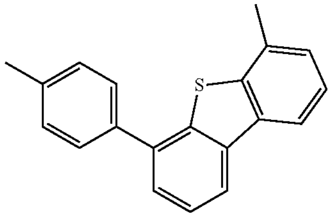

L07

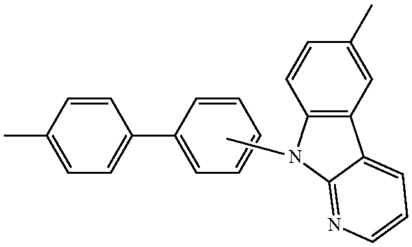

L08

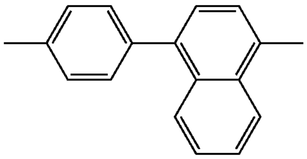

L09

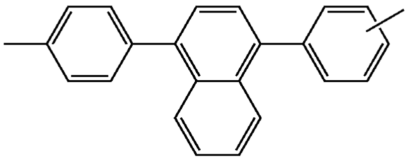

L10

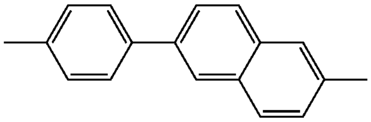

L11

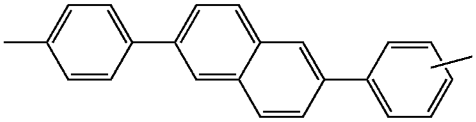

-continued
L12
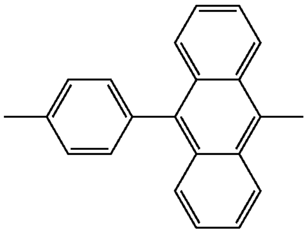
L13
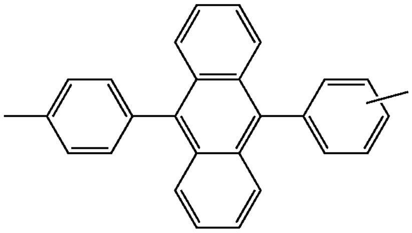
L14
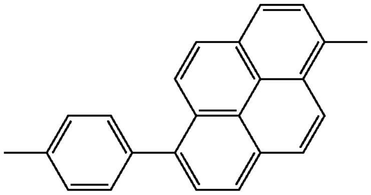
L15
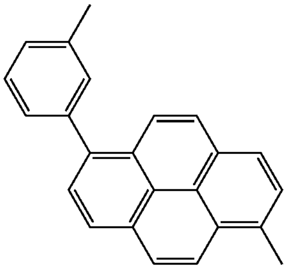
L16
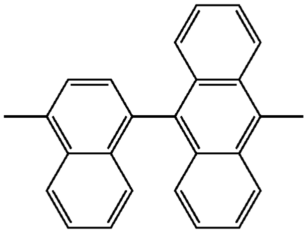
L17
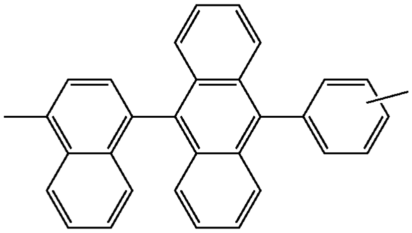
-continued
L18
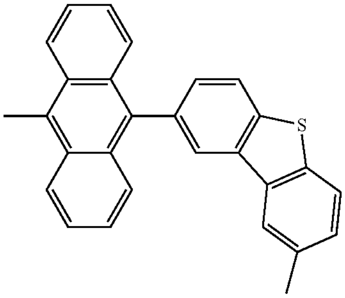
L19
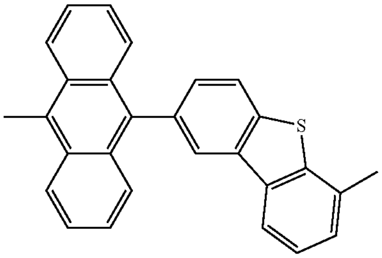
L20
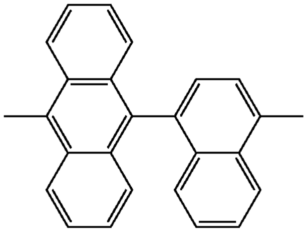
L21
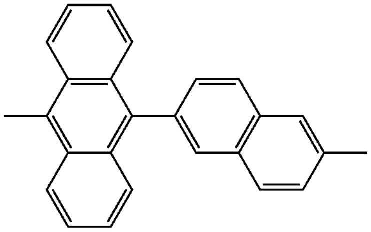
L22
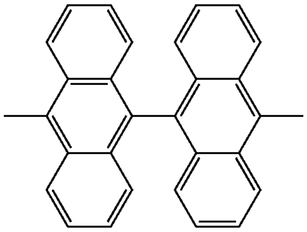
L23
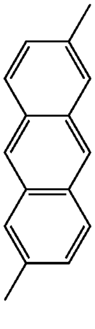
.

8. The organic light emitting display device of claim 7, wherein the charge generation layer comprises the same compound as the electron transport layer.

9. The organic light emitting display device of claim 8, wherein the charge generation layer comprises a N-type charge generation layer.

10. The organic light emitting display device of claim 7, wherein the compound includes one among the following compounds:

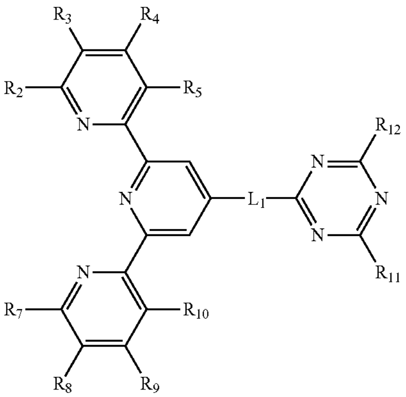

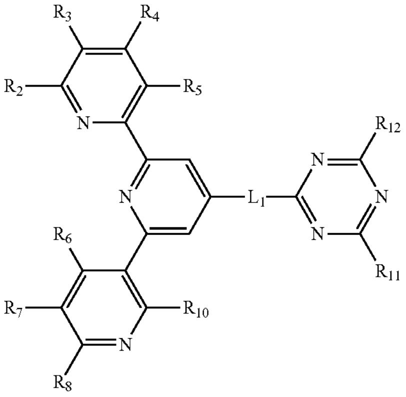

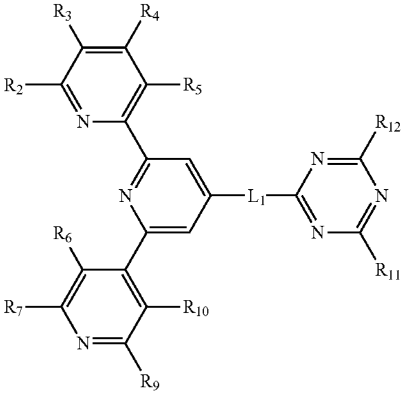

-continued

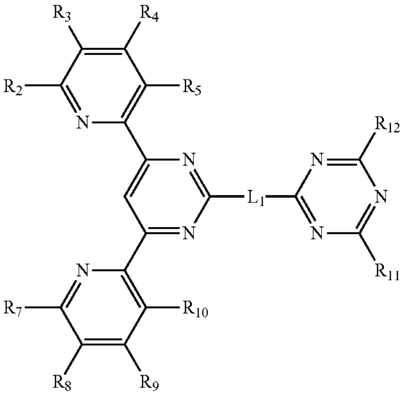

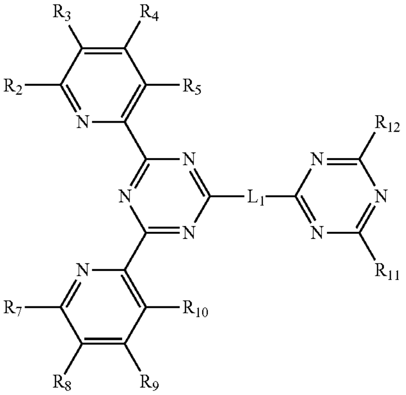

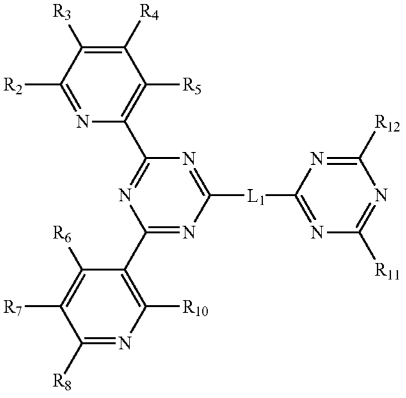

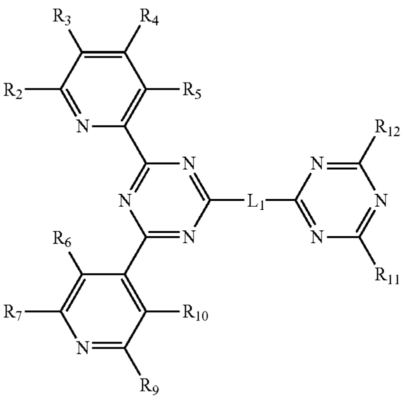

-continued
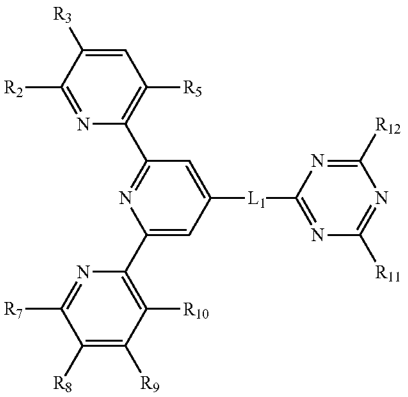
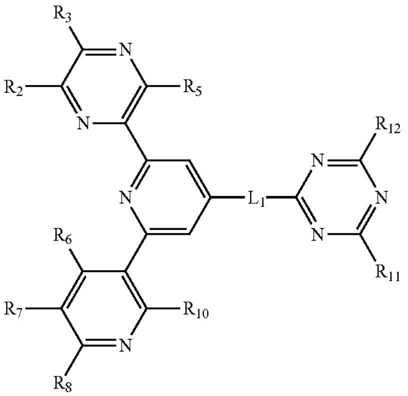
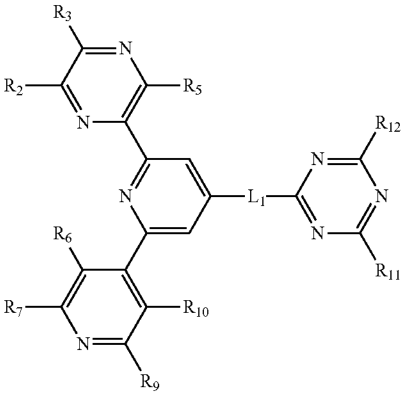
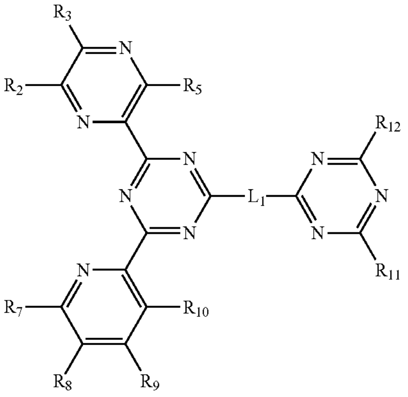
-continued
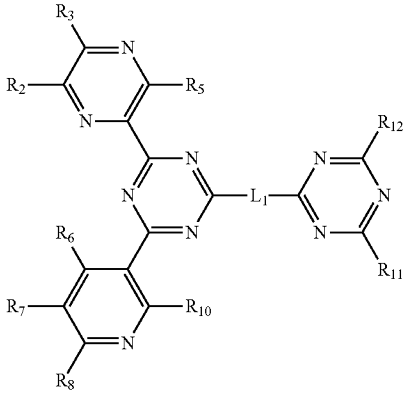
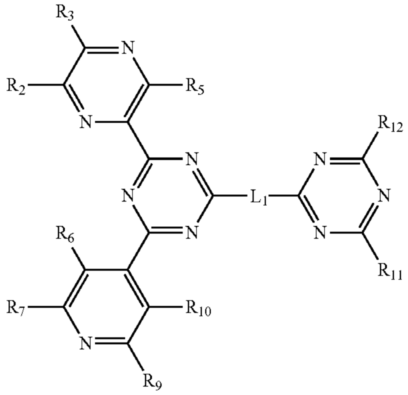
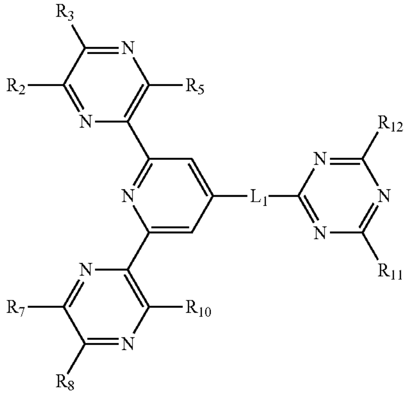
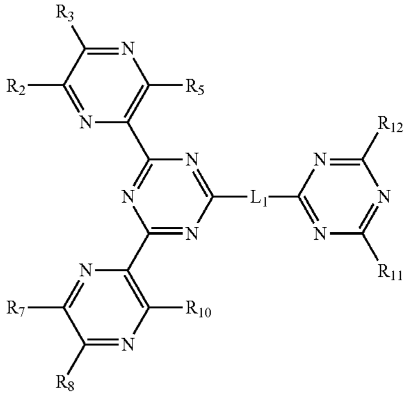

-continued
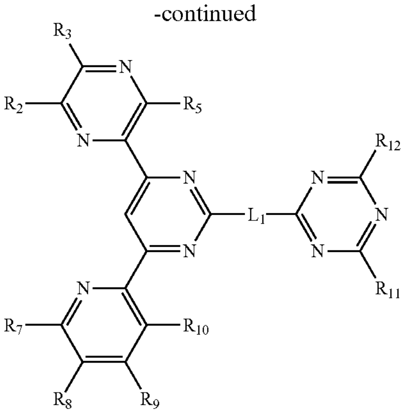
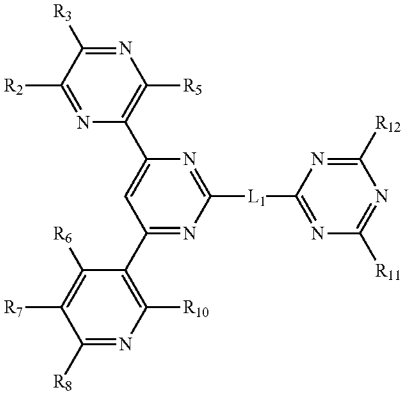
-continued
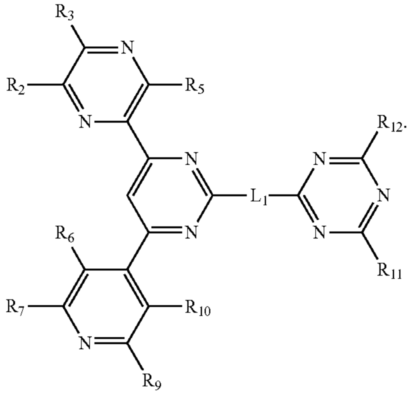
11. The organic light emitting display device of claim 7, wherein the compound includes one among the following compounds ET01 to ET33:
ET01
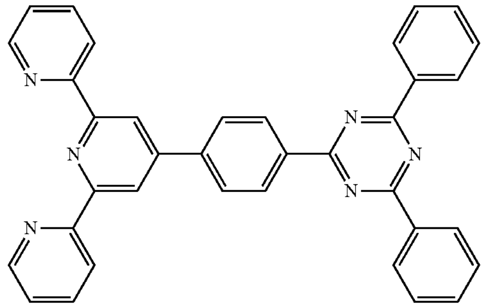
ET02
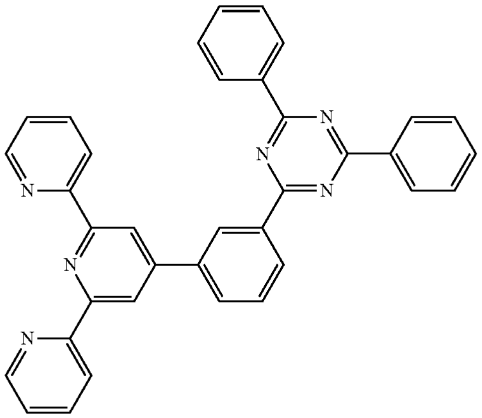
ET03
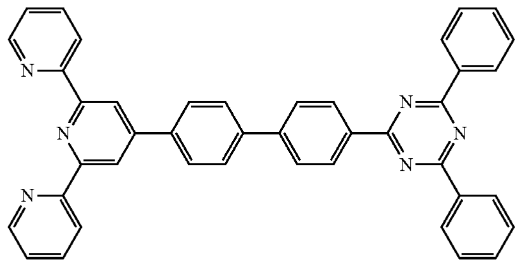
ET04
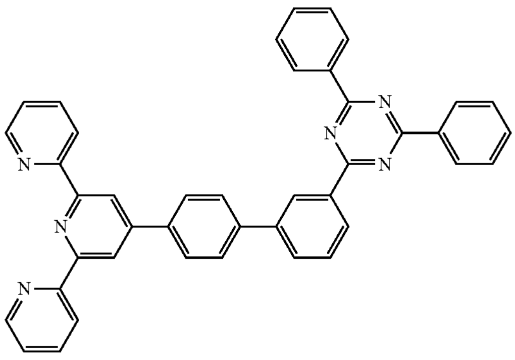

-continued
ET05
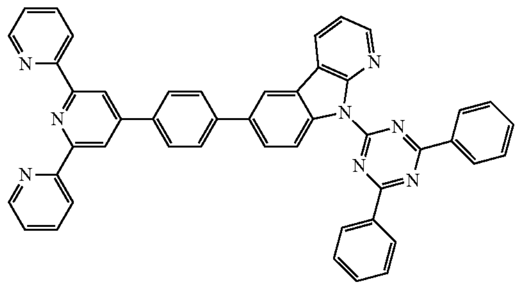
ET06
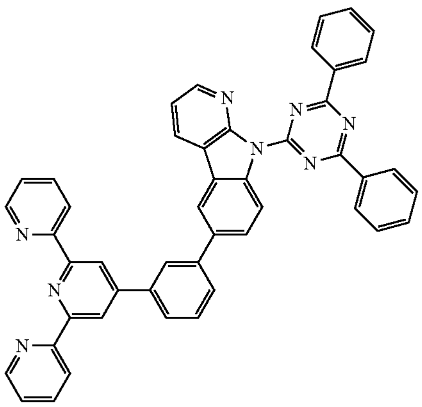
ET07
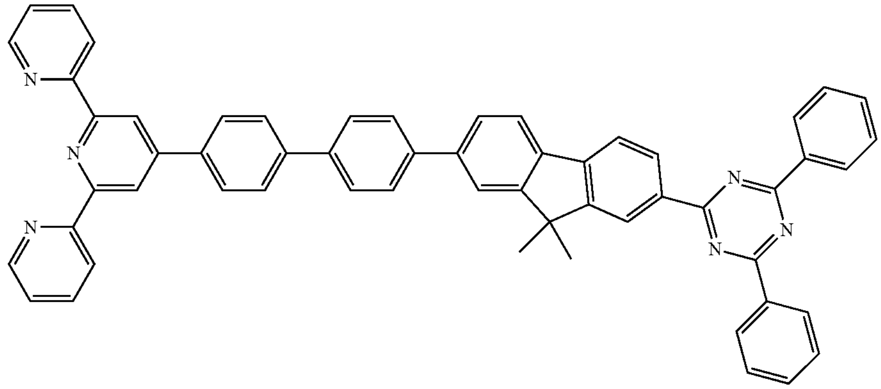
ET08
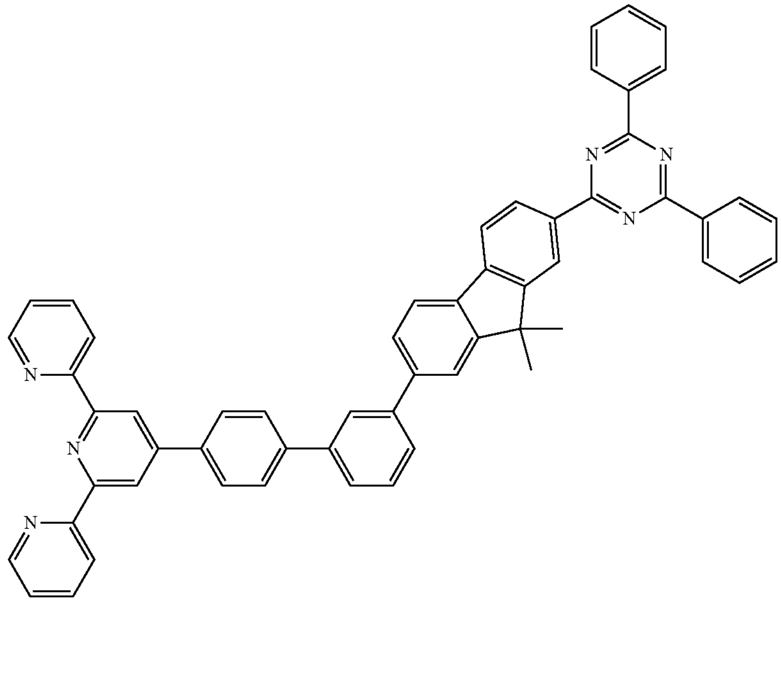

-continued
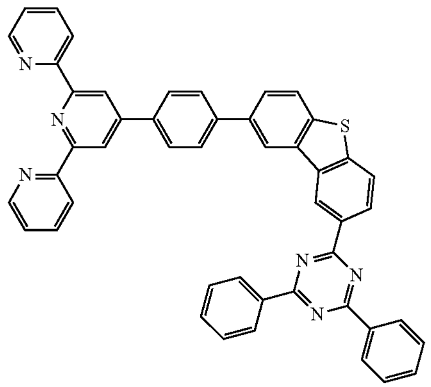
ET09
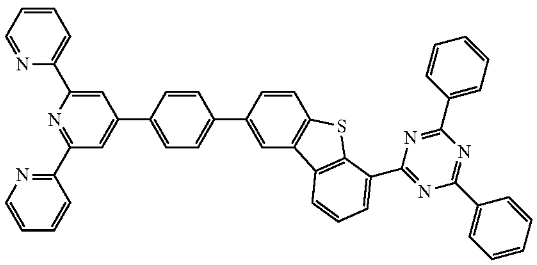
ET10
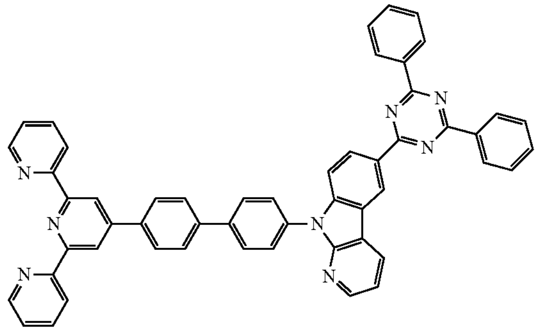
ET11
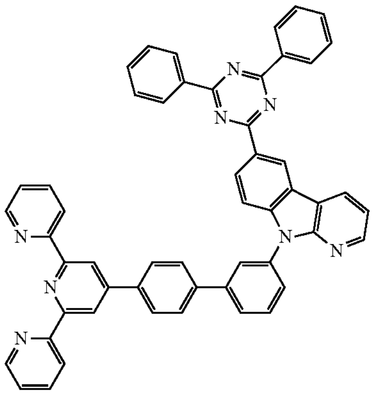
ET12
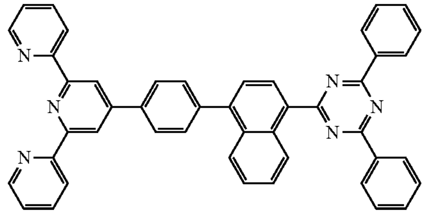
ET13
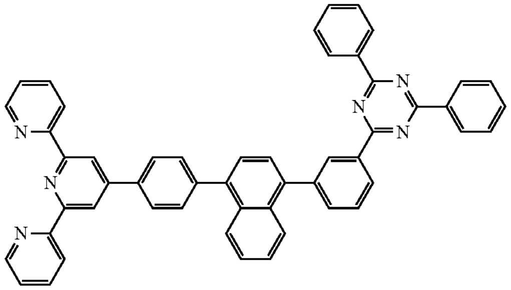
ET14
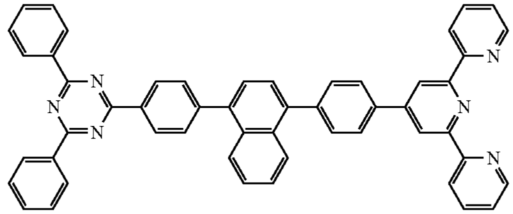
ET15
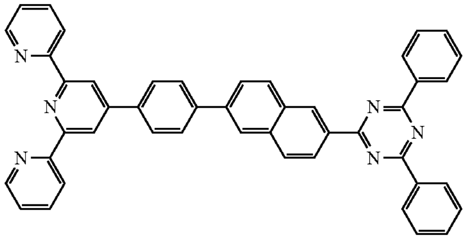
ET16
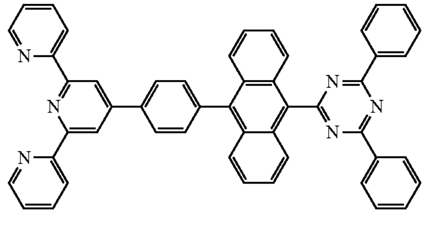
ET17
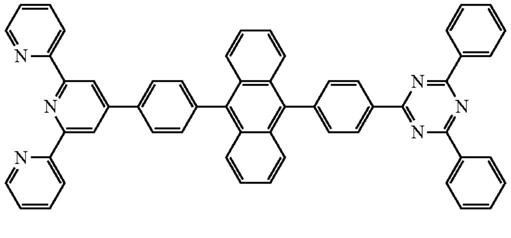
ET18

-continued
ET19
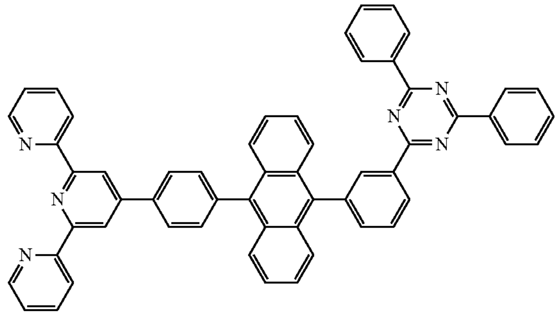
ET20
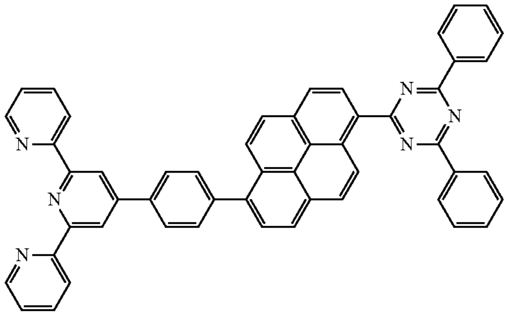
ET21
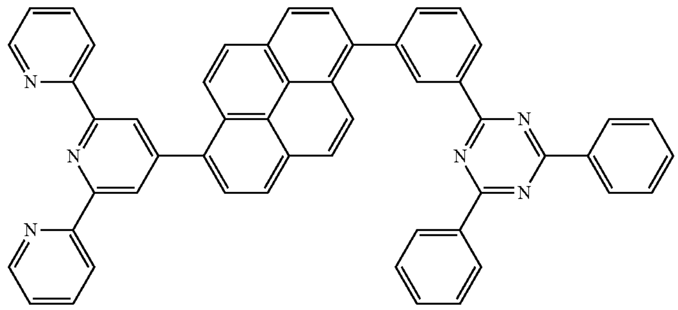
ET22
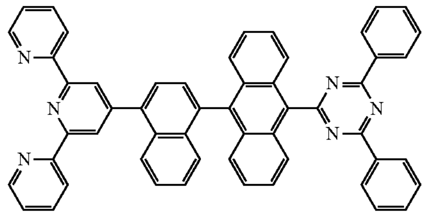
ET23
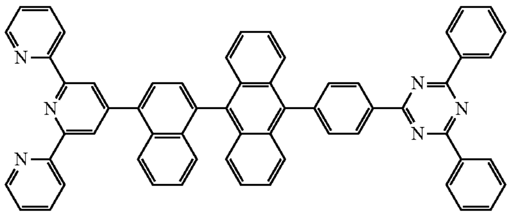
ET24
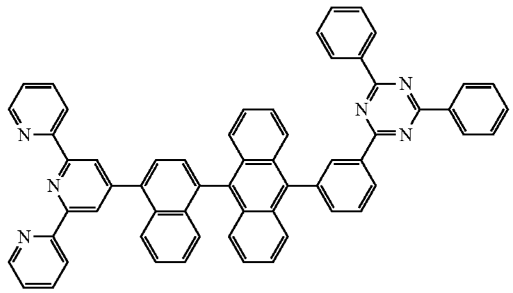
ET25
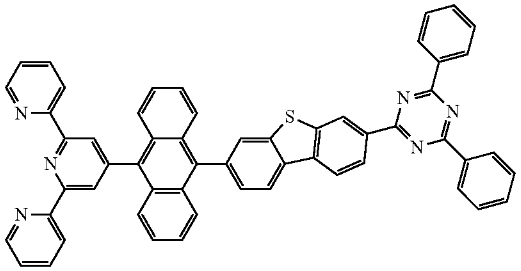
ET26
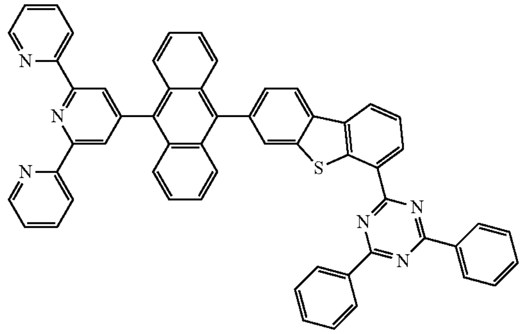
ET27
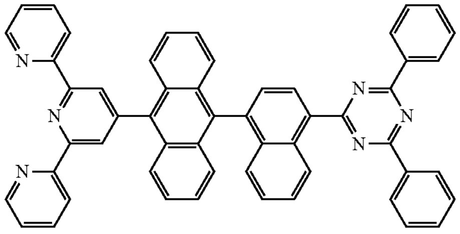

-continued
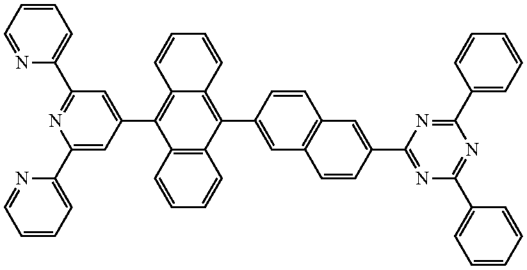
ET28
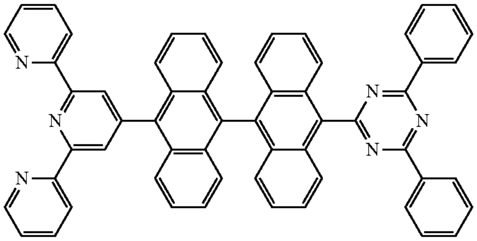
ET29
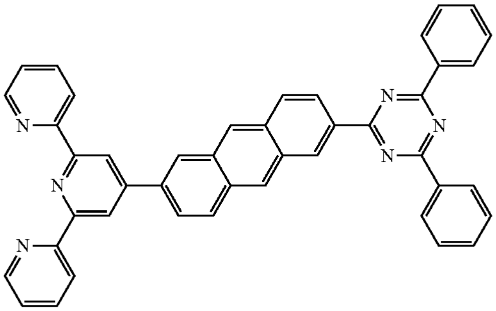
ET30
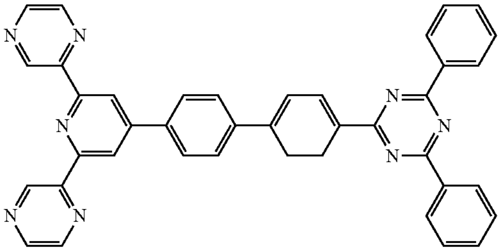
ET31
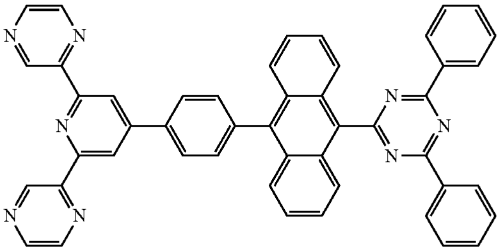
ET32
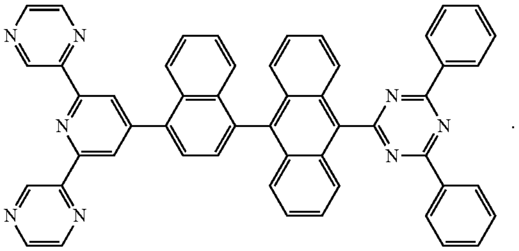
ET33
12. The organic light emitting display device of claim 2, wherein the charge generation layer comprises a N-type charge generation layer.
* * * * *